United States Patent [19]
Whetsel

[11] Patent Number: 5,497,379
[45] Date of Patent: Mar. 5, 1996

[54] METHOD AND APPARATUS FOR SELECTABLE PARALLEL EXECUTION OF TEST OPERATIONS

[75] Inventor: Lee D. Whetsel, Plano, Tex.

[73] Assignee: Texas Instruments Incorporated, Dallas, Tex.

[21] Appl. No.: 378,343

[22] Filed: Jan. 26, 1995

Related U.S. Application Data

[62] Division of Ser. No. 368,248, Jan. 3, 1995, which is a continuation of Ser. No. 101,142, Aug. 2, 1993, abandoned.

[51] Int. Cl.$^6$ .................................................. G01R 31/28
[52] U.S. Cl. ...................... 371/22.3; 324/158.1; 371/22.1
[58] Field of Search ............................... 371/22.3, 22.5, 371/22.6, 22.1; 324/158 R, 158

[56] References Cited

U.S. PATENT DOCUMENTS 5,388,104  2/1995  Shirotori et al. ..................... 371/22.3
5,396,170  3/1995  D'Souza et al. ..................... 371/22.3

Primary Examiner—Vincent P. Canney
Attorney, Agent, or Firm—Scott B. Stahl; Richard L. Donaldson; James C. Kesterson

[57] ABSTRACT

The invention permits selectively enabling a plurality of circuits to synchronously enter and execute test operations based on a given test bus. A test bus controller (15) is enabled to simultaneously initiate test operations on two or more selected circuits (17) coupled to the test bus (11) via a connection device (19) and a connection protocol.

23 Claims, 22 Drawing Sheets

FIG. 34

HIERARCHICAL ANALOGIES

RootDir\1stDir1-n\2ndDir1-n\File
RootEnv\1stEvn1-n\2ndEvn1-n\App
Sub\Bpn1-n\Brd1-n\ICs

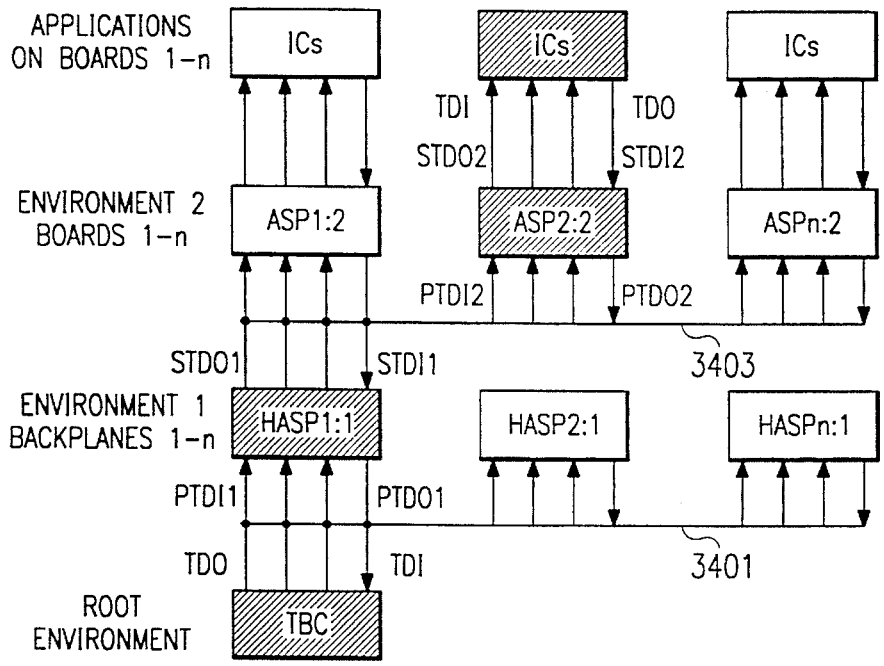

| | |
|---|---|
| TDO to PTDI1 | TIS(A1)SS(A2)SIT ⟶ T |
| STDO1 to PTDI2 | T ⟶ TIS(A2)SIT ⟶ T |
| PTDO2 to STDI1 | T ⟶ TIS(A2)SIT ⟶ T |
| PTDO1 to TDI | T ⟶ TIS(A2)SS(A1)SIT |

FIG. 36

HIERARCHICAL SELECT PROTOCOL TO ENVIRONMENT "m"

| | |
|---|---|
| RE to E1 | TISn:1SSn:2SSn:3S...Sn:m-2SSn:m-1SSn:mSIT....T |
| E1 to E2 | T.....TISn:2SSn:3S...Sn:m-2SSn:m-1SSn:mSIT...T |
| E2 to E3 | T..........TISn:3S...Sn:m-2SSn:m-1SSn:mSIT..T |
| Em-3 to Em-2 | T.....................TISn:m-2SSn:m-1SSn:mSIT.T |
| Em-2 to Em-1 | T.............................TISn:m-1SSn:mSITT |
| Em-1 to Em | T....................................TISn:mSIT |

HIERARCHICAL ACKNOWLEDGE PROTOCOL FROM ENVIRONMENT "m"

| | |
|---|---|
| Em to Em-1 | TISn:mSIT.........................................T |
| Em-1 to Em-2 | TTISn:mSSn:m-1SIT................................T |
| Em-2 to Em-3 | T.TISn:mSSn:m-1SSn:m-2SIT........................T |
| E3 to E2 | T..TISn:mSSn:m-1SSn:m-2SSn:m-3..Sn:3SIT...........T |
| E2 to E1 | T...TISn:mSSn:m-1SSn:m-2SSn:m-3..Sn:3SSn:2SIT.....T |
| E1 to RE | T....TISn:mSSn:m-1SSn:m-2SSn:m-3..Sn:3SSn:2SSn:1SIT |

FIG. 37

HIERARCHICAL SELECT PROTOCOL USED FOR GLOBAL RESETTING

```
RE to E1      TISr:1SSr:2SSr:3S...Sr:m-2SSr:m-1SSr:mSIT.....T
E1 to E2      T.....TISr:2SSr:3S...Sr:m-2SSr:m-1SSr:mSIT....T
E2 to E3      T.........TISr:3S...Sr:m-2SSr:m-1SSr:mSIT...T
Em-3 to Em-2  T....................TISr:m-2SSr:m-1SSr:mSIT..T
Em-2 to Em-1  T...........................TISr:m-1SSr:mSIT.T
Em-1 to Em    T..................................TISr:mSITT
```

HIERARCHICAL SELECT PROTOCOL FOR LOCAL RESETTING OF ENVIRONMENT "m"

```
RE to E1      TISn:1SSn:2SSn:3S....Sn:m-2SSn:m-1SSr:mSIT.....T
E1 to E2      T.....TISn:2SSn:3S....Sn:m-2SSn:m-1SSr:mSIT....T
E2 to E3      T.........TISn:3S....Sn:m-2SSn:m-1SSr:mSIT...T
Em-3 to Em-2  T....................TISn:m-2SSn:m-1SSr:mSIT..T
Em-2 to Em-1  T...........................TISn:m-1SSr:mSIT.T
Em-1 to Em    T..................................TISr:mSITT
```

FIG. 38

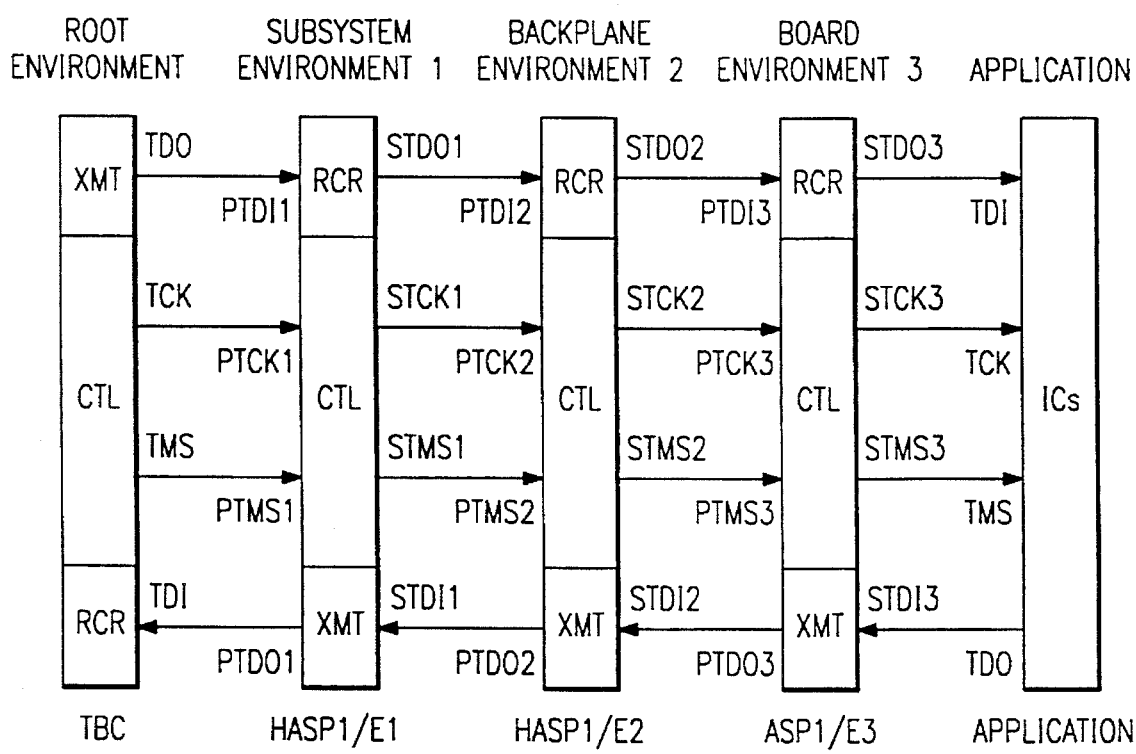

METHOD AND APPARATUS FOR SELECTABLE PARALLEL EXECUTION OF TEST OPERATIONS

This is a division, of application Ser. No. 08/368,248 filed on Jan. 3, 1995, which is a continuation of application Ser. No. 08/101,142, filed Aug. 2, 1993 and now abandoned.

CROSS REFERENCE TO RELATED DOCUMENTS

The following documents include subject matter which is related to the subject matter of this application, These documents have been assigned to the assignee of this application, and are incorporated herein by reference:

| Docket No. | PTO Reference | Effective Filing Date |
| --- | --- | --- |
| TI-18067 | U.S. Ser. No. 900 805 | 06/17/92 |
| TI-18068 | U.S. Ser. No. 900 806 | 06/17/92 |
| TI-18069 | U.S. Ser. No. 900 708 | 06/17/92 |

FIELD OF THE INVENTION

The invention relates generally to the execution of test operations on electrical circuits and, more particularly, to concurrent execution of test operations on a plurality of circuits.

BACKGROUND OF THE INVENTION

The IEEE 1149.1 standard defines an IC level boundary test architecture and serial interface that simplifies testing of ICs and boards. An IC incorporating the 1149.1 boundary scan test architecture is shown in FIG. 1. The test architecture consists of a test access port (TAP), serial output circuit, instruction register, and three data registers, comprising; a scan bypass register, a boundary scan register, and an identification register.

The TAP responds to test clock (TCK) and test mode select (TMS) inputs to shift data through either the instruction register or a selected data register from the test data input (TDI) to the test data output (TDO). The output circuit allows multiplexing the serial output of the instruction or a selected data register to TDO. The instruction register provides storage for test commands input into the architecture. The boundary scan register is associated with the IC's inputs and outputs and provides the test circuitry required for testing the wiring interconnects between ICs on a board as well as for testing the application logic of the host IC. The bypass register provides an abbreviated single bit scan path through the IC when boundary testing is not being performed. The identification register provides information about the IC.

The TAP is a finite state machine comprising 16 states. The TAP has inputs for externally receiving a clock input via the TCK pin, a control input via the TMS pin, and a reset input via the optional test logic reset (TRST) pin. The TAP has outputs for internally supplying control to reset the test architecture, execute test instructions, and scan data through the test architecture from TDI to TDO. The TAP responds to serial protocol input via the TMS pin to transition through its predefined states during scan and test operations.

In the state diagram of FIG. 2, it is seen that the TAP consists of 6 steady states: test logic reset (TLRST), run test/idle (RT/IDLE), shift data register (SHIFT-DR), pause data register (PAUSE-DR), shift instruction register (SHIFT-IR), and pause instruction register (PAUSE-IR). The names of these steady states indicate their function, i.e. TLRST resets the test logic, RT/IDLE runs self tests or idles the test logic, SHIFT-DR/IR shifts data from TDI to TDO, and PAUSE-DR/IR pauses the shifting of data from TDI to TDO.

Transitions between steady states as well as required test actions are achieved via 10 temporary states: select data register scan (SELDRS), capture data register (CAPTURE-DR), exit1 data register (EXIT1-DR), exit2 data register (EXIT2-DR), update data register (UPDATE-DR), select instruction register scan (SELIRS), capture instruction register (CAPTURE-IR), exit1 instruction register (EXIT1-IR), exit2 instruction register (EXIT2-IR), and update instruction register (UPDATE-IR).

During instruction and data register scan operations, the TDO output is enabled to output data while the TAP is in the SHIFT-DR or SHIFT-IR states. Also, during the SHIFT-DR and SHIFT-IR states, data is clocked into the test architecture from TDI on the rising edge of TCK and output from the test architecture on TDO on the falling edge of TCK.

The TAP polices the activity of the test architecture using seven well defined operation modes; (1) a reset mode, (2) an idle mode, (3) a data scan mode, (4) a pause data scan mode, (5) an instruction scan mode, (6) a pause instruction scan mode, and (7) a run test mode. The benefit of having well defined operation modes is that it insures test and scan access compatibility among ICs from different vendors.

The reset mode is achieved by forcing the TAP into the TLRST state either by control input from TMS or by activation of the TRST input. In the reset mode, the TAP outputs a reset signal to the test architecture forcing it to remain in an inactive state. The TAP should be in the TLRST state whenever the IC is in its mission mode to prevent the test logic from disturbing system operation.

The idle mode is achieved by loading the instruction register with a benign instruction, then transitioning the TAP into the RT/IDLE state. In the idle mode, the test architecture is not reset, as in the reset mode, but rather it is in a condition where test and scan operations are temporarily suspended.

The data scan mode is achieved by sequencing the TAP through a series of states entered via the SELDRS state of FIG. 2. During the data scan mode, a selected data register receives control from the TAP to perform a predefined set of test steps, comprising; (1) a capture step (CAPTURE-DR), (2) shift step (SHIFT-DR), and (3) an update step (UPDATE-DR). The capture step causes the selected data register to parallel load with data. The shift step causes the selected data register to shift data from TDI to TDO. The update step causes the selected data register to parallel output the data it received during the shift step. Data register selection is determined by the instruction in the instruction register.

The pause data scan mode is used to suspend the transfer of data through the selected data register from TDI to TDO during the data scan mode's shifting step. The pausing of data scans is accomplished by causing the TAP to enter into the PAUSE-DR state of FIG. 2.

The instruction scan mode is achieved by sequencing the TAP through a series of states entered via the SELIRS state of FIG. 2. During the instruction scan mode, the instruction register receives control from the TAP to perform a predefined set of test steps, comprising; (1) a capture step (CAPTURE-IR), (2) shift step (SHIFT-IR), and (3) an update step (UPDATE-IR). The capture step causes the instruction register to parallel load with status information. The shift step causes the instruction register to shift data from TDI to TD0. The update step causes the instruction register to parallel output the instruction data it received during the shift step.

The pause instruction scan mode is used to suspend the transfer of data through the instruction register from TDI to TDO during the instruction scan mode's shifting step. The pausing of instruction scans is accomplished by causing the TAP to enter into the PAUSE-IR state of FIG. 2.

The run test mode is achieved by loading a self-test instruction into the instruction register, then transitioning the TAP into the RT/IDLE state. When the TAP enters the RT/IDLE state the self-test starts and continues while the TAP is in the RT/IDLE state. The self-test is stopped either automatically by the design of the self-testing circuitry or by transitioning the TAP out of the RT/IDLE state. The minimum number of TCK cycles the TAP is required to remain in the RT/IDLE state is determined by the self-test operation being performed.

To provide for scan access flexibility, the TAP allows ICs on a board or boards in a backplane to be connected in either a 1149.1 ring or star bus configuration.

In a backplane 1149.1 ring configuration of FIG. 3, all boards directly receive the TCK and TMS control outputs from the TBC and are daisy chained between the TBC's TDO output and TDI input. During scan operation, the TBC outputs control on TMS and TCK to scan data through all boards in the backplane, via its TDO and TDI bus connections. In the ring configuration all boards are enabled simultaneously to be serially accessed and tested by the TBC.

A problem associated with the ring configuration, is that the scan operation only works if all the boards are included in the backplane and are operable to scan data from their TDI input to TDO output. If one of the boards is removed or has a fault, the TBC will be unable to scan data through the backplane. Since the ring configuration does not allow access to remaining boards when one is removed or disabled, it does not fully meet the needs of a backplane serial bus.

In a backplane 1149.1 star configuration of FIG. 4, all boards directly receive the TCK and TDI signals from the TBC and output a TDO signal to the TBC. Also each board receives a unique TMS signal from the TBC. In the star configuration only one board is enabled at a time to be serially accessed and tested by the TBC. When a board is enabled, the TMS signal associated with that board will be active while all other TMS signals are inactive.

A problem with the star configuration is that each board requires its own TMS signal. In a backplane with 50 boards, the TBC would have to have 50 individually controllable TMS signals, and the backplane would have to have traces for each of the 50 TMS signals. Due to these requirements, star configurations are typically not considered for backplane applications.

The present invention allows a TBC to selectively enable a plurality of applications associated with a given test bus, and cause the applications to simultaneously execute test operations in a unified fashion.

BRIEF DESCRIPTION OF THE DRAWINGS

FIG. 34 illustrates the use of hierarchical addressable shadow ports in a two level test configuration;

FIG. 36 illustrates select and acknowledge protocols used for communication between a test bus controller and a hierarchical addressable shadow port in an m level test configuration;

FIG. 37 illustrates select protocols used for global and local disconnection and resetting of hierarchical addressable shadow ports in an m level test configuration;

FIG. 38 illustrates two hierarchical addressable shadow ports connected between a test bus controller and an application;

DETAILED DESCRIPTION

Figure 1:
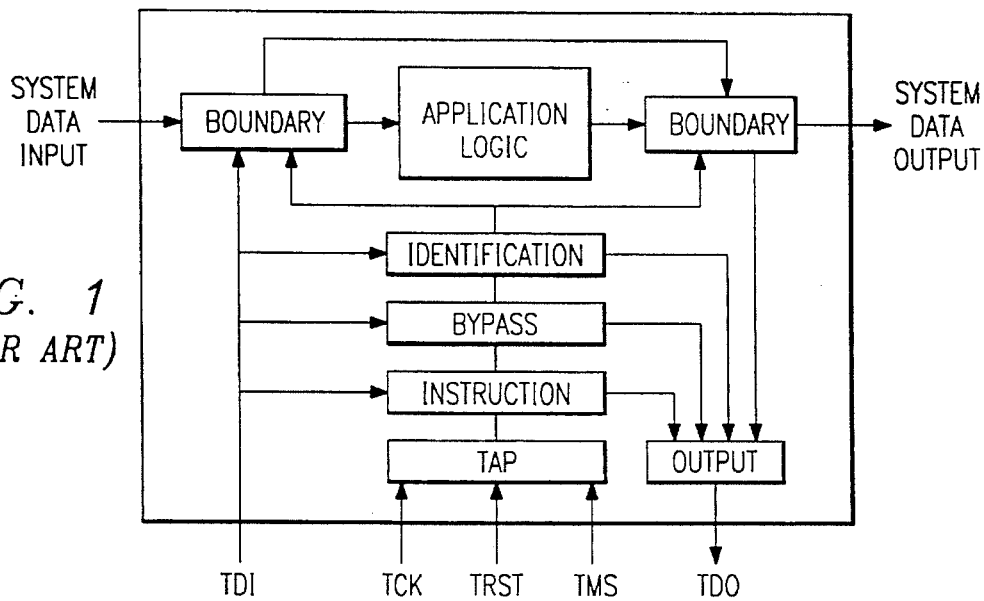
FIG. 1 is a block diagram of the prior art IEEE 1149.1 test architecture.
Figure 2:
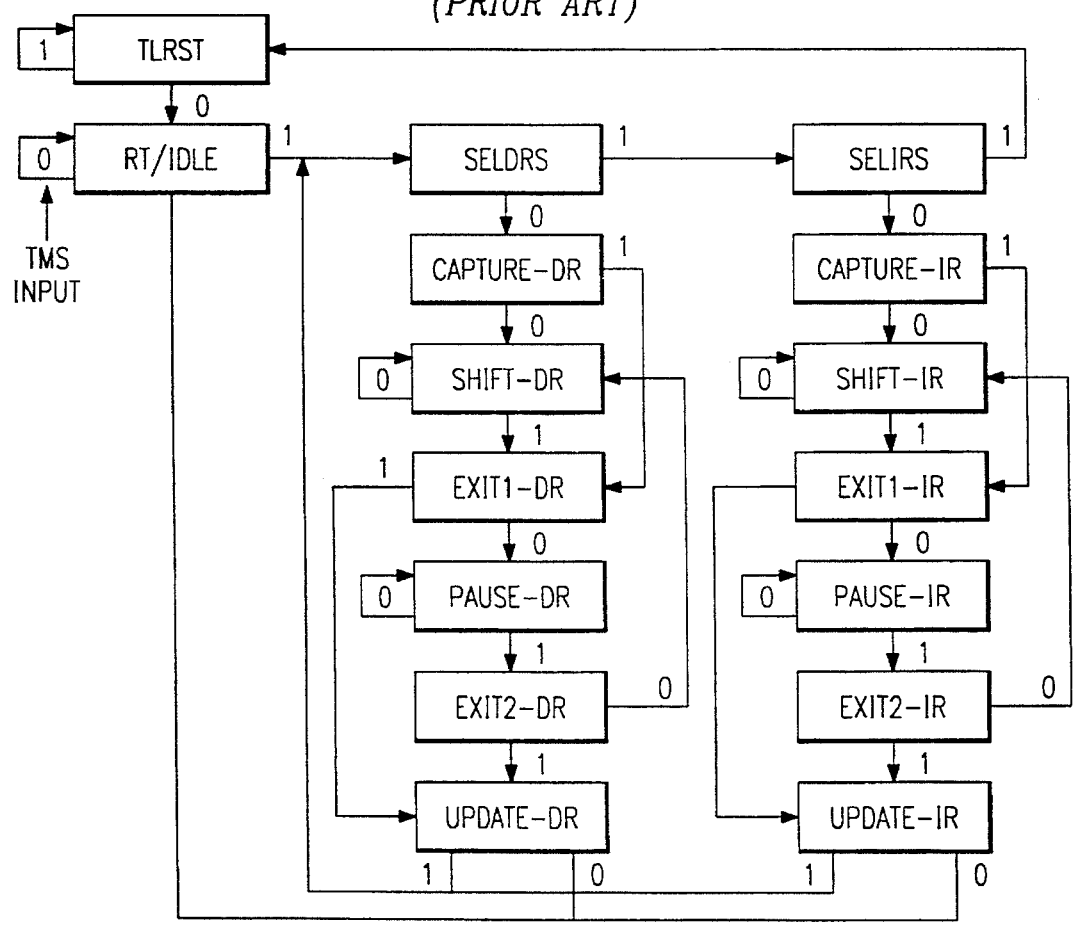
FIG. 2 is a state diagram of the test access port of the IEEE 1149.1 test architecture.
Figure 3:
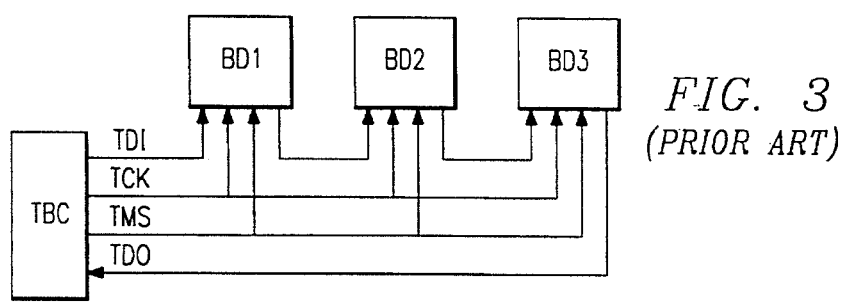
FIG. 3 illustrates a prior art backplane 1149.1 ring configuration.
Figure 4:
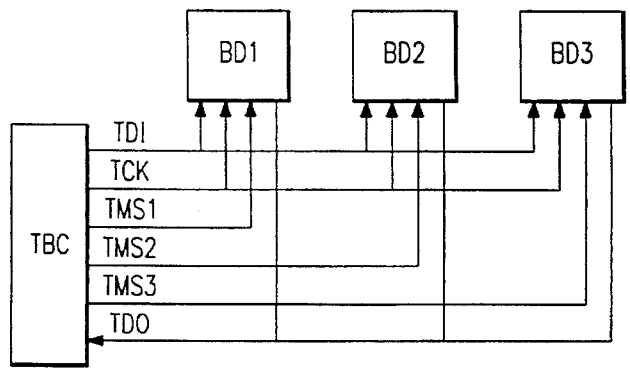
FIG. 4 illustrates a prior art backplane 1149.1 star configuration.
Figure 5:
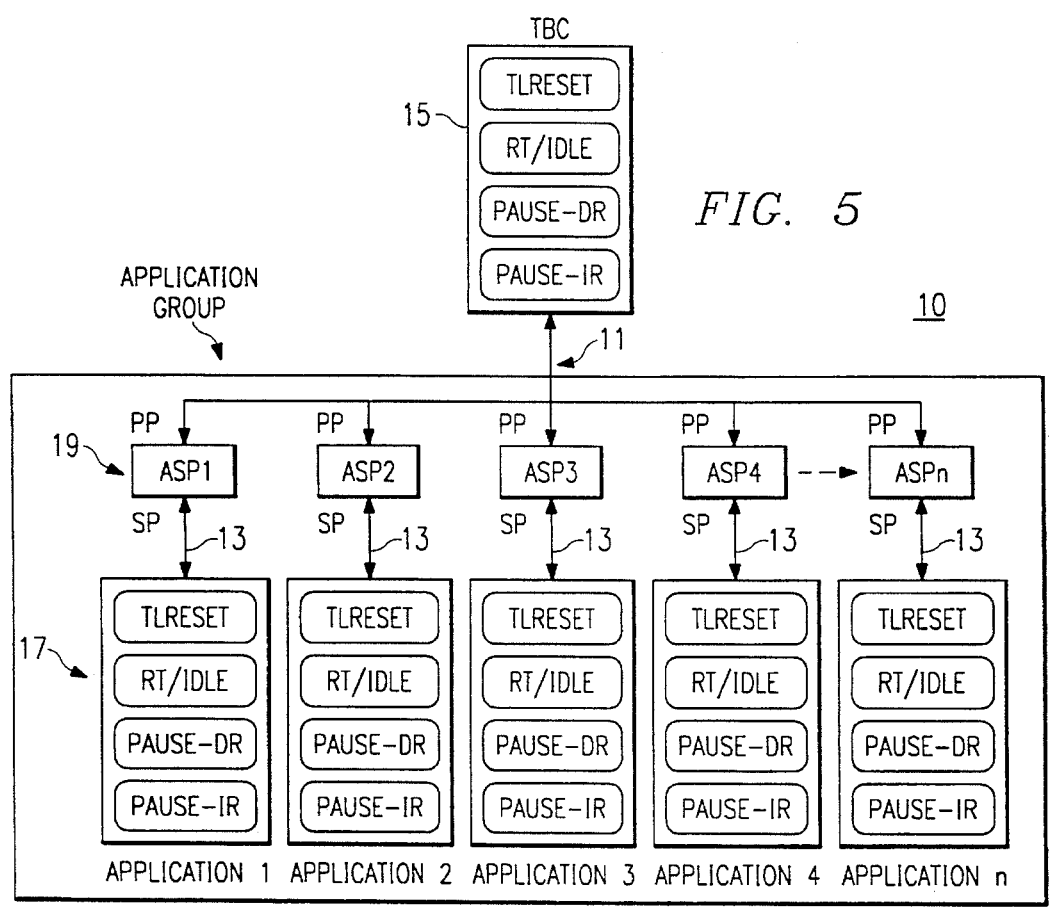
FIG. 5 illustrates a system test configuration in which the present invention is implemented.

FIG. 5 shows a system test configuration 10 comprising a TBC 15, a plurality of addressable shadow ports ASPs 1-n at 19, and applications 1-n at 17. The TBC is the controller and it outputs control to the primary ports (PP) of each addressable shadow port (ASP) in the system via the primary test bus connection at 11. Each ASP is further coupled to an appropriately numbered 1149.1 application via its secondary port (SP) and secondary test bus connection 13. For clarity, the TBC is shown to include only four of the steady states of the 1149.1 state diagram which it controls, and the applications coupled to the ASPs are shown to include only the same four steady states of the 1149.1 state diagram.

The aforementioned ASPs are described hereinafter with reference to FIGS. 25–31. The PPs of the ASPs include primary 1149.1 test bus signals, PTMS, PTCK, PTDI, and PTDO, and these signals are implied in the single bussing path connecting the TBC and ASPs The SPs of the ASPs include secondary 1149.1 test bus signals, STMS, STCK, STDI, and STDO, and these signals are implied in the single bussing path shown connecting each ASP to its application.

When the TBC needs to serially access an application, it outputs a shadow protocol containing the address of the ASP associated with the application. The shadow protocol can be transmitted from the TBC to the ASPs while the TBC is in any of the steady states shown. However, for test bus synchronization purposes, the application needs to be in the same steady state as the TBC when the connection is made. In response to the shadow protocol, the ASP makes a connection between the TBC and application. After the connection is made, the TBC serially accesses the application. Another application can be accessed by repeating the above steps. This method of accessing applications is described in detail in the above-incorporated applications.

The ASP (described hereinafter and in the above-incorporated applications) is capable of allowing the TBC to select, scan, and enable self-testing of any one of the applications in FIG. 5. For example, if a self-test of application 1 is required, the TBC executes a shadow protocol to connect the primary and secondary ports of ASP1. When the ASP connection is made the TBC and application 1 are electrically connected on the serial bus. The TBC can therefore directly control application 1 using the 1149.1 serial bus and 1149.1 test procedures.

If the connection was made while the TBC and application 1 were both in the TLRST state, the TBC transfers itself and the application from TLRST into the RT/IDLE state to prepare for serial access and testing of application 1. From the RT/IDLE state the TBC may, for example, execute an instruction register scan operation (described previously) to load a self-test instruction into the application, and then re-enter the RT/IDLE state.

After the application has been loaded with a self-test instruction and has been placed in the RT/IDLE state, the self-test starts. The self-test executes until it terminates either on its own or by the TBC transitioning the serial bus from the RT/IDLE state to another steady state, such as the PAGSE-IR steady state. The results of the self-test can be obtained and checked by the TBC accessing application 1 via a data register scan operation.

The basic setup and execution of an 1149.1 self-test, excluding of course the use of the ASP connecting device, is well known by those skilled in the art of serial scan testing using the 1149.1 standard. This type of self-test can be performed using either of the Ring and Star configurations described previously. The ASP provides an addressable method of making a connection between the TBC and a selected application so that the 1149.1 self-test can be performed on the selected application.

The ASP allows a TBC to, for example, select and setup multiple applications for self-test operations, and then cause all selected applications to start and execute their self-test operations concurrently. This reduces system test time by providing a means of allowing multiple system applications to execute tests in parallel. This feature also enables separate applications to participate in common test procedures, such as at-speed testing of the interconnect between applications using psuedorandom pattern generation and signature analysis test methods.

The ASP can be controlled via the shadow protocol to make or break a bus connection between the TBC and an application in any of the four steady states of the 1149.1 state diagram shown in FIG. 5. The ASP can also break a connection between the TBC and an application and leave the application in the 1149.1 steady state it was in prior to the connection break, i.e. state retention capability.

Exemplary features of the invention are illustrated in FIGS. 6 through 23. FIGS. 6 through 23 are similar to FIG. 5 except that the two sets of ASPs and applications (n-1 and n) shown in the round-cornered boxes are imaginary. The purpose of these imaginary elements will become clear below. FIGS. 6 through 23 show how the ASPs are used to load test instructions, for example self-test instructions, into selected ones of applications 1 through n-2, and then cause each selected application to concurrently enter into the RT/IDLE state to start all self-test instructions.

Figure 6:
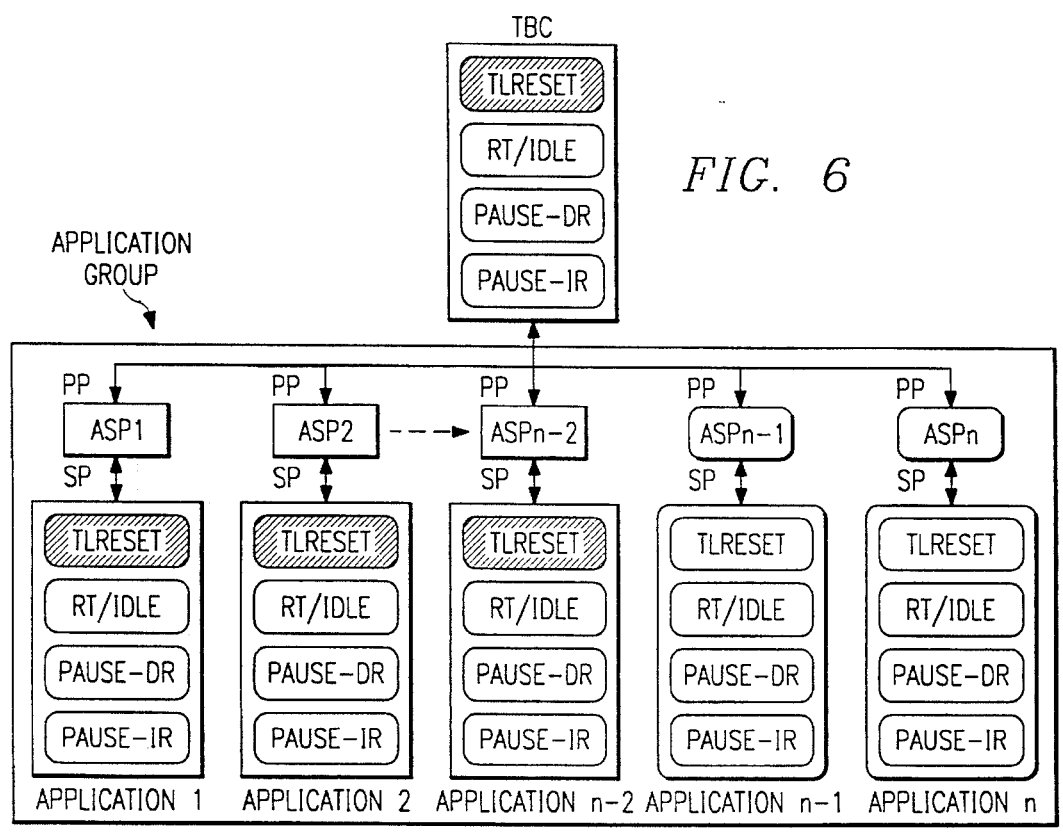
FIGS. 6–23 illustrate the operation of the present invention relative to the system test configuration of FIG. 5.

FIG. 6 illustrates the system condition after power up or after a global reset shadow protocol (described hereinafter) has been issued from the TBC. In this condition, the TBC and all applications are in the 1149.1 TLRST state and all ASPs are in a disconnected condition. In FIGS. 6 through 23 the current steady state of the TBC and applications is indicated by the darkened steady state boxes. Also an ASP that has been connected between the TBC and application is indicated by a darkened box.

Figure 7:
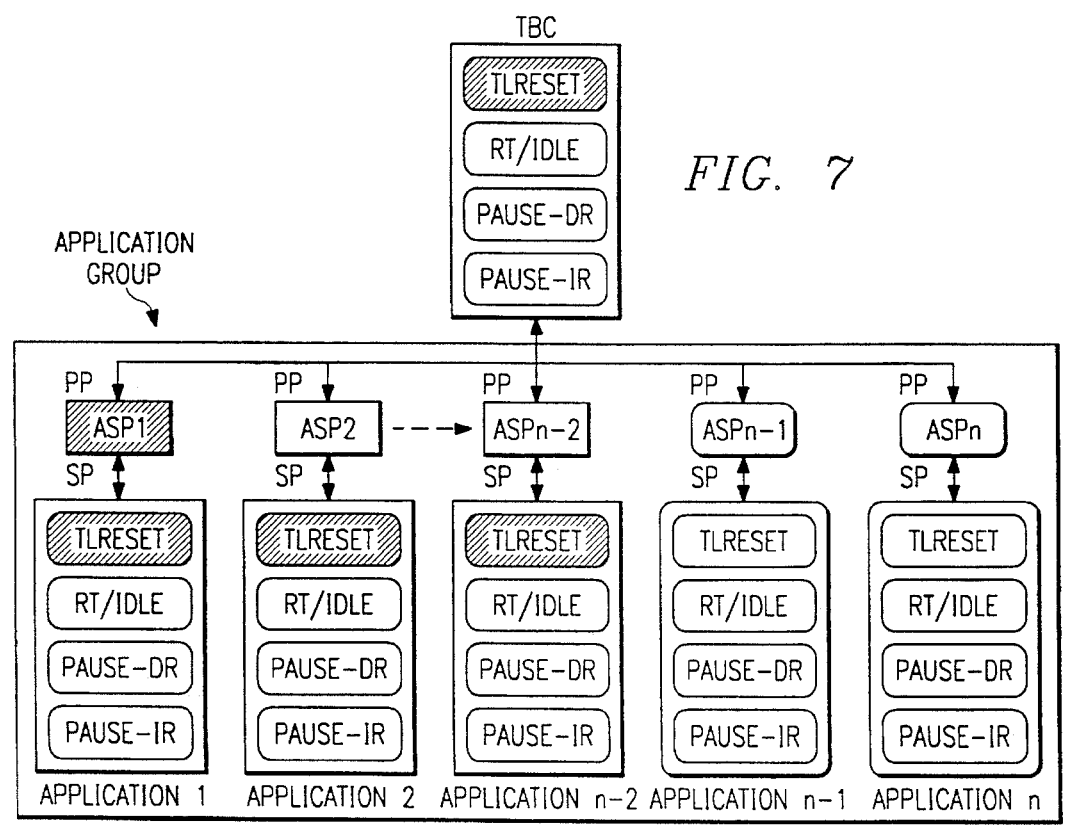
Figure 8:
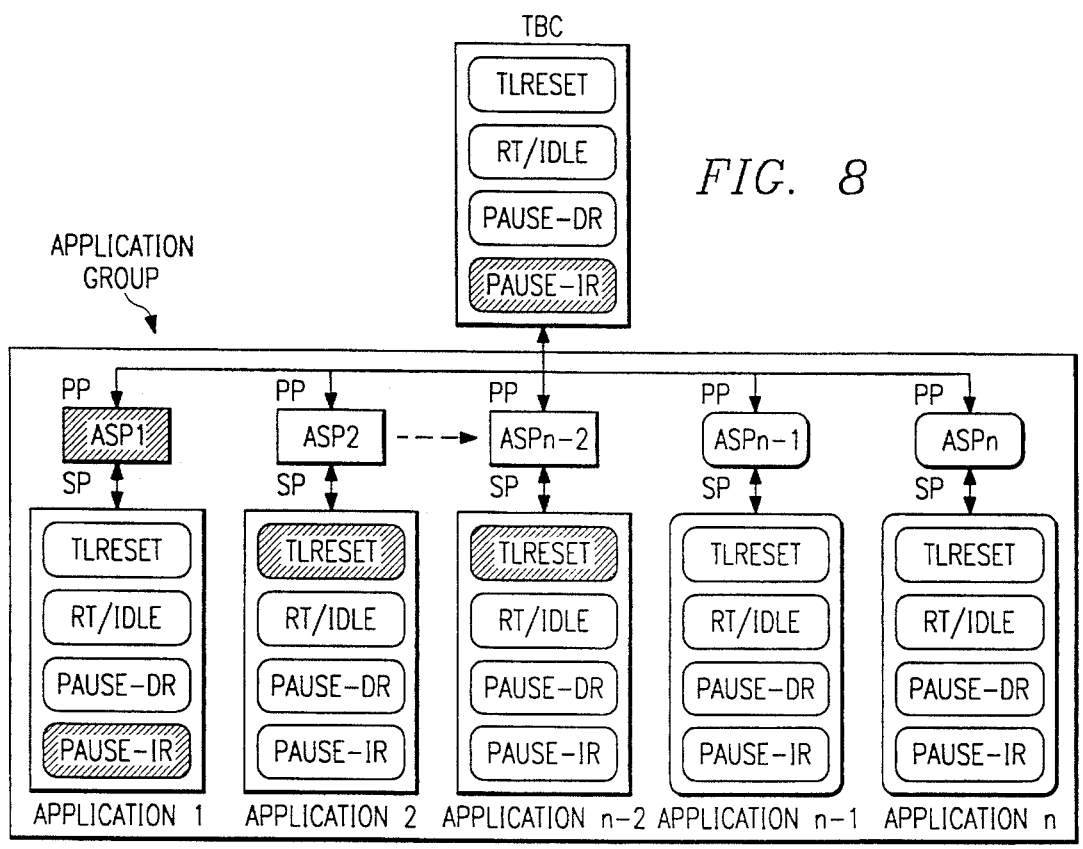

To access and load a self-test instruction into application 1, the TBC issues a shadow protocol to ASP1 to make a connection between the TBC and application 1. In FIG. 7, ASP1 is shown darkened to indicate the connection made after the shadow protocol has been transmitted. FIG. 8 illustrates the TBC transitioning from the TLRST state to load a self-test instruction into application 1, via an instruction scan operation, then terminating the instruction scan operation in the PAUSE-IR state. By terminating the instruction scan operation in the PAUSE-IR state instead of the RT/IDLE state, the self-test instruction has been installed into application 1 but is not yet enabled to execute because self-test instructions are enabled to execute by entering into the RT/IDLE state.

The next step is to disconnect from application 1, leaving it in the PAUSE-IR state. It is important that only a disconnect occurs here, not a disconnect and connect operation. For example, if the TBC disconnected from application 1 (in the PAUSE-IR state) and connected to application 2 (in the TLRST state), the TBC and application 2 would be in two different 1149.1 steady states, i.e. TBC would be in PAUSE-IR and application 2 would be in TLRST. This action would cause loss of 1149.1 state synchronization between the TBC and applications.

What must be done is to disconnect from application 1 by transmitting a dummy shadow protocol that appears to connect the imaginary application n-1 to the TBC via the imaginary ASP n-1. Thus the purpose of imaginary ASP n-1 and imaginary application n-1 is to provide an escape route from a previously connected ASP. Using the imaginary ASP and application n-1 it is possible for the TBC to disconnect from a real ASP and application without losing 1149.1 state synchronization. Furthermore, it is possible using the imaginary ASP and application n-1 to leave a real ASP and application in any of the 1149.1 steady states. The dummy shadow protocol for application n-1 contains a dummy address which is different than each of the addresses of applications 1 through n-2, so that applications 1 through n-2 will not recognize this dummy address as their own address. Any ASP/application which is currently connected up to the TBC will disconnect itself from the TBC when it receives the dummy shadow protocol with the dummy address, because its own address is no longer asserted. Although the individual ASPs need not be able to specifically recognize the dummy address and need only be able to recognize the mismatch from their own addresses, nevertheless, as indicated hereinafter with reference to FIG. 30, the dummy address can be programmed into the ASPs so that they can specifically recognize the dummy address as a disconnect address (DISA).

Figure 9:
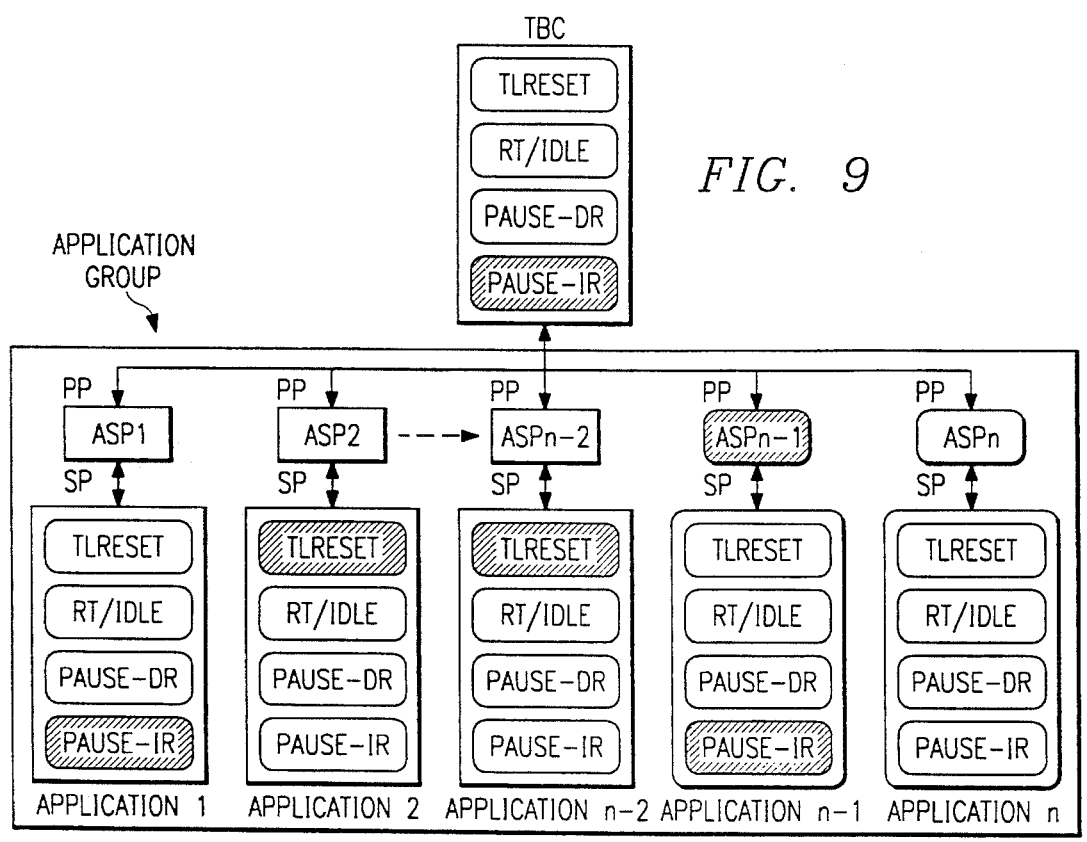
Figure 10:
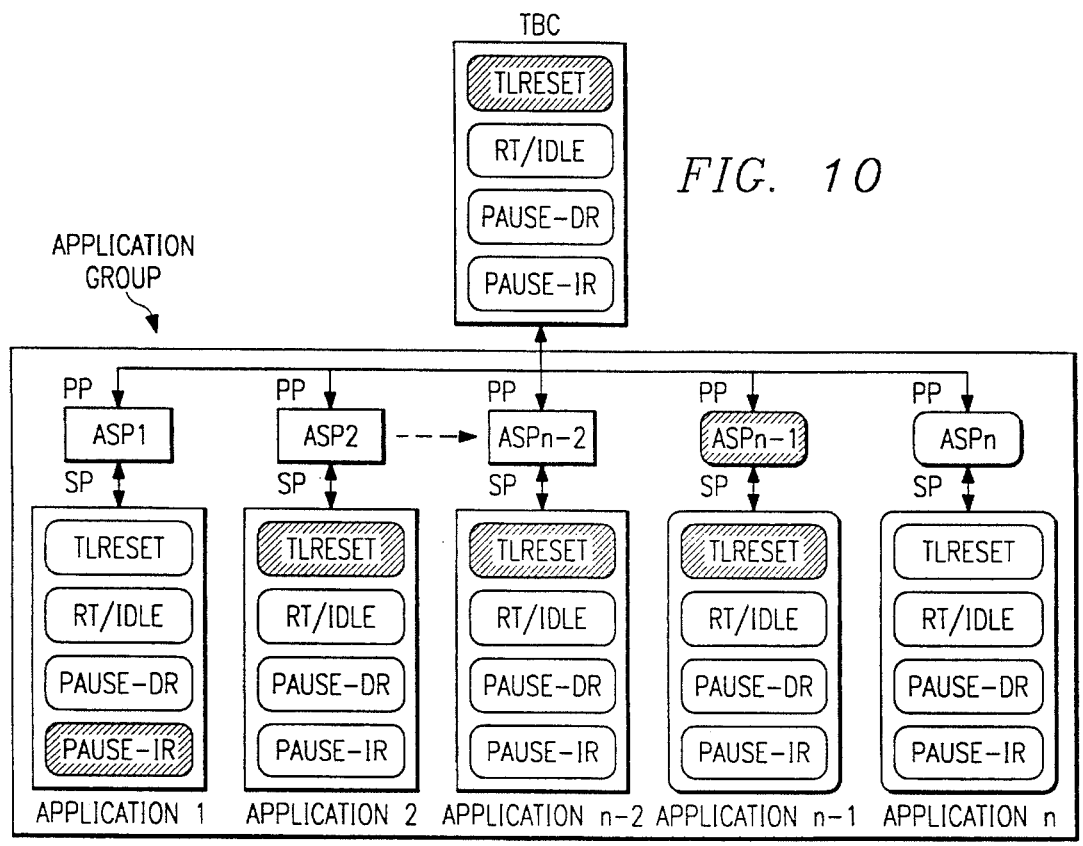
Figure 11:
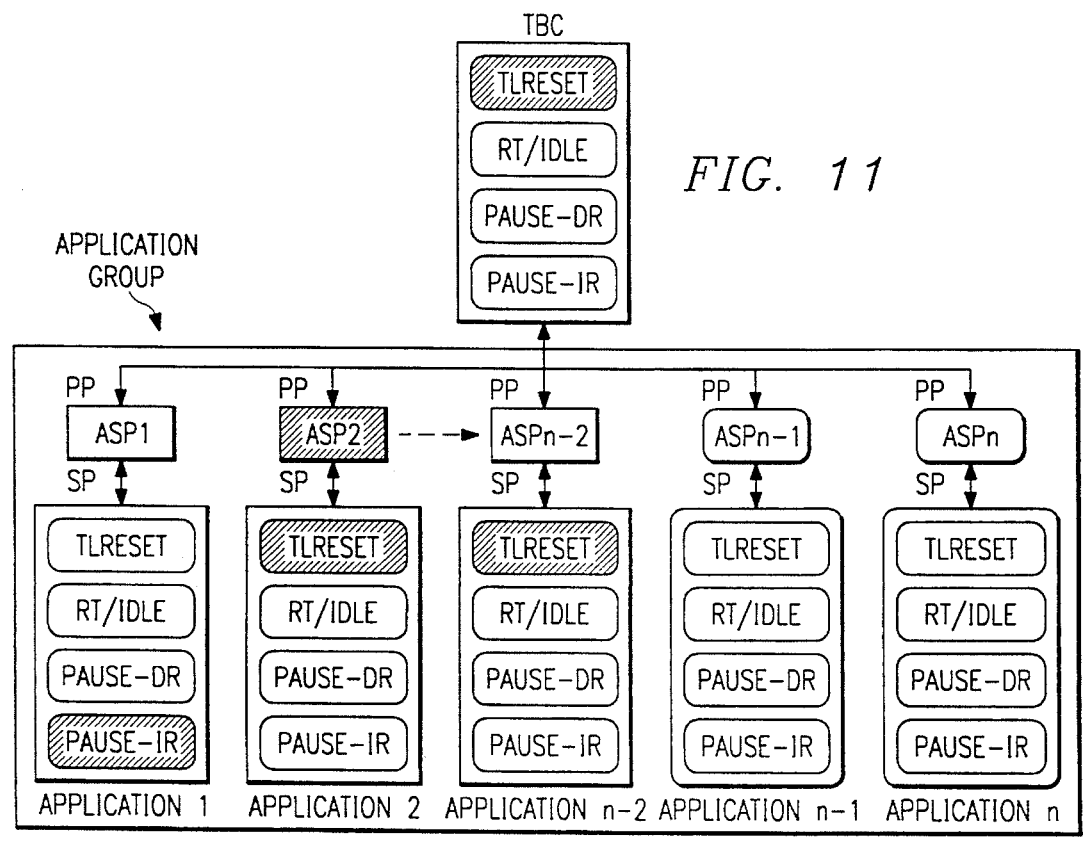
Figure 12:
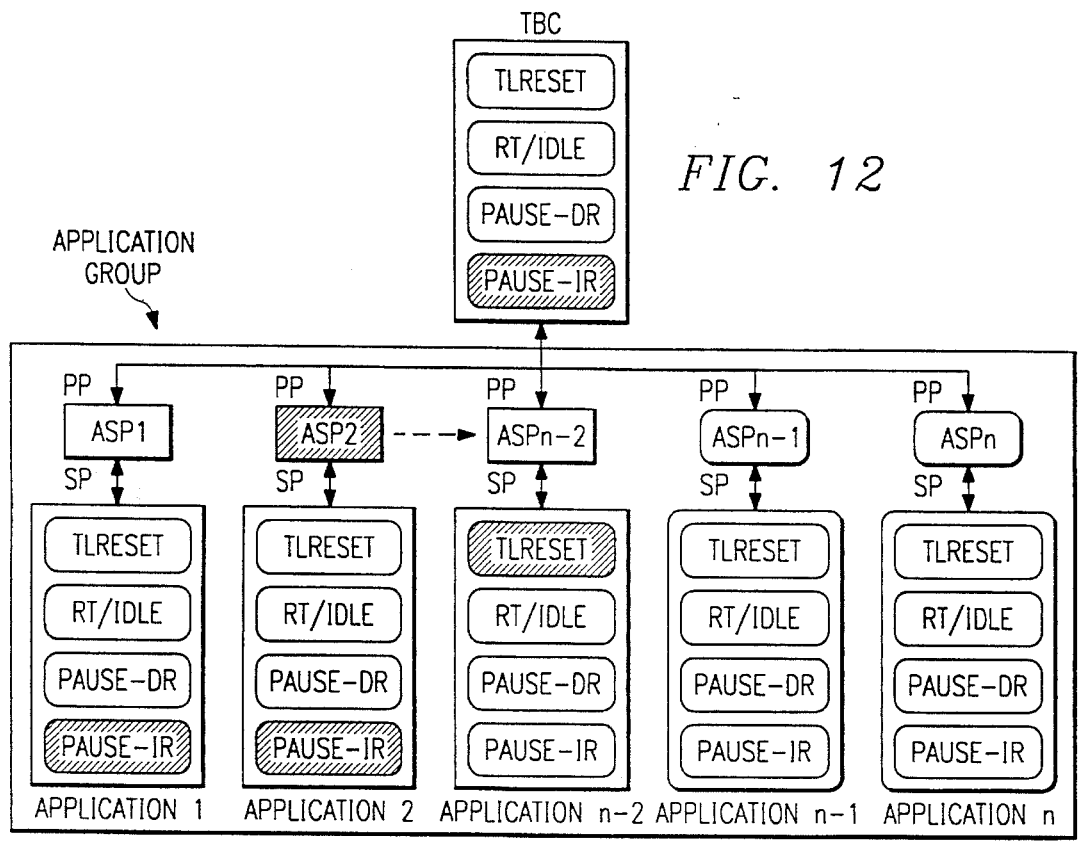
Figure 13:
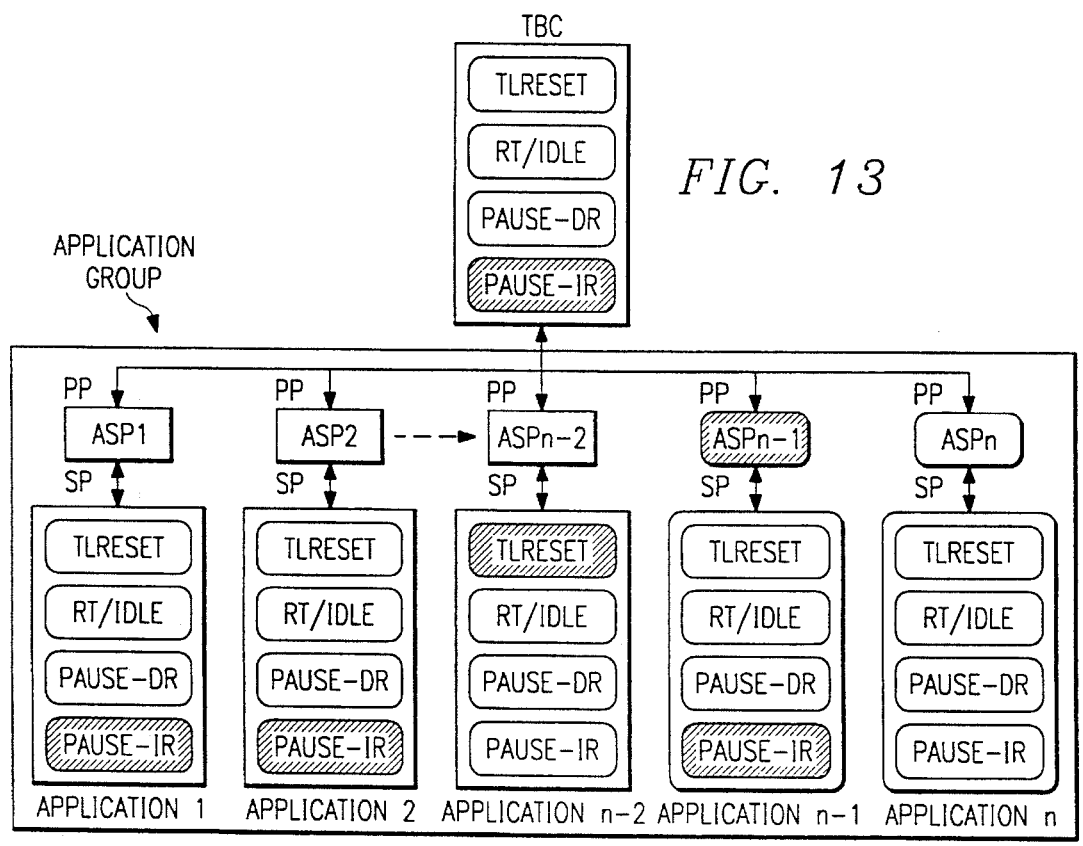
Figure 14:
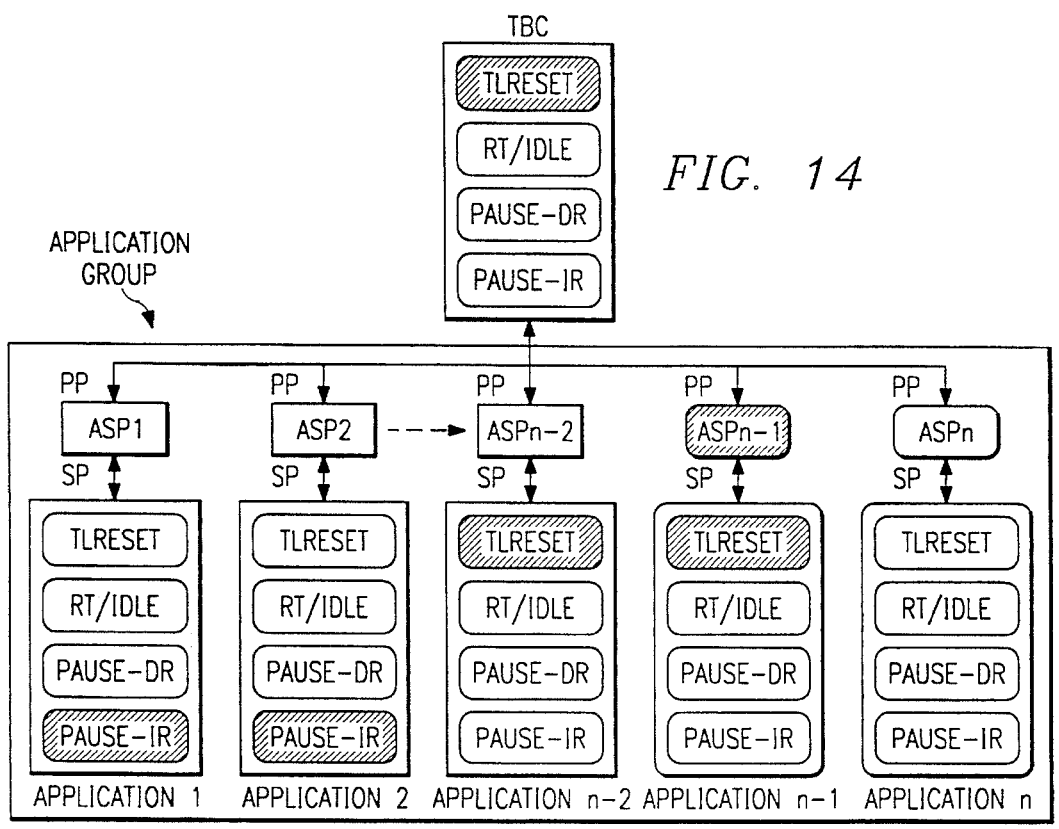
Figure 15:
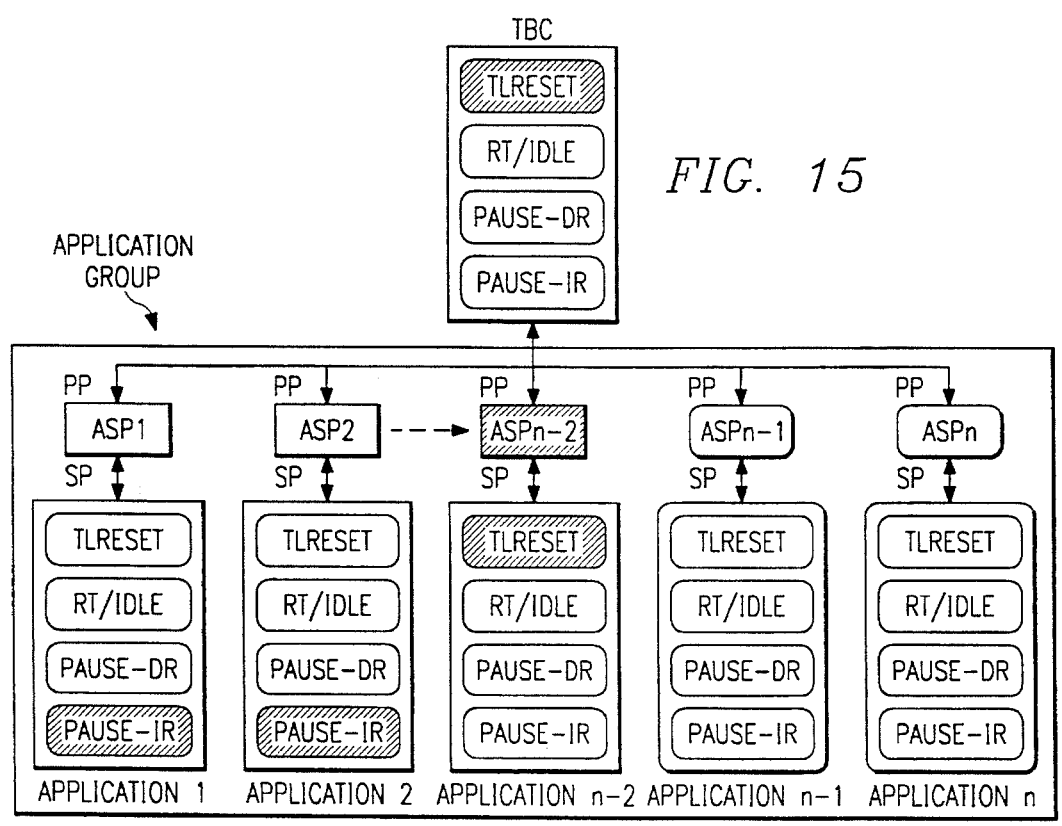

FIG. 9 illustrates the results of the TBC issuing a shadow protocol, while in the PAUSE-IR state, to disconnect from ASP1 and connect up to imaginary ASPn-1. After this step is performed, the TEC moves itself and the imaginary ASPn-1 to the TLRST state as shown in FIG. 10. The reason to move into the TLRST state is to allow any of the remaining ASPs and applications (2 through n-2) to be accessed, since they are currently in the TLRST state.

The remaining ASPs and applications (2 through n-2) in the system are connected to the TBC, setup with self-test instructions and left in the PAUSE-IR state, and disconnected from the TBC via the imaginary ASP and application n-1 as described above. These steps are depicted in FIGS. 11 through 16.

Figure 16:
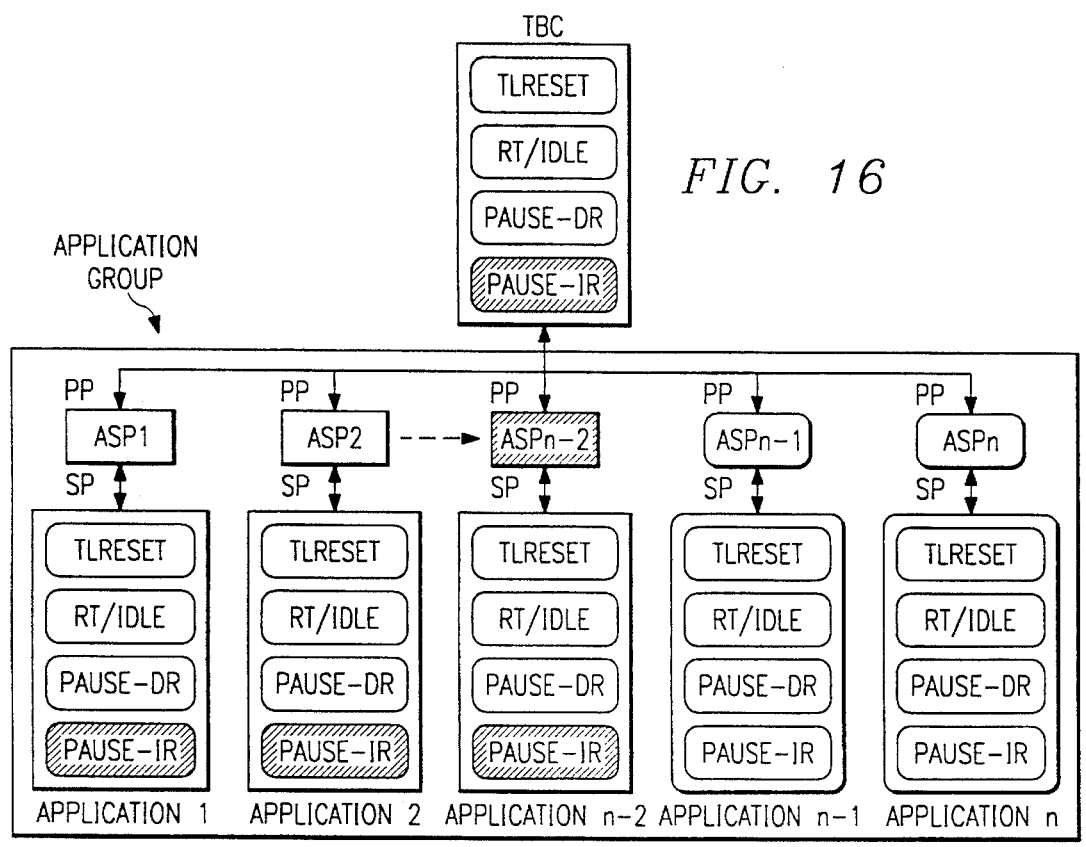

In FIG. 16, the last application (n-2) is shown loaded with the self-test instruction and transitioned into the PAUSE-IR state. Since all applications at this point have been loaded with their self-test instruction and are in the PAUSE-IR state, it is time to sort the parallel execution of all self-tests. To provide a global signal to all ASPs and applications that contain self-test instructions and are positioned in the PAUSE-IR state, imaginary ASP and application "n" is used. The imaginary ASPn uses a special dummy address that all ASPs know. In this exemplary description, the special address assigned to imaginary ASPn is the most significant address in the addressing range of all ASPs (1-n). So all ASPs know both their own address and the most significant address of their address range.

The address used by ASPn is different from all other ASP addresses, both real and imaginary (dummy.), and is referred to as the self-test synchronizing address (STSA). When issued in a shadow protocol, the STSA is recognized by all ASPs. If an ASP is in the PAUSE-IR state and receives the STSA address, it is enabled to allow its application to be transitioned through 1149.1 states synchronous with control input from the TBC. Using this approach then, it is possible to cause all ASPs and applications that have been setup with self-test instructions and left in the PAUSE-IR state, to transition from the PAUSE-IR state into the RT/IDLE state.

The simultaneous movement of all ASPs and applications into the RT/IDLE state (FIG. 18) enables all the self-test instructions previously loaded to begin execution. Any ASP/application that was not in the PAUSE-IR state when the STSA was issued will not transition into the RT/IDLE state with the TBC. Thus only selected ones of the ASPs and applications in the system are allowed to simultaneously execute self-test operations.

The PTDO outputs of the ASPs (see FIG. 30) are disabled in response to receiving an STSA address. This avoids potential bus contention between multiple ASP PTDO outputs (which are wired together) during parallel entry into the RT/IDLE state.

While the PAUSE-IR state is the steady state shown for enabling the ASP to respond to the STSA address (see also FIG. 31), the PAUSE-DR state could also be used if desired. The PAUSE-IR state is used in this description as an example of a steady state that can be used to enable parallel entry into the RT/IDLE state.

Figure 17:
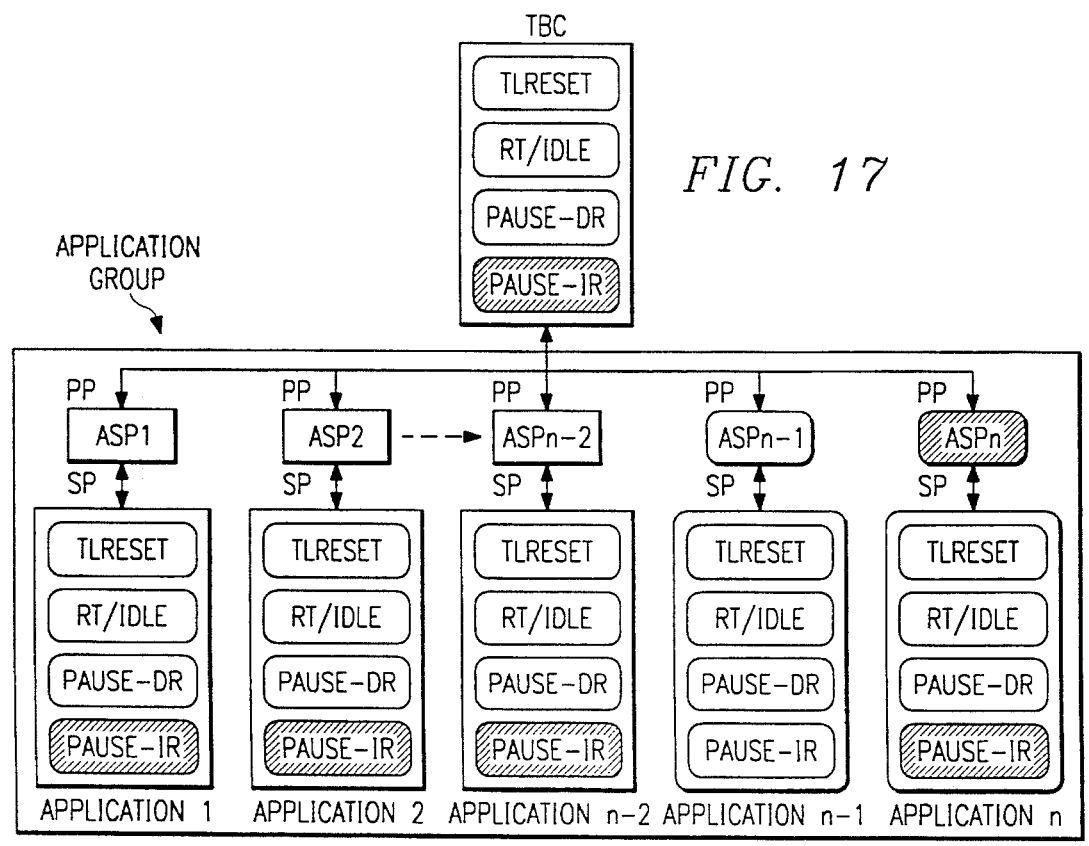
Figure 18:
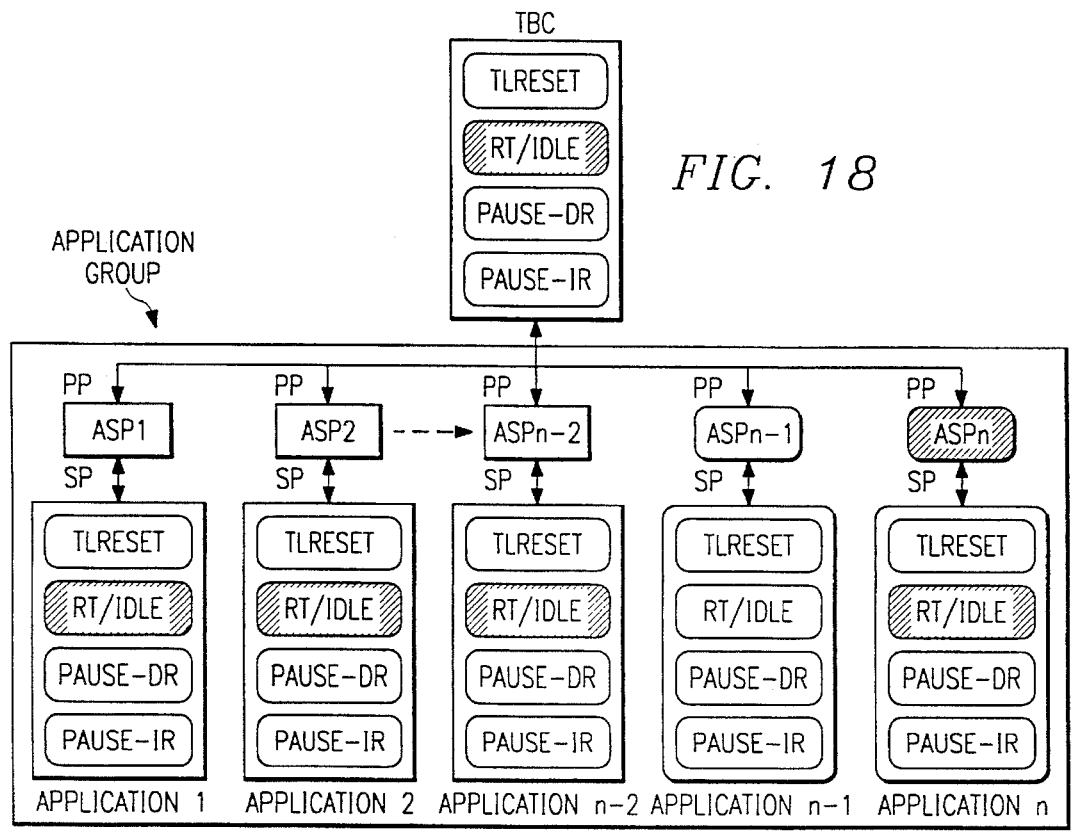

The sequences depicted in FIG. 16, 17, and 18 illustrate: (1) the transmission of the shadow protocol containing the STSA address (FIGS. 16 to 17), (2) the global transitioning of all selected ASPs and applications from the PAUSE-IR state to RT/IDLE state in response to receiving the STSA address and subsequent TMS control from the TBC (FIGS. 17 to 18), and (3) the parallel execution of all application self-test operations after the RT/IDLE state has been entered (FIG. 18).

While the TBC can halt self-test operations by transitioning from the RT/IDLE state into another state, the self-tests do not require intervention from the TBC and will terminate on their own after a predetermined number of TCKs have occurred while in the RT/IDLE state. After each application self-test completes, the result of the self-test (for example, pass or fail) is stored in a data register within the application.

After the longest application self-test has completed, the TBC exits the RT/IDLE state and accesses each application in sequence, using shadow protocols to connect to applications and 1149.1 data register scan operations to extract the self-test results from the applications. For example, after all self-tests execute, the TBC issues a shadow protocol to connect up with application 1 via ASP1 in FIG. 19. After the connection between the TBC and application 1 is made, the TBC executes a data register scan operation to access the self-test results from application 1. In turn, the TBC issues shadow protocols to connect and 1149.1 data register scan operations to access the self-test results from remaining applications 2 through n-2 as shown in FIGS. 20 and 21.

Figure 22:
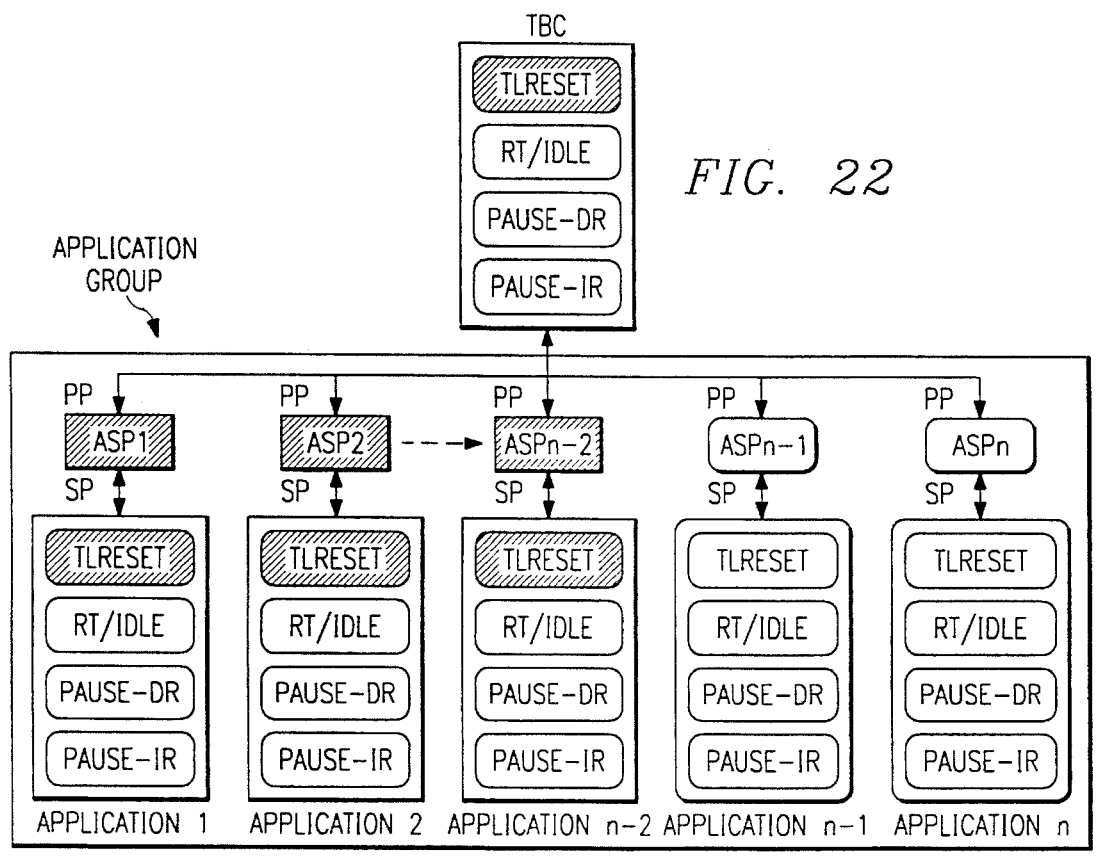
Figure 23:
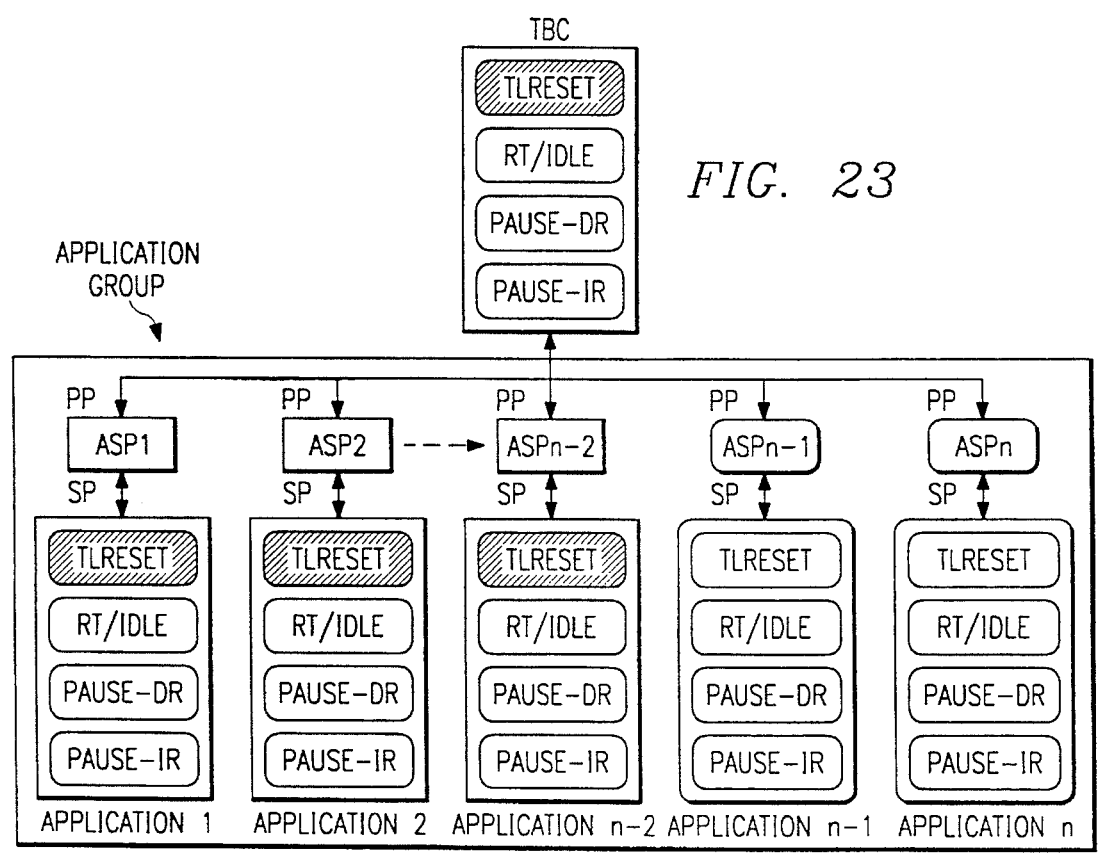

After accessing the results of the self-test operations to determine whether each self-test passed or failed, the TBC issues a global reset shadow protocol to disconnect all ASPs and place all applications back into the TLRST state (FIGS. 22–23). While each ASP could be individually connected, then transitioned into the TLRST state, and then disconnected using individual shadow protocols, the global reset approach is the quickest way to achieve this goal.

The applications at 17 could be, for example, a single IC or a group of ICs serially connected on a board, multi-chip module, or other common substrate.

Figure 24:
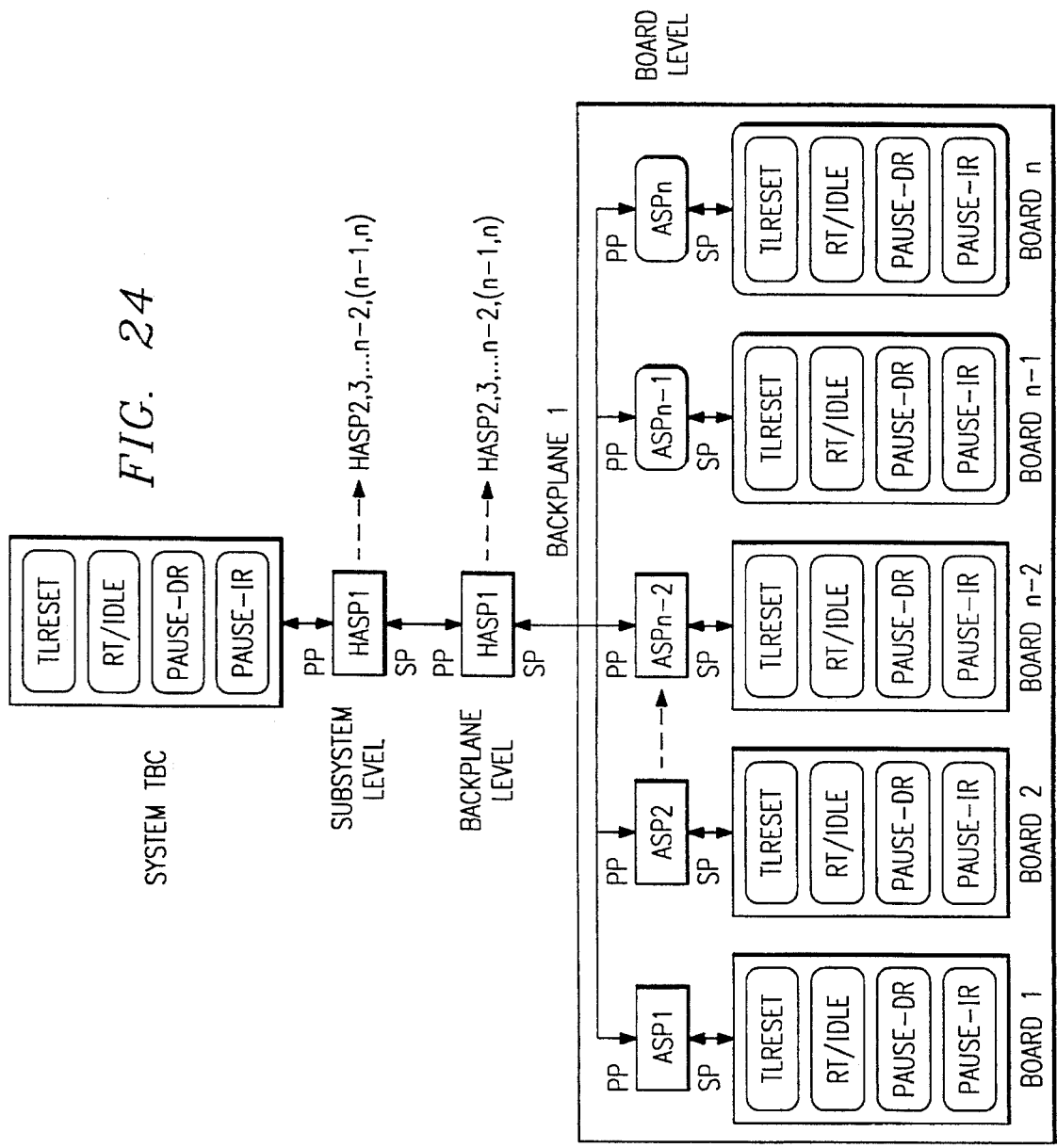
FIG. 24 illustrates a hierarchical system test configuration in which the present invention is implemented.

In the examples of FIGS. 6 through 23, the TBC was shown connected directly to the ASP of each application. In complex electronic systems, hierarchical addressable shadow ports (HASPs) may reside between the TBC and the ASP of each application as shown in FIG. 24. The HASP (described hereinafter with reference to FIGS. 32–39) is a device similar to the ASP that provides a way to hierarchically make connections between a TBC and a target application. The HASP is described in detail in the above-incorporated applications.

In FIG. 24, subsystem level HASPs 1 through n-2 are shown forming a connection between a system TBC and backplane level HASPs 1 through n-2. Further, the backplane level HASPs are shown forming a connection between the associated subsystem level HASPs and board level ASPs 1 through n-2. Each of the n-2 subsystem level HASPs thus permits the TBC to access n-2 backplane level HASPs, and each backplane level HASP permits access to n-2 board level ASPs. The board level ASPs are connected to applications (iCs on the board).

What FIG. 24 exemplifies is that the approach of using a disconnect address, DISA, to provide an escape route for disconnect only operations, and using a self-test synchronizing address, STSA, for signaling parallel entry into self-test operations, can be used hierarchically within a system connection scheme. For example, in the system shown in FIG. 24 it is possible to hierarchically connect the TBC to sequence through each board in backplane 1 of subsystem 1, setting up each board for self-testing and leaving each board in the PAUSE-IR state exactly as previously described in the non-hierarchical example of FIGS. 6 through 16. After backplane 1 has been setup, the TBC outputs a shadow protocol which applies the dummy address DISA address to each hierarchical level, thereby disconnecting each of the following components while leaving each in the PAUSE-IR state: the currently connected ASP of backplane 1 of subsystem 1; backplane level HASP1 of subsystem 1; and subsystem level HASP1. Thereafter, the TBC is hierarchically connected to setup other backplanes in the system, for example backplane 2 of subsystem 3 and backplane 1 of subsystem 2, to a similar parallel self-test condition. After all desired backplanes have been setup, the TBC outputs, while in the PAUSE-IR state, a shadow protocol which applies the STSA address to each hierarchical level, thereby enabling each HASP and ASP in the PAUSE-IR state to transition through 1149.1 states synchronously with the TBC. Thereafter, the TBC moves all selected backplanes and boards into the RT/IDLE state as shown in FIGS. 17 and 18 to execute self-tests in parallel.

In response to receiving the hierarchical subsystem, backplane and board level STSA addresses (n), all subsystem level HASPs, backplane level HASPs and board level ASPs that have been previously left in the PAUSE-IR state (in the present example, subsystem HASPs 1-3, backplane HASP 1 of subsystem 1, backplane HASP 2 of subsystem 3, backplane HASP 1 of subsystem 2, and all ASPs of the aforementioned backplanes) couple their PTMS input signals to their STMS output signals to allow the board level applications to transfer from the PAUSE-IR state to the RT/IDLE state synchronous to the bus control output from the TBC. Upon entering into the RT/IDLE state, all selected board applications in each selected backplane start and execute their self-test operations concurrently.

Figure 19:
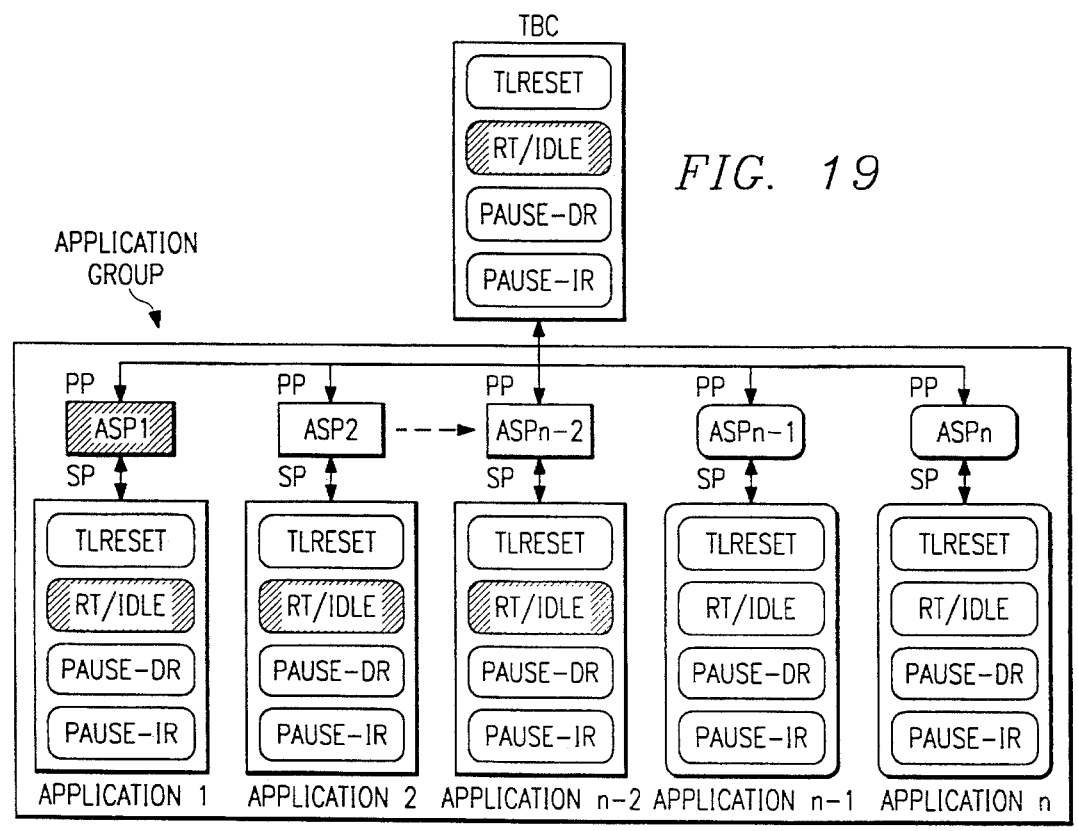
Figure 20:
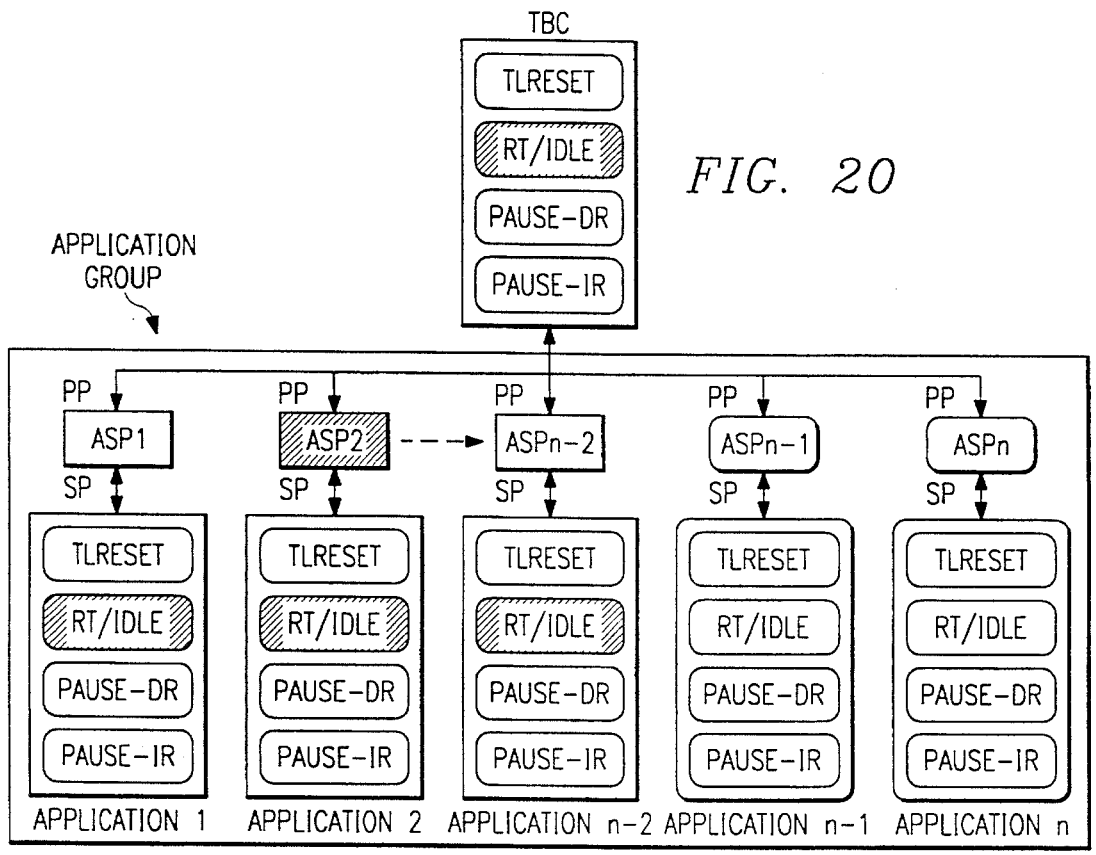
Figure 21:
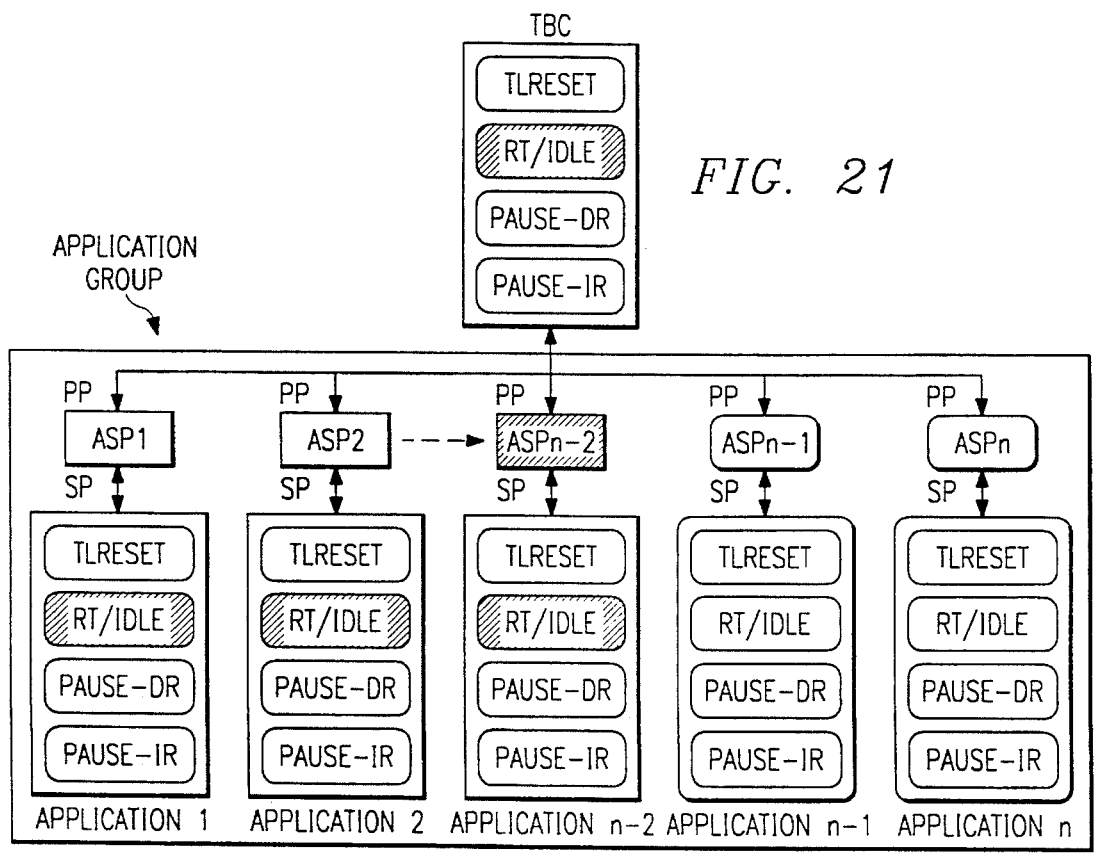

After all self-tests have executed, the TBC hierarchically connects to each backplane board to extract the self-test results as illustrated in FIGS. 19, 20, and 21. After self-testing is complete and results obtained, the TBC issues a hierarchical reset shadow protocol to reset the test logic on each board and disconnect all ASPs and HASPs as illustrated in FIG. 22 and 23.

As indicated above, HASPs at any connectivity level within the FIG. 24 system can be disconnected and left in any 1149.1 steady state without selecting another HASP at that level. This capability allows disconnecting and maintaining state retention on the disconnecting HASP and all hierarchical HASP/ASP connections from the disconnecting HASP to the application. This capability is brought about by reserving an address at each hierarchical connection level to be used as a "disconnect only", or DISA, address (such as n-1).

Also in FIG. 24, HASPs and ASPs at any connectivity level within the system can be made to recognize their STSA address (n) while in the PAUSE-IR state, and respond by coupling their PTMS and STMS signals together. Once the PTMS and STMS signal connections are coupled hierarchically between the TBC and target applications via HASPs and ASPs, the applications can be made to transition with the TBC from the PAUSE-IR state into the RT/IDLE state to begin their self-test operations.

The PTDO output of each ASP and HASP is disabled in response to receiving an STSA address. This avoids potential bus contention between multiple ASP and HASP PTDO outputs (which are wired together) during parallel entry into the RT/IDLE state.

Although FIG. 24 illustrates the invention applied to a system having plural subsystems, with each subsystem including plural backplanes, and each backplane having plural boards, the invention is applicable to any type of hierarchical arrangement, regardless of its physical characteristics. As another example, each subsystem referenced in FIG. 24 could be an IC on a single board, each backplane referenced in FIG. 24 could instead be a circuit module on an IC, and each board referenced in FIG. 24 could instead be a circuit component within a circuit module.

The addressable shadow port (ASP) discussed above, and a protocol, referred to as a shadow protocol, provide a method of directly connecting 1149.1 backplane and board buses together. When the 1149.1 backplane bus is in either its run test/idle (RT/IDLE) or TLRST state, or one of its PAUSE states, the ASP can be enabled, via the shadow protocol, to connect a target board's 1149.1 bus up to the backplane 1149.1 bus. After the shadow protocol has been used to connect the target board and backplane buses together, it is disabled and becomes transparent to the operation of the 1149.1 bus protocol.

Figure 25:
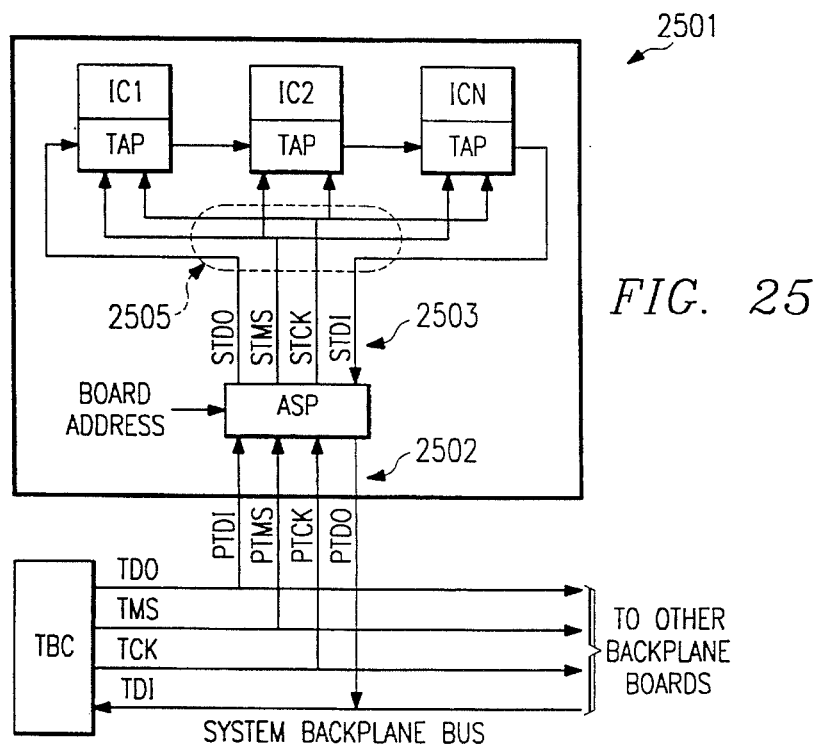
FIG. 25–26 illustrate the connection details of the addressable shadow ports of FIGS. 5–23.

A board example using the ASP is shown in FIG. 25. The board 2501 includes multiple ICs and an ASP. The ICs operate, when connected via the associated ASP to the 1149.1 backplane bus, as described in the 1149.1 standard. The ASP has a primary port 2502 for connection to the backplane 1149.1 bus, a secondary port 2503 for connection to the board 1149.1 bus 2505, and a board address input. The primary port signals are labeled; PTDI, PTDO, PTCK, and PTMS. The secondary port signals are labeled; STDI, STDO, STCK, and STMS. The address input identifies the board on which the ASP is mounted.

Figure 26:
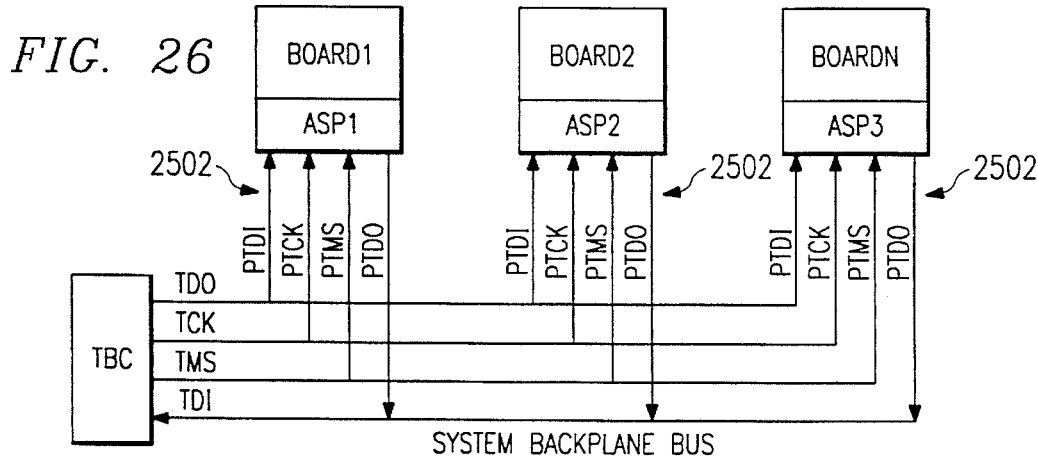

In FIG. 26,-multiple boards, similar to the one in FIG. 25, are shown interfaced to a TBC via ASPs. When one of the boards needs to be accessed, the TBC transmits a selection shadow protocol, referred to as a select protocol, to address and enable the ASP of the selected board. The TBC transmits the select protocol when the backplane 1149.1 bus is inactive and in a stable stage, such as the RT/IDLE or TLRST states, or one of the PAUSE states. The select protocol contains an address that is used to match against the address input to the ASP. All ASPs receive the select protocol, but only the one with the matching address is selected.

In response to the select protocol, the selected ASP transmits an acknowledgment shadow protocol, referred to as an acknowledge protocol, to the TBC to verify reception of the select protocol. The acknowledge protocol contains the address of the selected ASP to allow the TBC to verify that the correct ASP was selected. After transmitting the acknowledge protocol, the selected ASP makes a connection between its primary and secondary ports 2502 and 2503. In response to the acknowledge protocol, the TBC communicates to the selected board using the 1149.1 bus protocol. If the TBC does not receive an acknowledge protocol, it assumes the board has been removed or is disabled and will not attempt to communicate with it.

After the TBC completes its 1149.1 access of the currently selected board, it can output a new select protocol to select another board's ASP. In response to the new select protocol, the newly selected ASP transmits an acknowledge protocol back to the TBC, then connects its primary and secondary ports. Also in response to the new select protocol, the previously selected ASP breaks the connection between its primary and secondary ports. The disconnecting ASP remains in the state the backplane 1149.1 bus was in when the disconnect occurs, i.e. the 1149.1 RT/IDLE or TLRST state, or one of the PAUSE states. The ability to disconnect and leave the board level 1149.1 bus 2505 in, for example, the RT/IDLE state allows leaving the board in a test mode while other boards are being selected and accessed.

The select and acknowledge protocols are transmitted on the 1149.1 bus without infringing upon the 1149.1 bus protocol. This is assured because the select and acknowledge protocols do not use the 1149.1 TMS signal, and the protocols are only transmitted while the 1149.1 bus is idle in its RT/IDLE state or reset in its TLRST state, or paused in one of its PAUSE states.

In the RT/IDLE, PAUSE-IR(DR) and TLRST states, TDO and TDI are disabled and pulled high (via pull-ups on TDI), TCK free runs, and TMS is held at either a logic zero or one state. While the 1149.1 bus is in one of these four states, the TBC can output the select protocol from the TBC's TDO output to the PTDI inputs of the ASPs, and receive the acknowledge protocol from the selected ASP's PTDO output on the TBC's TDI input. Since the 1149.1 bus is inactive, the transmission of the select and acknowledge protocols is transparent to the 1149.1 bus, and does not infringe upon its protocol.

To transmit the select and acknowledge protocols without using the TMS control signal, a bit-pair signaling method allows control and data to be transmitted together on a single wiring channel. During select protocols, the bit-pair signaling method allows the TBC to transmit control and data from its TDO output to the ASP's PTDI input. During acknowledge protocols, the bit-pair signaling method allows the selected ASP to transmit control and data from its PTDO output to the TBC's TDI input. Both protocols include control to indicate: an idle condition, a start data transfer condition, and a stop data transfer condition. In addition, both protocols include a method of transmitting data during the interval between the start and stop data transfer conditions. The bit-pair signals used in the select and acknowledge protocols are defined below.

Idle Bit-Pair—an encoded control signal (I) identified by the transfer of two successive logic one bits from a transmitter to a receiver.

Select Bit-Pair—an encoded control signal (S) identified by the transfer of two successive logic zero bits from a transmitter to a receiver.

Logic 1 Bit-Pair—an encoded logic one signal (D) identified by the transfer of a logic zero bit followed by a logic one bit from a transmitter to a receiver.

Logic 0 Bit-Pair—an encoded logic zero signal (D) identified by the transfer of a logic one bit followed by a logic zero bit from a transmitter to a receiver.

The bit-pair signals are output from the transmitting device (TBC or ASP) on the falling edge of the TCK and input to the receiving device (TBC or ASP) on the rising edge of the TCK. Since this timing is consistent with 1149.1 timing, upgrading a TBC to support this approach is simply a matter of forcing the TMS output to hold its present state ("0" for RT/IDLE and PAUSE-IR(DR), and "1" for TLRST) while using normal 1149.1 scan operations to transmit and receive the select and acknowledge protocols.

Figure 27:
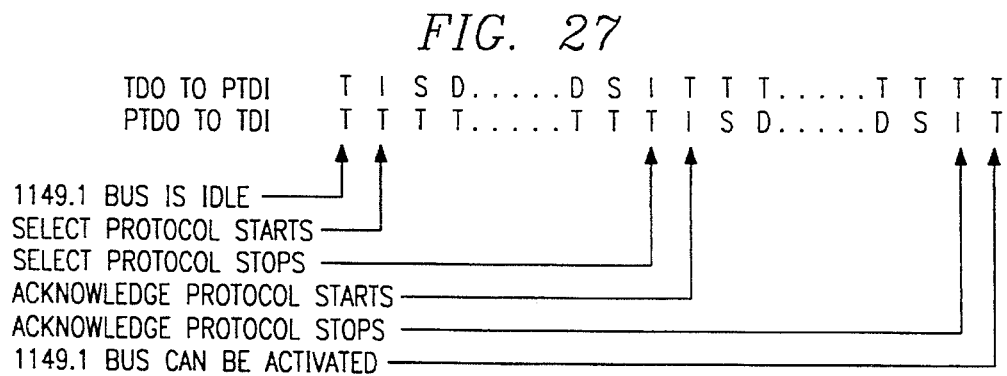
FIG. 27 illustrates select and acknowledge protocols used for communication between the test bus controller and the addressable shadow ports of FIGS. 25–26.

A diagram of the select and acknowledge protocols is shown in FIG. 27. The T signals shown in the protocol sequence indicate when the TDO to PTDI and PTDO to TDI wiring channels are tristate and pulled high. The first sequence framed between the first and second I signals is the select protocol output from the TBC to the ASP (TDO to PTDI). The second sequence framed between the first and second I signals is the acknowledge protocol output from the selected ASP to the TBC (PTDO to TDI). The select protocol always precedes the acknowledge protocol as shown in the diagram.

The I signal at the beginning of each protocol is designed to be indistinguishable from the preceding T signals. This avoids unintentional entry into a select or acknowledge protocol when the TBC tri-states its TDO output (T) before entering the RT/IDLE state after a scan operation. However, the I signal at the end of each protocol is designed to be distinguishable from the preceding S and D signals so that it can be used to terminate the protocol. Inside each protocol, first and second S signals are used to frame the address which is defined by a series of D signals. The logic zero and one D signals are distinguishable so that the binary address can be recovered.

Figure 28:
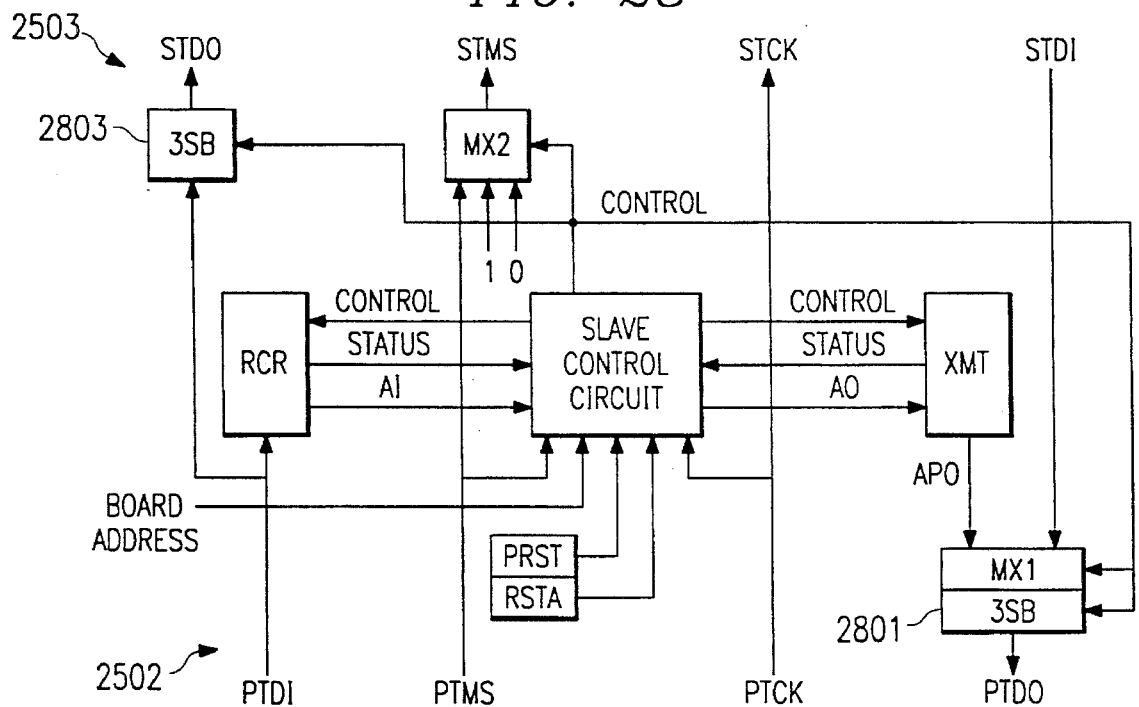
FIG. 28 is a circuit diagram of one embodiment of the addressable shadow ports of FIGS. 25–26.

A circuit example of the ASP is shown in FIG. 28. The ASP includes a receiver circuit (RCR), a transmitter circuit (XMT), a slave control circuit, multiplexers (MX1 and MX2), a power up reset circuit (PRST), and a reset address (RSTA). The primary port signals (PTDI, PTMS, PTCK, PTDO) connect to the backplane level 1149.1 bus. The secondary port signals (STDO, STMS, STCK, STDI) connect to the board level 1149.1 bus. The address input bus receives the board address.

The receiver circuit includes a controller and a serial input/parallel output (SIPO) register. The PTDI signal from the TBC is input to the receiver's SIPO register to supply the serial address during select protocols, and input to the receiver's controller to regulate the receiver during select protocols. The parallel address output from the SIPO is input to the slave control circuit via the address input (AI) bus. The status output from the receiver is input to the slave controller circuit to indicate when a select protocol has started, when the address is ready to read, and when the select protocol has completed. The control bus input to the receiver from the slave control circuit enables the receiver to respond to a select protocol input. The receiver is only enabled when the backplane 1149.1 bus is in the RT/IDLE or TLRST state, or one of the PAUSE states.

The receiver's controller determines when a first "I-S-D" signal sequence occurs on PTDI, indicating the start of a select protocol and address input. In response to this input sequence, the controller enables the SIPO to receive the serial address input on PTDI. The controller determines when a first "D-S-I" signal sequence occurs on PTDI, indicating the end of the address input and select protocol. In response to this input sequence, the controller signals the slave control circuit, via the status bus, to read the address, then terminates the select protocol input operation.

The transmitter circuit includes a controller and a parallel input/serial output (PISO) register. The transmitter's PISO register receives parallel data from the slave control circuit via the address output (AO) bus, and outputs the address serially to the PTDO output via the acknowledge protocol output (APO) signal and MX1. The transmitter's controller receives control input from the slave control circuit via the control bus, and outputs status to the slave control circuit via the status bus. The control input regulates the parallel to serial conversion process that takes place during the acknowledge protocol. The control input only enables the transmitter to output an acknowledge protocol when the backplane 1149.1 bus is in the RT/IDLE or TLRST state, or one of the PAUSE states. The status output informs the slave control circuit of the transmitters status, i.e. whether the acknowledge protocol is in progress or complete.

At the beginning of an acknowledge protocol, the slave control circuit enables MX1 and the 3-state buffer (3SB) 2801 to pass the APO signal from the transmitter to the PTDO output. The slave control circuit then inputs the board address to the transmitter via the AO bus. In response to the address input, the transmitter outputs an I and S signal on PTDO to start the acknowledge protocol, then transmits the address on PTDO. After the address is shifted out, the transmitter circuit outputs an S and I signal sequence to stop the acknowledge protocol.

The slave control circuit regulates the operation of the transmitter, receiver, and multiplexers during select and acknowledge protocols. The slave control circuit is clocked by the PTCK input from the primary port. The PTMS input from the primary port indicates to the slave control circuit when the 1149.1 bus is busy, idle, paused or reset. While the backplane bus is idle (RT/IDLE) or reset (TLRST) or paused (PAUSE-IR(DR)), the slave control circuit enables the transmitter and receiver circuits. The status buses from the receiver and transmitter circuits are used to input status to the slave control circuit. The AI bus from the receiver inputs the address received during select protocols. The AO bus from the slave control circuit outputs the board address to the transmitter during acknowledge protocols. The address input from the reset address (RSTA) allows resetting the ASP in response to a reset address input during a select protocol. The input from the power up reset circuit (PRST) allows resetting the ASP at power up.

During select protocols, the slave control circuit receives parallel address input from the receiver via the AI bus. The slave control circuit compares the received address against the board address. If the addresses match, the ASP responds by outputting an acknowledge protocol.

During the acknowledge protocol, the slave control circuit outputs control to the transmitter to load the board address and initiate the acknowledge protocol. After the acknowledge protocol has been transmitted, the slave control circuit outputs control to connect the primary and secondary ports.

When power is first applied to the ASP, the slave control circuit is reset by input from the power-up reset circuit (PRST). When reset, the transmitter and receiver circuits are initialized and the primary and secondary ports are disconnected by disabling the STDO and PTDO outputs and setting the STMS output high. The STCK output always outputs the PTCK input. If desired, a reset input could be used to reset the ASP as well.

The ASP can also be reset by inputting a select protocol with an address that matches the reset address (RSTA) inside the ASP. If the address input matches the reset address, the ASP is reset to the same state as described in the power-up reset. The reset address is the same for all ASPs so that a global reset of all ASPs can be achieved by the transmission of a single select protocol containing the reset address. The reset address is unique from the board addresses. No acknowledge protocol is transmitted after a reset address has been received, to avoid contention on the PTDO outputs of multiple ASPs.

When 1149.1 access to another board is required, a new select protocol is issued from the TBC. When the previously selected ASP receives the new select protocol its primary and secondary ports are disconnected via multiplexer MX1 and 3-state buffer (3SB) 2803. If the new select protocol was issued while the backplane 1149.1 bus was in its RT/IDLE state (PTMS=0) or one of its PAUSE states (PTMS=0), MX2 of the disconnecting ASP outputs a logic zero on STMS, to force the board level 1149.1 bus to remain in the RT/IDLE or PAUSE-IR(DR) state. If the new select protocol was issued while the backplane 1149.1 bus was in its TLRST state (PTMS=1), MX2 of the disconnecting ASP outputs a logic one on STMS, to force the board level 1149.1 bus to remain in the TLRST state. Once again, the ability to maintain the RT/IDLE state or the PAUSE -IR(DR) state on a disconnected board allows tests to be setup and executed on more than one board at a time.

For any proposed backplane test access approach to be successful, it must be compatible with existing 1149.1 bus controllers. Today, 1149.1 bus controllers range from simple single chip solutions, to cost-effective PC based testers, on up to sophisticated, full function automatic test equipment. One thing they all have in common, however, is that they all communicate to 1149.1 targets using the same protocol and 4-wire test bus interface.

Since the backplane access approach described herein is based on protocols that can be encoded as serial data and transmitted using normal 1149.1 scan operations, this approach appears to be compatible with most bus controllers. The only requirement this approach makes on bus controllers, is that they be able to hold the TMS signal stable, at either a logic one or zero, while executing otherwise normal 1149.1 scan operations. Since most conventional bus controllers have programmable pins, it is relatively easy to set the TMS pin low or high while the other 1149.1 pins execute a "connection" scan operation to transmit and receive the select and acknowledge protocols. Test pattern sets can thus be provided with simple "connection" scan operations for the purpose of switching between 1149.1 target environments.

Figure 29:
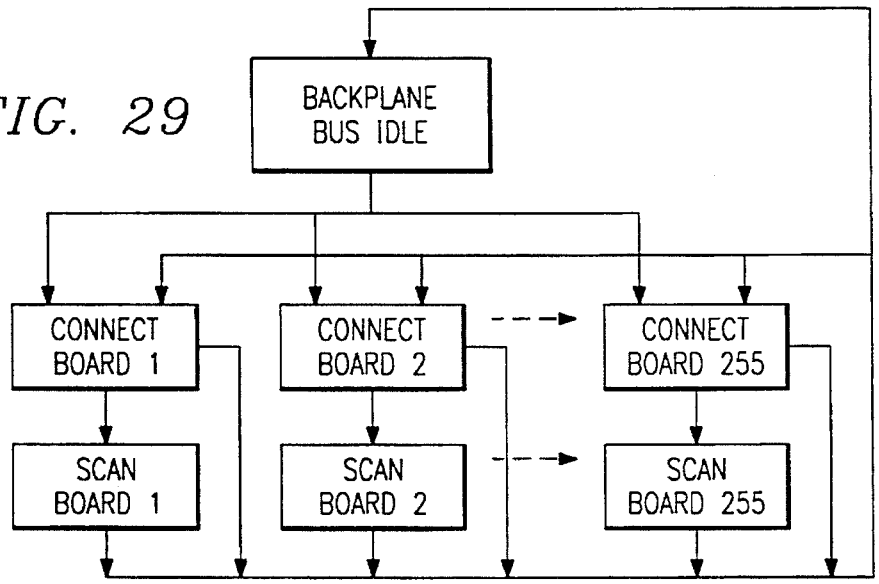
FIG. 29 illustrates the operational modes of a backplane test bus equipped with the addressable shadow ports of FIGS. 25–26.

FIG. 29 illustrates the modes of an ASP equipped 1149.1 backplane bus. The backplane bus modes include an idle mode, a connect mode, and a scan mode. The backplane bus enters the idle mode whenever scan access to a board is not required. The backplane bus enters the connect mode to couple a board up to the backplane bus for scan access. The backplane bus enters the scan mode after a board has been connected to communicate to the board using the 1149.1 protocol.

In the example of FIG. 29, the ASPs have an 8-bit address to support up to 255 board connections. At power-up or after the transmission of a global reset select protocol, all 255 ASPs are disconnected from the backplane bus and the 1149.1 test circuitry on all 255 boards is placed in a reset condition.

It is useful, especially when a bus controller has not accessed boards in the backplane for some time, to verify the presence of the boards in the backplane. To perform this operation, the bus controller executes a sequence of "connection" scan operations to temporarily connect each targeted board's ASP to the backplane bus. During each "connection" scan operation, the addressed ASP will return an acknowledge protocol to the bus controller to verify the presence of its board in the backplane. If an acknowledge protocol is not returned, the bus controller assumes the board is missing and will not attempt to communicate with it later.

When scan access of a board is required, the bus controller executes a "connection" scan operation that contains the address of the board to be accessed. In response to the "connection" scan operation, the addressed board is directly coupled to the backplane bus via the board's ASP. The bus controller verifies the connection by testing the address returned in the acknowledge protocol. If the address test passes, the bus controller communicates to the connected board using 1149.1 scan operations to test the board. These steps of connecting a board to the backplane bus, verifying the connection, then testing the board using 1149.1 scan operations are repeated as required to test the boards in the backplane.

Figure 30:
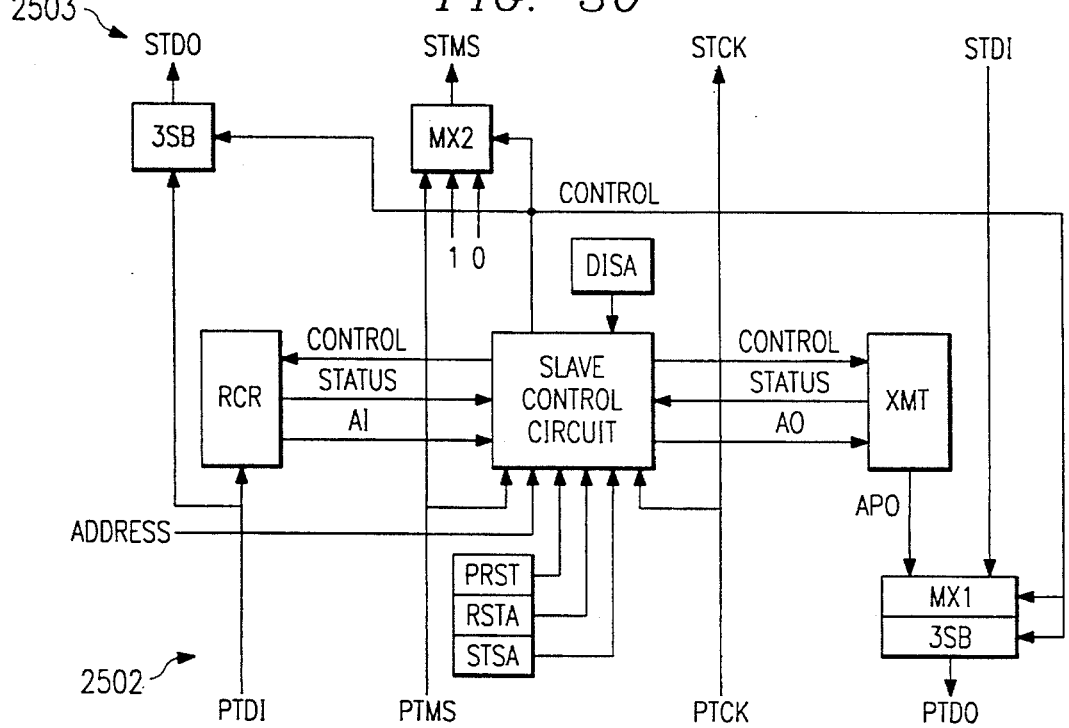
FIG. 30 is a circuit diagram of another embodiment of the addressable shadow ports of FIGS. 25–26.

FIG. 30 is a circuit example of an ASP which is capable of responding to the STSA and DISA addresses in the manner described above. FIG. 30 is similar to FIG. 28, except the ASP of FIG. 30 includes the aforementioned STSA and DISA address associated respectively with imaginary applications n and n-1 described above, and the slave control circuit of FIG. 30 includes logic which recognizes the STSA and DISA addresses and causes the ASP to respond to the STSA and DISA address as described above.

The DISA and STSA can be any desired bit pattern (transmitted as a sequence of D signals in the select protocol), so long as the DISA and STSA are distinguishable from each other and from all ASP/HASP addresses. However, because different hierarchical levels may have different size address ranges and consequently different address bit lengths, it is advantageous to make the DISA and STSA easily recognizable at each hierarchical level independent of the address bit length at that level. For example, address n, the most significant address in the address range of a given level, is easily recognizable as all 1's, regardless of the address bit length of that level. Similarly, address n-1, the next-to-most significant address, is also easily recognizable at any hierarchical level as all 1's except for a least significant bit of 0.

Figure 31:
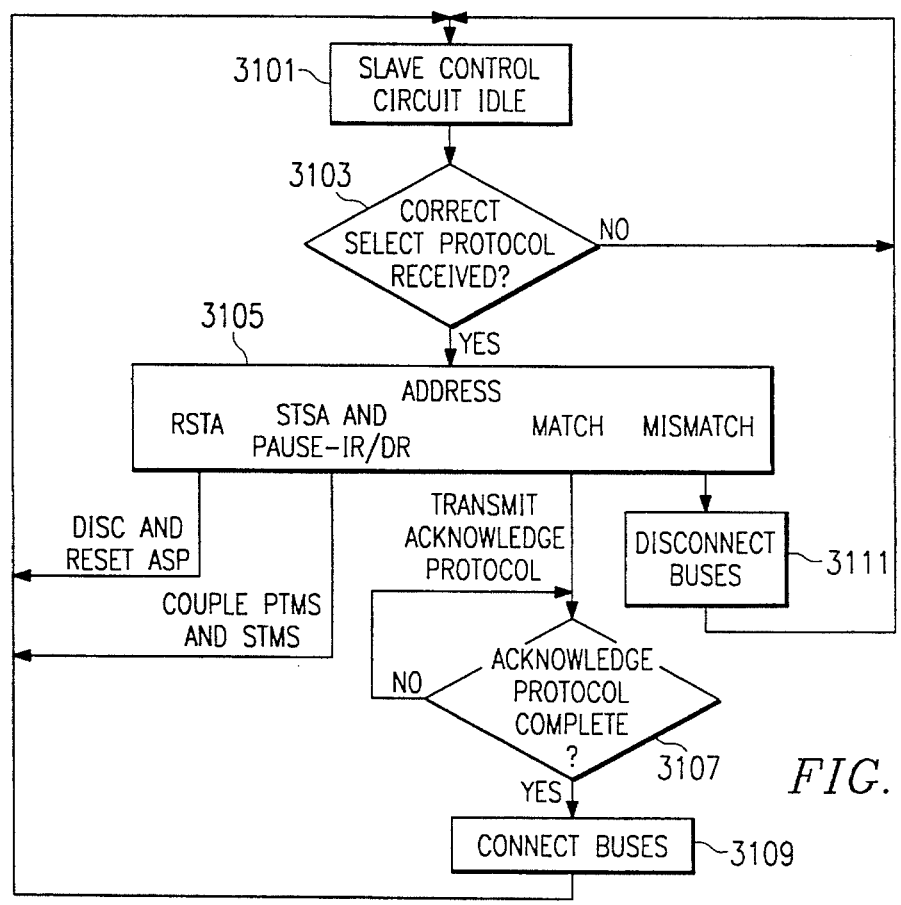
FIG. 31 is a state diagram which illustrates the operation of the control circuit of the addressable shadow port of FIG. 30.

FIG. 31 is a state diagram which illustrates the operation of the slave control circuit of the ASP of FIG. 30. When a correct select protocol is received at 3103, the address is evaluated at 3105. The following actions are taken based on the slave control circuit's evaluation of the address:

1. If the address at 3105 matches the ASPs own address, then an acknowledge protocol is transmitted back to the TBC at 3107, and the primary and secondary buses are connected at 3109;
2. If the address at 3105 is the RSTA address, then the ASP is disconnected and reset in response to RSTA;
3. If the address at 3105 is the STSA address, and if the ASP is in the PAUSE-IR state (or the PAUSE-DR state depending on design choice), then PTMS is coupled to STMS via multiplexer MX2 of FIG. 30;
4. If none of the conditions set forth in paragraphs 1– 3 above apply, then the address is considered a mismatch and the primary and secondary buses are disconnected at 3111. Although the slave control circuit can recognize the DISA address specifically, the DISA address is considered to be a mismatch.

Referring again to the test configuration of FIG. 24, this configuration is based on an extended shadow protocol and a connection device referred to as a hierarchically addressable shadow port (HASP). The extended shadow protocol and HASP allow the connection features of the ASP to be used hierarchically in a system architecture, instead of being limited to single level connection applications. The structure and operation of the HASP is similar to the above-described ASP, except for additional features which are included in the HASP to permit it to operate in hierarchical arrangements. These additional features are described below.

Hereinafter, the words "environment" and "application" are used. The word "environment" is used to indicate a physical level within a system architecture where one or more HASPs reside. The "root environment" is the lowest level environment, and is where the 1149.1 TBC resides. The word "application" is used to indicate an 1149.1 circuit within an environment that can be accessed by a TBC after a hierarchical connection has been made.

When TMS places the test bus in an idle or reset or paused state, all 1149.1 applications are disabled from responding to data transmitted on TDI and TDO. While the 1149.1 test bus is idle or reset or paused, the shadow protocol can be transmitted from the TBC to the HASPs via the TDI and TDO wires without interfering with 1149.1 applications. The shadow protocol comprises two protocols, a select protocol and an acknowledge protocol. At the beginning of a shadow protocol, a select protocol is transmitted from the TBC to the HASPs to make or route a hierarchical connection. After the select protocol has been transmitted, an acknowledge protocol is sent from the selected HASPs to the TBC to confirm the hierarchical connection.

Since the select and acknowledge protocols for the HASPs cannot use the TMS control signal, the aforementioned bit-pair signaling technique is used to control their operation. The bit-pair signaling method allows control and data to be transmitted together on a single wiring channel. The control signals are used to transfer address frames within the select and acknowledge protocols. During a select protocol, the TBC transmits an address frame from its TDO output to the PTDI input of one or more HASPs. The address frame is used to select one of the HASPs and cause a connection to be made between the TBC and an application associated with the HASP. After the HASP has received the select protocol and recognizes its address, it responds by transmitting an acknowledge protocol, containing its address, from its PTDO output to the TBC's TDI input. Following the acknowledge protocol, the HASP connects the application to the TBC for access by the 1149.1 test bus.

The bit-pair signals are output from the transmitting device's (TBC's or HASP's) TDO on the falling edge of the TCK and are input to the receiving device's (TBC's or HASP's) TDI on the rising edge of the TCK. Since this data transfer is consistent with the way 1149.1 serial data is transferred, upgrading a TBC to support this approach is simply a matter of forcing TMS to idle or reset or pause the 1149.1 applications, while using normal 1149.1 scan operations to transmit and receive the select and acknowledge protocols.

Figure 32:
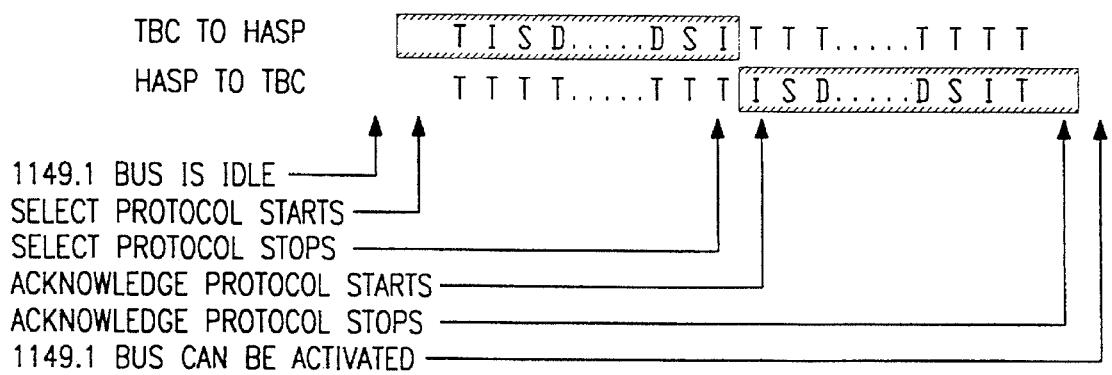
FIG. 32 illustrates a single level select and acknowledge protocol used for communication between a test bus controller and a hierarchical addressable shadow port.

In FIG. 32, a diagram is shown of a single-level select and acknowledge protocol being transmitted while the 1149.1 test bus is idle. The tristate signals (T) before and after the protocol sequences indicate that the 1149.1 test bus is idle and that the TDO outputs from the TBC and HASP are pulled high.. The "ISD..DSI" sequence transmitted from the TBC to the HASP is the select protocol. The "ISD..DSI" sequence transmitted from the HASP to the TBC is the acknowledge protocol. After the HASP transmits the acknowledge protocol it connects the TBC up to an 1149.1 application.

The I signal at the beginning of each protocol is designed to be indistinguishable from the preceding T signals. This avoids unintentional entry into a select or acknowledge protocol when the TBC tri-states its TDO output (T) when it enters the idle state after a scan operation. However, the I signal at the end of each protocol is designed to be distinguishable from the preceding S and D signals so that it can be used to terminate the protocol. Inside each protocol, first and second S signals are used to frame the address which is defined by a series of logic 1 and logic 0 D signals.

In this single level access example, only one address frame (SD..DS) is transmitted between the first and second I signals of the select and acknowledge protocol, so that, in this instance, the HASP operates identically to the above-described ASP. However, in a multilevel access example, two or more address frames (SD..DS) are transmitted between the first and second I signals of the select and acknowledge protocol.

Figure 33:
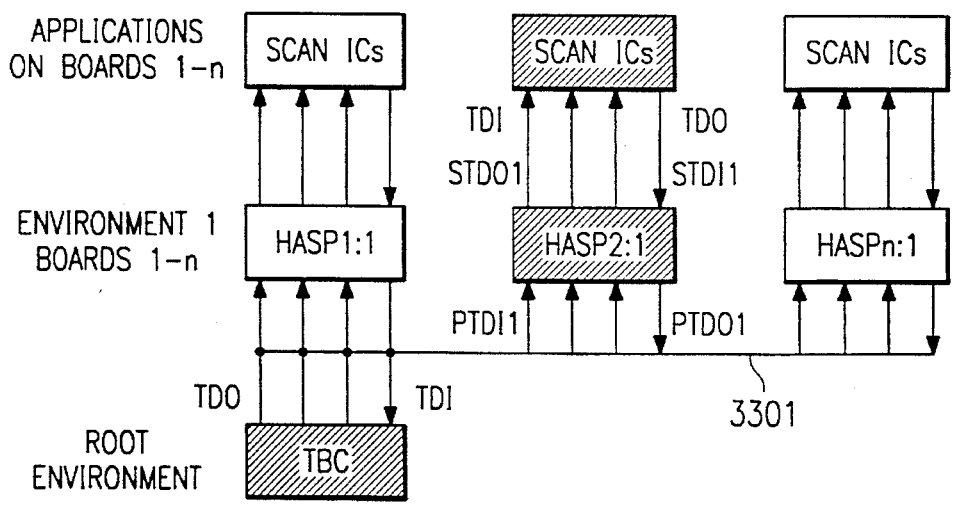
FIG. 33 illustrates the use of hierarchical addressable shadow ports in a single level test configuration.
Figure 35:
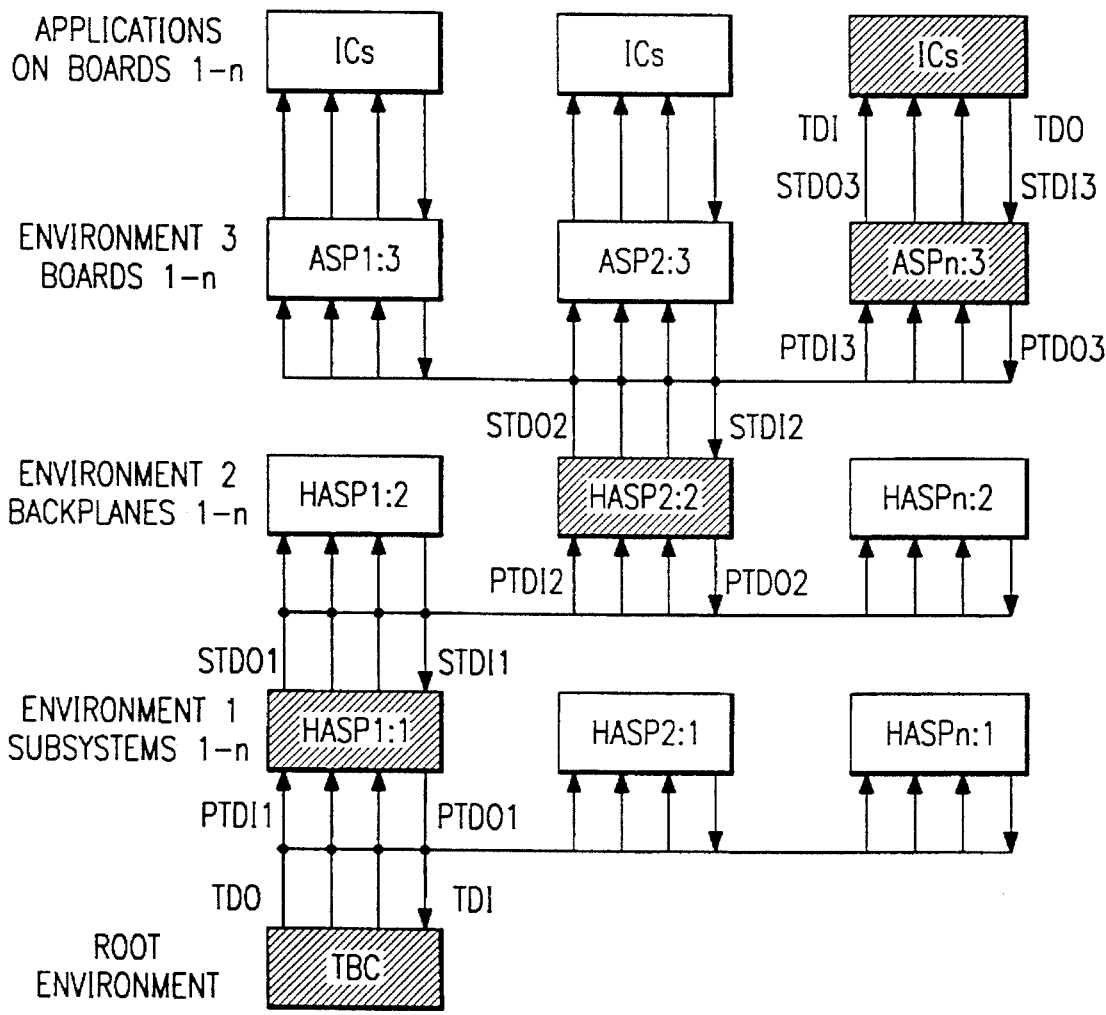
FIG. 35 illustrates the use of hierarchical addressable shadow ports in a three level test configuration.

The following examples illustrate how a TBC can use the shadow protocol and HASP circuits to hierarchically access 1149.1 applications in systems having from one to "m" environment levels. In FIGS. 33–35, analogies are made between the way this approach hierarchically links to 1149.1 applications through multiple system environments, and the way an operating system hierarchically links to files through multiple directories within a memory. In FIGS. 33–35, "Sys"=system, "Sub"=subsystem, Bpn"=backplane, "Brd"= board, "App"=application, "Evn"=environment, and "Dir"= directory.

In FIG. 33, a TBC is connected to board level HASPs (1-n) via a backplane 1149.1 test bus 3301. Each board level HASP is further connected to ICs on the board (application) via the board's 1149.1 test bus. The naming convention given to the HASPs in FIGS. 33–35 is "HASPn:m", where "n" indicates the HASP's address and "m" indicates the environment level .the HASP resides on. The symbol "n" in FIGS. 33–35 is used in the sense of n=1,2,3, etc., and is not to be confused with the use of "n" hereinabove to represent a dummy address. In FIG. 33, the m=1 environment is the board level. The HASPs are connected to the TBC via their primary port connections (PTDI,PTMS,PTCK,PTDO) and to the application via their secondary port connections (STDI,STMS,STCK,STDO). The environment level number of the HASPs is included in the primary and secondary port signal names, i.e. PTDI1, PTDO1, STDO1, and STDI1. This HASP and port signal naming convention is followed hereinafter. For clarity, only the TDO/PTDO/STDO and TDI/PTDI/STDI signal names are shown on the 4-wire 1149.1 bus connection.

Before an application on one of the boards (1-n) can be serially accessed by the TBC, a connection must be made between the backplane root environment and the board level environment 1. To connect an application from environment 1, the TBC outputs a select protocol from its TDO output to the PTDI1 input of all HASPs on environment 1. In FIG. 33, the address sent in the select protocol is address 2 (A2). In response to receiving the select protocol with an address of 2, HASP2:1 outputs an acknowledge protocol containing its address (A2) from its PTDO1 output to the TBC's TDI input, then connects the application up to the TBC. This single level connection process is identical to the one described above with respect to the ASPs, since the connection involves only a single level connection, i.e. board level to backplane level.

In the two level example of FIG. 34, a TBC in the root environment is connected to backplane level HASPs (1-n) in environment level 1 via an 1149.1 test bus 3401. Each of the backplane level HASPs (1-n) is further connected to board level ASPs (1-n) via a backplane level 1149.1 test bus 3403, only one of which is shown for clarity. Each board level ASP is further connected to an application via the board's 1149.1 test bus. While connections are only shown between the ASPs and HASPs where the described connection is to be made, all HASPs are similarly connected to higher level environments or applications.

Before an application on one of the boards (1-n) in FIG. 34 can be serially accessed by the TBC, a hierarchical connection must be made between: the TBC in the root environment; the backplane level environment 1; and the board level environment 2. With regard to the aforementioned naming convention for the HASPs, the m=1 environment in FIG. 34 is the backplane level, and the m=2 environment in FIG. 34 is the board level. To connect the TBC to the application at board 2 of backplane 1 via ASP2:2 and HASP1:1, the TBC outputs a two level select protocol.

The two level select protocol differs from the single level select protocol of FIG. 32 in that two address frames are transmitted between the first and second I signals. The first address (A1) selects HASP1:1 and the second address (A2) selects ASP2:2. The hierarchical select protocol output from the TBC terminates when a second I signal is transmitted, just as in the single level select protocol of FIG. 32.

After HASP1:1 has received its address frame (SA1S), it looks to see what signal follows the address frame. If an I signal were to follow the first address frame, HASP1:1 would recognize the protocol as a single level type and would start its acknowledge protocol. However, since an S signal follows the first address frame, HASP1:1 recognizes that the select protocol is hierarchical and that a new address frame is being transmitted. After HASP1:1 recognizes that the select protocol is hierarchical, it does not respond to any of the additional address frames it receives, thus it cannot be deselected by subsequent address frames transmitted within the current hierarchical select protocol. Also when a selected HASP recognizes that a select protocol is hierarchical, it sets an internal flag which modifies the way it operates during the hierarchical acknowledge protocol.

In response to the start of the second address frame (SA2S) from the TBC, HASP1:1 enables its STDO1 output to output a select protocol to relay the second address frame to the ASPs of board level environment 2. HASP1:1 generates the select protocol by framing the second address (SA2S) between first and second I signals. There is one bit-pair signal latency between the end of the first address frame from the TBC (SA1S) and the start of the relayed second address frame from HASP1:1 (SA2S). This latency is caused by the decision step that HASP1:1 performs to determine what signal (S or I) follows the first address frame (SA1S). A latency of one bit-pair signal will be introduced for each additional environment level accessed by a hierarchical select protocol.

When the TBC completes the transmission of the hierarchical select protocol, it outputs T signals (or logic 1's) on its TDO output and monitors its TDI input for the start of an acknowledge protocol from the PTDO1 output of HASP1:1. Likewise, when HASP1:1 has completed relaying the hierarchical select protocol from the TBC to ASP2:2, it outputs T signals on its STDO1 output and monitorsits STDI1 input for the start of an acknowledge protocol from the PTD02 output of ASP2:2.

After ASP2:2 has received its address frame (SA2S) in the select protocol transmission from HASP1:1, it starts an acknowledge protocol output to HASP1:1. After transmitting a first I signal to initiate the acknowledge protocol, ASP2:2 outputs its address frame sequence (SA2S) from its PTD02 output to the STDI1 input of HASP1:1. In response to the first S signal of the address frame input from ASP2:2, HASP1:1 enables its PTDO1 output and starts relaying the acknowledge protocol from ASP2:2 to the TBC's TDI input by outputting a first I signal. After ASP2:2 has transmitted its address frame to the STDI1 input of HASP1:1, it terminates its acknowledge protocol by outputting a second I signal, then connects the 1149.1 test bus 3403 from backplane level environment 1 to the application on board 2 of board level environment 2.

In response to the second I signal input from ASP2:2, HASP1:1 continues the acknowledge protocol sequence by inserting and outputting its own address frame (SA1S) to the TDI input of the TBC. After HASP1:1 has transmitted its address frame to TBC, it terminates the hierarchical acknowledge protocol by outputting a second I signal, then connects the 1149.1 test bus 3401 to the backplane level 1149.1 test bus 3403. After the TBC receives the second I signal it determines that the hierarchical acknowledge protocol transmission has been completed and examines the addresses received to confirm the correct hierarchical connection has been made.

It can be seen from the foregoing that the hierarchical acknowledge protocol scheme is independent of the number of environment levels being accessed.

In the three level example of FIG. 35, a TBC in the root environment is connected to subsystem level HASPs (1-n) in environment 1. The subsystem level HASPs (1-n) are connected to backplane level HASPs (1-n) in environment 2. The backplane level HASPs (1-n) are connected to board level ASPs (1-n) in environment 3. Each ASP (1-n) in environment 3 is connected to an application on a board. Thus, in FIG. 35, the m=1 environment is the subsystem level, the m=2 environment is the backplane level, and the m=3 environment is the board level. While connections are only shown between the ASPs and HASPs where the described connection is to be made, all HASPs are similarly connected to higher level environments.

Before an application can be accessed by the TSC, a hierarchical connection must be made between: the root environment; the subsystem level environment 1; the backplane level environment 2; and the board level environment 3. To connect the TBC to the application at board "n" of backplane 2 of subsystem 1 via ASPn:3, HASP2:2 and HASP1:1, the TBC outputs a hierarchical select protocol to make a connection between the different environment levels. The first framed address (A1) in the hierarchical select protocol selects HASP1:1 in subsystem environment 1. The second framed address (A2) selects HASP2:2 in the backplane environment 2. The third framed address (An) selects ASPn:3 of board "n" in environment 3. The hierarchical select protocol output from the TBC terminates when the second I signal is transmitted.

After ASPn:3 receives its address frame (SANS) from the select protocol output from HASP2:2, it transmits an acknowledge protocol back to HASP2:2. In response to receiving the acknowledge protocol from ASPn:3, HASP2:2 transmits an acknowledge protocol to HASP1:1 which includes the address frame sent from ASPn:3 (SANS) followed by its own address frame (SA2S). In response to receiving the acknowledge protocol from HASP2:2, HASP1:1 transmits an acknowledge protocol to the TBC which includes the address frames sent from ASPn:3 (SANS) and HASP2:2 (SA2S), followed by its own address frame (SA1S).

After each ASP and HASP completes its acknowledge protocol transmission, it connects its primary and secondary ports to make a hierarchical connection between the TBC and application. When the TBC receives the complete hierarchical acknowledge protocol output from HASP1:1, it verifies that the correct hierarchical connection was made. After the verification process, the TBC can access the 1149.1 application at board "n" of backplane 2 of subsystem 1, via HASP1:1, HASP2:2, and ASPn:3.

The hierarchical approach described above can be used to access any environment level m within a system by simply increasing the number of address frames transmitted in the hierarchical select protocol. This approach can thus hierarchically connect a TBC to an application on any environment level, providing a method of accessing 1149.1 applications in any type of system.

For example, the hierarchical select and acknowledge protocols of FIG. 36 illustrate connecting an application in environment level "m" to a TBC in the root environment (RE) via intermediate environment levels E1, E2, E3 . . . Em-2, and Em-1. Each address frame in the hierarchical select and acknowledge protocols is indicated by the sequence "Sn:mS", where "n" is the address and "m" is the environment level the address is sent to or received from. In FIGS. 36–37, the symbol "n" is once again used in the sense of n=1,2,3 etc., and is not to be confused with the use of "n" hereinabove to represent a dummy address.

Each time a new shadow protocol is executed, a connection is made to a new application, and the connection to the previous application is broken. When the connection is broken to the previous application, the application is left in RT/IDLE, TLRST, or one of the PAUSE states, as determined by the state of the 1149.1 test bus when the shadow protocol was executed.

In the RT/IDLE test bus state, the test application is in an "active" state, i.e. the application may be running a self test while in RT/IDLE. In the TLRST test bus state, the test application is in a "inactive" state, i.e. the TLRST state forces a test reset on the application. In the PAUSE-IR(DR) states, the application is also inactive, but has merely paused, and is not reset.

The ability to disconnect from and leave an application in either an "active" or "inactive" mode permits, for example, opening multiple test applications, setting up each application to execute a test operation, and then closing the applications in an active mode to enable them to operate as background tasks while the TBC accesses other applications in the foreground. A software analogy to this test scenario would be enabling multiple software applications to execute as background tasks while a foreground task is running.

To provide an efficient method of disconnecting and resetting applications into their 1149.1 TLRST state, global and local disconnect operations have been defined. The TBC can globally disconnect and reset any previously connected ASPs and HASPs, and force associated applications into the TLRST state, by issuing a hierarchical select protocol consisting of multiple reset address frames. A reset address frame contains an address that all ASPs and HASPs can identify as an address reserved for reset operation only.

Alternately, local disconnection and resetting of only the ASPs, HASPs and associated applications existing in or above a selected environment level is also possible using the hierarchical select protocol. If local disconnection and resetting is desired, the TBC outputs actual address frames prior to outputting the reset address frame(s), to direct the disconnect and reset action to only the ASPs, HASPs and applications in or above a particular environment level.

Examples of global and local disconnection and resetting in a system containing "m" environment levels are shown in FIG. 37. The "r" in the address frames 1 through m indicates the reset address. The "n" in the address frames 1 through m indicates an actual ASP or HASP address. All HASPs in each intermediate environment level (1 through m-1) between the root environment (RE) and environment "m" wait to respond to the reset address "r" until after the hierarchical select protocol terminates, so that all relayed reset addresses can be transmitted to the highest environment level. HASPs on the environment level(s) receiving a reset address do not execute an acknowledge protocol. However, HASPs that receive an actual address do respond with an acknowledge protocol.

While FIG. 37 illustrates reset address frames "r" being globally and locally transmitted to connections and applications, DISA and STSA address frames can be globally or locally transmitted as well. DISA address frames are transmitted in place of the "r" addresses in the hierarchical select protocols to disconnect connections and applications. STSA frames are transmitted in place of the "r" addresses in the hierarchical select protocols to synchronize selected connections and application groups to the TBC's TMS output. As with the reset address frame, HASPs and ASPs receiving DISA or STSA address frames do not execute an acknowledge protocol.

In the example of FIG. 38, a connection between a TBC and two HASPs and an ASP is shown. The TBC of the root environment is connected to HASP1 of subsystem environment 1, HASP1/E1. HASP1/E1 is connected to HASP1 of backplane environment 2, HASP1/E2. HASP1/E2 is connected to ASP1 of board environment 3, ASP1/E3. ASF1/E3 is connected to the application on board 1 (ICs).

The TBC has a transmitter circuit (XMT) to output the select protocol to HASP1/E1 from TDO to PTDI1, a receiver circuit (RCR) to receive the acknowledge protocol from the HASP1/E1 from PTDO1 to TDI, and a controller (CTL) to regulate the operation of the transmitter and receiver circuits. When the TBC's transmitter circuit is not being used to output the select protocol, it can be used to output serial data to the ICs of board 1 during 1149.1 scan operations, via HASP1/E1, HASP1/E2, and ASP1/E3. Likewise, when the TBC's receiver circuit is not being used to receive the acknowledge protocol, it can be used to receive serial data from the ICs of board 1 during 1149.1 scan operations, via HASP1/E1, HASP1/E2, and ASP1/E3.

The ASPs and HASPs have a receiver circuit (RCR) to receive the select protocol, a transmitter circuit (XMT) to output the acknowledge protocol, and a controller (CTL) to regulate the operation of their transmitter and receiver circuits. If the receiver and transmitter circuits are not being used to communicate the select and acknowledge protocols, and if the ASPs and HASPs are selected, serial data may be transferred from PTDI to STDO and from STDI to PTDO during 1149.1 scan operations. Also if the ASPs and HASPs are selected, and select and acknowledge protocols are not being performed, serial control may be transferred from PTMS to STMS during 1149.1 scan operations.

When scan access of the ICs of board 1 is required, the TBC's controller causes the TBC's transmitter to output a hierarchical select protocol from the TBC's TDO output to the PTDI1 input of HASP1/EI's receiver. In response to the select protocol, HASP1/EI's receiver strips off its address frame and transmits the remaining portion of the select protocol from its STDO1 output to the PTDI2 input of the HASP1/E2's receiver. In response to the select protocol, HASP1/E2's receiver strips off its address frame and transmits the remaining portion of the select protocol from its STD02 output to the PTDI3 input of the ASP1/E3's receiver. After the select protocol terminates, the controller of ASP1/E3 causes the transmitter circuit of ASP1/E3 to output a hierarchical acknowledge protocol, containing its address frame, from ASP1/E3's PTDO3 output to the STDI2 input of HASP1/E2's transmitter. In response to the acknowledge protocol from ASP1/E3, HASP1/E2 relays the hierarchical acknowledge protocol on to the STDI1 input of HASP1/E1, inserting its own address frame into the acknowledge protocol before terminating the acknowledge protocol. In response to the acknowledge protocol from HASP1/E2, HASP1/E1 relays the hierarchical acknowledge protocol on to the TDI input of TBC, inserting its own address frame into the acknowledge protocol before terminating the acknowledge protocol. After each HASP and ASP completes its acknowledge protocol, it connects its primary and secondary ports together. After receiving and verifying the hierarchical acknowledge protocol, the TBC's control circuit enables its transmitter and receiver circuits to perform 1149.1 scan operations to serially access the ICs of board 1 via the connections made through HASP1/E1, HASP1/E2, and ASP1/E3.

In the ASP, a simple electronic switch is used to connect the primary and secondary port signals (see FIGS. 28 and 30), since only a single environment level connection is made. However, since any number of environment levels may be connected using HASPs, it is important to provide a method of synchronizing the signal transfer between the primary and secondary HASP ports using clocked storage elements such as the D-flip flops (DFFs) shown in FIG. 39.

Figure 39:
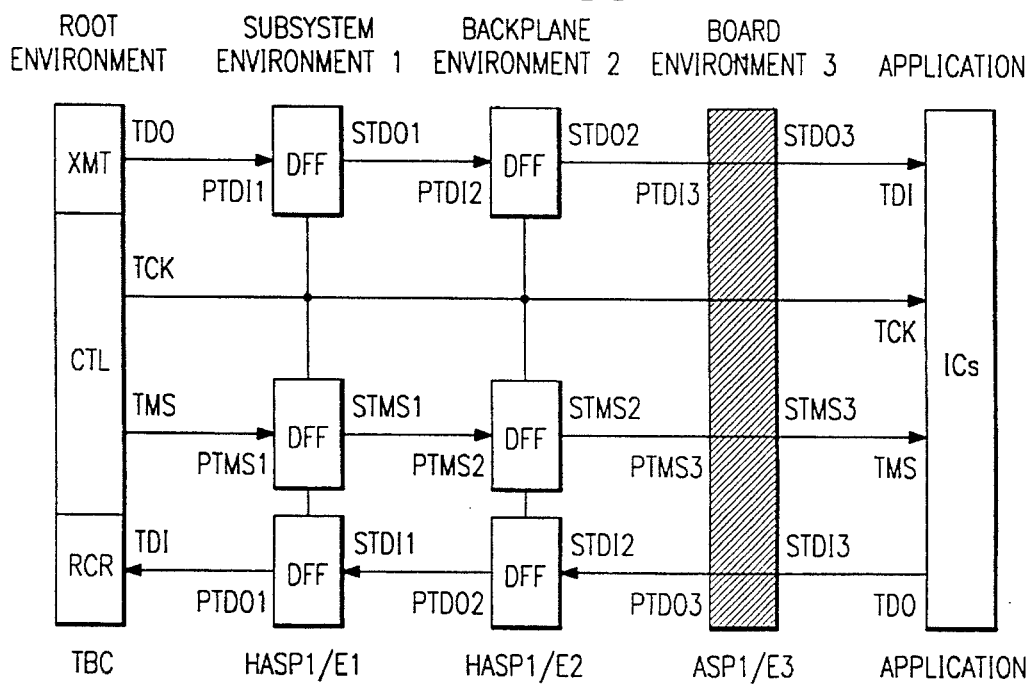
FIG. 39 illustrates signal transfer synchronization between primary and secondary ports of a hierarchical addressable shadow port.

If the primary and secondary bus signal connections of the HASP were made by simple electronic switches, as in the ASP, the accumulation of delays through the switches of multiple HASPs in a hierarchical connection would limit the number of environment levels that could be serially accessed. However, with the primary and secondary connections of the HASP synchronized through DFFs as shown in FIG. 39, the delays do not accumulate as more HASPs are included in the hierarchical connection. Thus no limitations exist on the number of environment levels that can be hierarchically connected using the HASP.

FIG. 39 illustrates the synchronous connection made in the HASPs of FIG. 38 between the TBC and ASP of the selected application, following a select and acknowledge protocol. In FIG. 39, the HASPs connect PTDI to STDO, PTMS to STMS, and STDI to PTDO through DFFs, and the TCK passes straight through the HASP via the PTCK and STCK signal connections of FIG. 38. The DFFs are all synchronously clocked by the TCK. As mentioned above, the ASP makes a direct connection between its PTDI/STDO, PTMS/STMS, STDI/PTDO, and PTCK/STCK port connections. Since the HASPs use a synchronized connection method, any number of HASPs may be placed between a TBC and an ASP connected to a target application to achieve access to any hierarchical environment level within a system.

Figure 40:
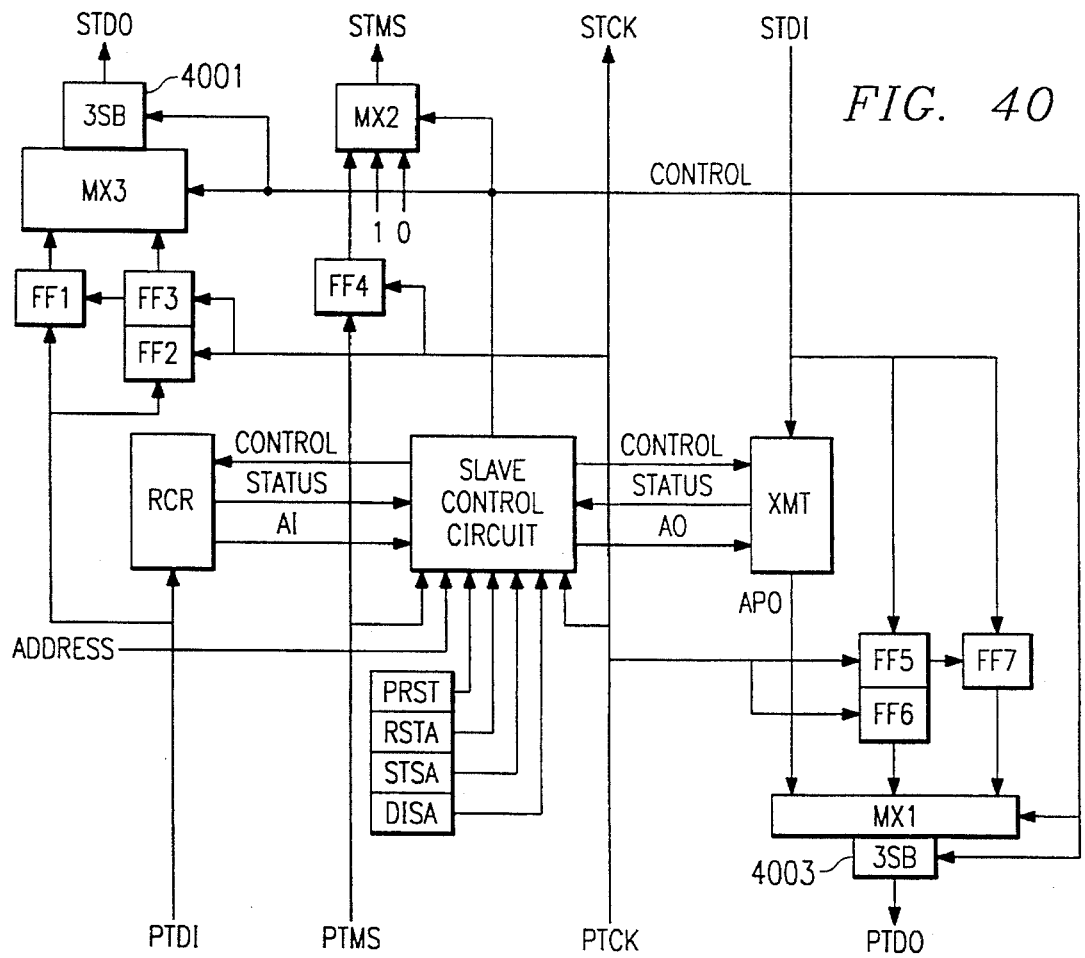
FIG. 40 is a circuit diagram of an embodiment of the hierarchical addressable shadow port of FIGS. 24 and 33–35.

A circuit implementation of the HASP is shown in FIG. 40. The HASP has inputs and outputs for; the primary 1149.1 serial bus signals (PTDI, PTMS, PTCK, PTDO), the secondary 1149.1 serial bus signals (STDO, STMS, STCK, STDO), and inputs for the HASP address. The HASP includes a receiver (RCR), a transmitter (XMT), a slave control circuit, multiplexers MX1, MX2 and MX3, flip flops FF1–FF7, a power up reset circuit (PRST), and address codes for detecting a reset address (RSTA), a disconnect address (DISA), and a self test start address (STSA). The RSTA has been referred to previously as an address of all 0's or as the least significant address. The STSA has been referred to previously as an address of all 1's, "n", or the most significant address. Each HASP specifically recognizes the DISA address as a disconnect address, analogously to the above-described specific recognition of the DISA by the ASP.

The receiver circuit includes a controller for regulating the hierarchical select protocol input from the TBC, and a serial input/parallel output (SIPO) register for receiving the serial address from the TBC and outputting the address in parallel to the slave control circuit. The PTDI signal is input to the SIPO register to supply the serial address during select protocols, and is input to the controller for regulating the operation of the receiver during select protocols. The parallel address output from the SIPO is input to the slave control circuit via the address input (AI) bus. The status output from the receiver's controller is input to the slave controller circuit to indicate when a select protocol has started, when the address is ready to read, if the select protocol is hierarchical or non-hierarchical, and when the select protocol has completed.

The receiver's controller determines when a first "I then S then D" signal sequence occurs on PTDI, indicating the start of a select protocol and the start of the first address frame input. In response to this input sequence, the controller enables the SIPO to receive the serial address input on PTDI. The controller determines when a first "D then S" signal sequence occurs on PTDI, indicating the end of the first address frame. In response to this input sequence, the controller sends status to the slave control circuit to enable the address frame in the SIPO to be parallel input to the slave control circuit via the AI bus. If the select protocol is not hierarchical, an I signal will follow the "D then S" signal sequence to terminate the select protocol. If the select protocol is hierarchical, another S signal will follow the "D then S" signal sequence to start the transmission of the next address frame.

The receiver circuit receives the PTDI input and control input from the slave control circuit. The receiver outputs address and status information to the slave control circuit. The PTDI input is coupled to the STDO output via flip flops FF1–FF3, multiplexer MX3, and the 3-state output buffer (3SB) 4001. Selection control for MX3 and enable control for the 3SB 4001 come from the slave control circuit. During hierarchical select protocols and 1149.1 scan operations, the 3SB 4001 is enabled to output data. When disabled, the STDO output from the 3SB 4001 is pulled up to a logic 1 level by a pull-up resistor. The status output from the receiver circuit indicates to the slave control circuit when a select protocol has been started, when the first address frame is ready to read, if the select protocol is hierarchical (HSP flag set) or non-hierarchical (HSP flag reset), and when the select protocol is completed. The control input to the receiver from the slave control circuit enables the receiver for select protocol operations.

During hierarchical select protocols, MX3 selects the PTDI input that passes through flip flops FF2 and FF3. FFs 2 and 3 are clocked by PTCK and provide storage for the S, D, and I signal bit pairs that are relayed from the PTDI input to STDO output during hierarchical select protocols. During hierarchical select protocols, FFs 2 and 3 provide storage for the first S signal of the second and subsequent address frames received at the PTDI input, which indicates the start or continuation of a hierarchical select protocol. When the first S signal of the second address frame is received, the receiver verifies the occurrence of the S signal, and informs the slave control circuit, via the status line, that the select protocol is hierarchical. The slave control circuit then outputs control to select the output from FF3 to MX3 and enables the 3SB. FF2 and FF3 provide storage of the S signal, making it available for output on the STDO output.

FF2 and FF3 also provide a time delay for the receiver to receive and respond to the S, D, or I signal following the second S signal of each frame received at the PTDI input during a hierarchical select protocol. If an S signal follows the second S signal, one of more additional address frames are to be relayed through the HASP during the hierarchical select protocol. If an I signal follows the second S signal, the hierarchical select protocol is complete and no additional address frames are to be relayed through the HASP. Thus the time delay provided by FFs 2 and 3 provides time for the receiver to evaluate the signal following the second S signal to determine what action is to be taken.

After the last address frame of a hierarchical select protocol has been relayed from the PTDI input to the STDO output, via FFs 2 and 3, the hierarchical select protocol is terminated by the transmission of a second I signal. During 1149.1 scan operations, MX3 selects the PTDI input that passes through FF1. FF1 is clocked by PTCK and provides the synchronization required for hierarchical scan access. FF1 thus represents one of the DFFs shown in FIG. 39.

The transmitter circuit includes a controller for regulating the acknowledge protocol output from the ASP, and a parallel input/serial output (PISO) register for receiving the parallel ASP address from the slave control circuit and outputting the address serially to the TBC. The PISO register receives parallel data from the slave control circuit via the address output (AO) bus, and outputs the address serially to MX1 via the acknowledge protocol output (APO) signal. The controller receives control input from the slave control circuit via the control bus and the STDI input. The controller outputs status to the slave control circuit via the status bus. Control input on the control bus regulates the parallel to serial conversion process that takes place during the acknowledge protocol. The status output from the transmitter's controller informs the slave control circuit of the transmitters status during the acknowledge protocol, i.e. whether the acknowledge protocol is in progress or is completed.

MX1 receives selection control input from the slave control circuit and the STDI and APO signals, and outputs the selected input (STDI or APO) to the PTDO output, via a 3-state output buffer (3SB) 4003. MX1 has three inputs, one for receiving the APO signal, one for receiving the STDI after it passes through FF5 and FF6, and one for receiving the STDI signal after it passes through FF7. The 3SB 4003 is enabled or disabled (tristated) by control input from the slave control circuit. During acknowledge protocols and 1149.1 scan operations the 3SB 4003 is enabled to output data. When disabled, the PTDO output from the 3SB 4003 is pulled up to a logic 1 level by a pull-up resistor.

During hierarchical acknowledge protocols, MX1 selects the STDI input that passes through FF5 and FF6. FF5 and FF6 are clocked by the PTCK and provide storage for the S and D signal bit pairs that are relayed from the STDI input to the PTD0 output during hierarchical acknowledge protocols. During hierarchical acknowledge protocols, FF5 and FF6 provide storage for the first S signal received at the STDI input which indicates the start of a hierarchical acknowledge protocol. When the first S signal is received, the transmitter verifies the occurrence of the S signal, and informs the slave control circuit via the status line. The slave control circuit then outputs control to select the output from FF6 to MX1 and enables the 3SB 4003. FF5 and FF6 provide storage of the S signal, making it available for output on the PTDO output.

FF5 and FF6 also provide a time delay for the transmitter to receive and respond to the S, D, or I signal following the second S signal of each address frame received at the STDI input during the hierarchical acknowledge protocol transmission. If an S signal follows the second S signal, the transmitter's controller knows that another address frame is being received and allows the S signal and associated address frame to be output on PTDO via MX1 and FF5 and FF6. If an I signal follows the second S signal, the transmitter's controller knows that the transmission of the upper hierarchical acknowledge protocol has been completed.

In response to a second I signal input on STDI (indicating the end of the upper hierarchical acknowledge protocol), the transmitter's controller sends status to the slave control circuit to cause MX1 to select the APO output from the transmitter's PISO register. This action allows the transmitter to insert the HASP's address frame in the hierarchical acknowledge protocol being sent to the TBC, then terminate the acknowledge protocol by outputting a second I signal on PTDO. Thus the time delay provided by FFs 5 and 6 provides time for the transmitter to evaluate the signal received on STDI following the second S signal of each received frame to determine what action is to be taken. Without FFs 5 and 6, the transmitter would not have time to respond to the second I signal on the STDI input and switch MX1 to insert and output the HASP's address frame before terminating the hierarchical acknowledge protocol.

During 1149.1 scan operations, MX1 selects the STDI input that passes through FF7. FF7 is clocked by PTCK and provides the synchronization required for hierarchical scan access. FF7 thus represents one of the DFFs shown in FIG. 39. The status output from the transmitter circuit indicates to the slave control circuit when a hierarchical acknowledge protocol has been started, and when the last hierarchical address frame has been relayed. The control input to the transmitter from the slave control circuit enables the transmitter for acknowledge operations and inputs the hierarchical select protocol (HSP) indicator flag to indicate whether the acknowledge protocol is a hierarchical or non-hierarchical type.

The slave control circuit is a controller that regulates the operation of the HASP transmitter circuit, receiver circuit, and multiplexers in response to an address input during a select protocol. The slave control circuit receives the PTMS and PTCK signals from the primary port, the address output (AO) and status buses from the receiver, the status bus from transmitter, the external HASP address, a reset signal from the power up reset circuit (PRST), and address inputs; RSTA, DISA, and STSA. The slave control circuit outputs control to the receiver circuit, transmitter circuit, 3SBs, and multiplexers 1–3.

The slave control circuit is clocked by the PTCK input from the primary port. The PTMS input from the primary port indicates to the slave control circuit when the 1149.1 bus is busy (scanning), idle (RT/IDLE, PAUSE-IR or PAUSE-DR), or reset (TLRST). The status inputs from the receiver and transmitter circuits inform the slave control circuit of the receiver and transmitter circuit status. The AI bus from the receiver is used to input the address received during a select protocol to the slave control circuit. The reset input from the PRST circuit resets the slave control circuit at power-up. The RSTA, DISA, and STSA inputs are used to match against the address frame(s) received during a select protocol. The control output from the slave control circuit controls the operation of the receiver, transmitter, and MX1, MX2, and MX3. The AO bus output from the slave control circuit is used to input the ASP's parallel address to the transmitter during acknowledge protocols.

During select protocols, the slave control circuit receives parallel address input from the receiver via the AI bus. The status bus input from the receiver informs the slave control circuit when a select protocol has been started, when the address input is ready to be read, if the select protocol is hierarchical or not, and when the select protocol is completed. From the address input, the slave control circuit determines what action is to be taken in response to the select protocol.

After a select protocol and in response to a match between the first address frame and RSTA, a signal is generated which disconnects the primary and secondary ports and forces a logic 1 output on STMS. After a select protocol and in response to a match between the first address frame and STSA, a signal is generated which makes a connection between the PTMS and STMS signals, if the HASP is in the PAUSE-IR or PAUSE-DR state, to allow the HASP to transition with the TBC to the RT/IDLE state to start a test operation as previously described. After a select protocol and in response to a match between the first address frame and DISA or if the first address frame does not match any of the addresses, a signal is generated which disconnects the primary and secondary ports, but maintains state retention on STMS.

If the select protocol is hierarchical and the first address frame matches the HASP address and at least one address frame other than the RSTA, DISA, or STSA is relayed to the next higher environment level, a signal is generated to cause the HASP to delay starting its acknowledge protocol until it receives an acknowledge protocol from the next higher level HASP or ASP.

If the select protocol is hierarchical and the first address frame matches the HASP address and only RSTA, DISA, or STSA address frames are relayed to the next higher environment level, a signal is generated to cause the HASP to start its acknowledge protocol immediately following the end of the hierarchical select protocol. This action is required since no higher level acknowledge protocols will be generated in response to relaying only RSTA, DISA, or STSA address frames. Without this immediate acknowledge protocol start signal, the HASP would wait for the start of an upper level acknowledge protocol, which would never arrive, and eventually time out into an idle state.

If a connected HASP is in the 1149.1 TLRST state, the STMS output logic state will be equal to the PTMS input logic state (i.e. a logic 1) via FF4 and MX2. If a disconnect occurs during the TLRST state, the STMS will continue to output a logic 1, by control of MX2, to maintain the TLRST state to HASPs or ASPs connected to the HASP's secondary port after the disconnect occurs. This state retention on disconnect feature is also how ASPs maintain their 1149.1 TLRST state to applications connected to their secondary ports. Referring again to FF4, it should be noted that FF4 represents one of the DFFs shown in FIG. 39.

If a connected HASP is an 1149.1 RT/IDLE, PAUSE-IR, or PAUSE-DR state, the STMS output logic state will be equal to the PTMS input logic state (i.e. a logic 0) via FF4 and MX2. If a disconnect occurs during one of these states, the STMS will continue to output a logic 0, by control of MX2, to maintain the 1149.1 state to HASPs or ASPs connected to the HASP's secondary port after the disconnect occurs. This state retention on disconnect feature is how ASPs maintain their 1149.1 RT/IDLE, PAUSE-IR, and PAUSE-DR state to applications connected to their secondary ports.

When a new connection is to be made to a previously disconnected HASP, the TBC connected to the HASP's primary port needs to be in the same 1149.1 state the HASP was in when it was last disconnected. This allows the TBC, the connecting HASP, and all higher level HASPs, ASPs and applications to be synchronized to the same 1149.1 state after the new connection is made. If a HASP was last disconnected in the TLRST state, the TBC must be in the TLRST state before the new connection occurs. If a HASP was last disconnected in the RT/IDLE state, the TBC needs to be in the RT/IDLE state before the new connection occurs. If a HASP was last disconnected in the PAUSE-IR state, the TBC needs to be in the PAUSE-IR state before the new connection occurs. If a HASP was last disconnected in the PAUSE-DR state, the TBC needs to be in the PAUSE-DR state before the new connection occurs. This state synchronization on connection applies also in cases where a TBC is directly connected to ASPs as well.

Figure 41:
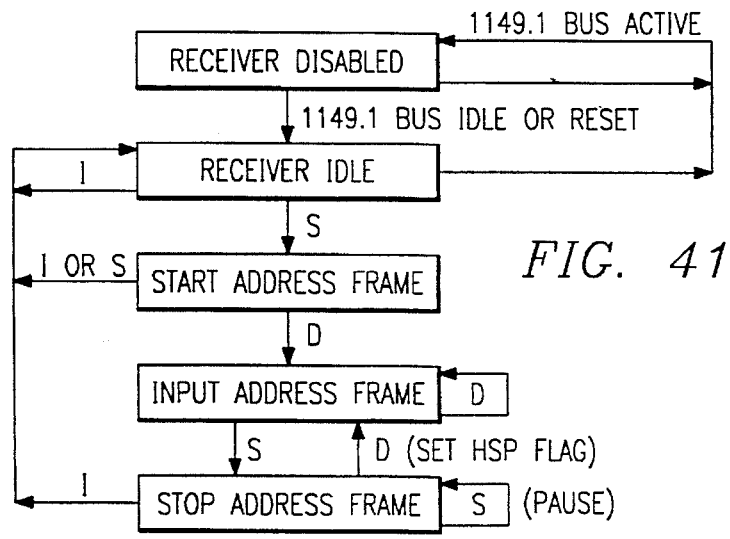
FIG. 41 is a state diagram of the receiver circuit of the hierarchical addressable shadow port of FIG. 40.

A state diagram of the operation of the HASP's receiver circuit is shown in FIG. 41. The HASP uses its receiver circuit to receive the hierarchical select protocol and to transfer serial data during 1149.1 serial bus operations. In the state diagram, the receiver circuit is forced into the "Receiver Disabled" state while the 1149.1 bus is active (scanning). This state insures that the receiver cannot be inadvertently enabled, while the 1149.1 bus is in operation, to receive a false input condition. When the 1149.1 bus is idle (RT/IDLE, PAUSE-IR, or PAUSE-DR) or reset (TLRST), the receiver circuit enters into the "Receiver Idle" state. If the 1149.1 bus becomes active again, the receiver circuit returns to the "Receiver Disabled" state. While in the "Receiver Idle" state, the receiver circuit polls for the occurrence of an I or S signal. In response to an I signal, the receiver remains in the "Receiver Idle" state. In response to an S signal, the receiver signals the occurrence of a first S signal to the slave control circuit, resets the hierarchical select (HSP) flag, and transitions into the "Start Address Frame" state to start the address frame input operation.

When transitioned into the "Start Address Frame" state, the receiver circuit polls for the occurrence of an I, S, or D signal. In response to an I or S signal input, the receiver circuit will transition from the "Start Address Frame" state back into the "Receiver Idle" state and signal the slave control circuit that a false first S signal had been received. In response to a D signal input, the receiver circuit transitions from the "Start Address Frame" state into the "Input Address Frame" state and starts receiving the first transmitted address frame. The receiver remains in the "Input Address Frame" state and continues receiving the address frame while D signals are being input. In response to a second S signal, the receiver circuit stops inputting the address frame, signals the occurrence of the second S signal to the HASP's slave control circuit, and transitions from the "Input Address Frame" state to the "Stop Address Frame" state.

When the HASP's slave control circuit receives the signal indicating the occurrence of the second S signal, it matches the received address frame against the expected HASP address, RSTA, DISA, and STSA. If the address frame matches any of these addresses, the HASP's slave control circuit enables the receiver circuit to output the remainder of the hierarchical select protocol on the STDO output. If the address frame does not match any of these addresses, the slave control circuit disconnects the HASP and disables the receiver circuit from outputting the remainder of the hierarchical select protocol on the STDO output.

One of the following scenarios occurs after the occurrence of the second S signal. (1) If the first address frame does not match any addresses and another S signal follows the second S signal input, the HASP's receiver transitions from the Stop Address Frame state to the Start Address Frame state to start another address frame input operation. This is just a dummy operation the receiver executes until the hierarchical select protocol is completed. (2) If the first address frame matches one of the addresses and another S signal follows the second S signal input, the HASP's receiver pauses in the "Stop Address Frame" until the first D signal is received, and then sets the HSP flag and transitions from the "Stop Address Frame" state to the "Input Address Frame" state to output the next address frame on the STDO output to the next higher environment level. (3) If an I signal follows the second S signal input, the HASP's receiver transitions from the Stop Address Frame state to the Receiver Idle state to terminate the hierarchical select protocol.

Figure 42:
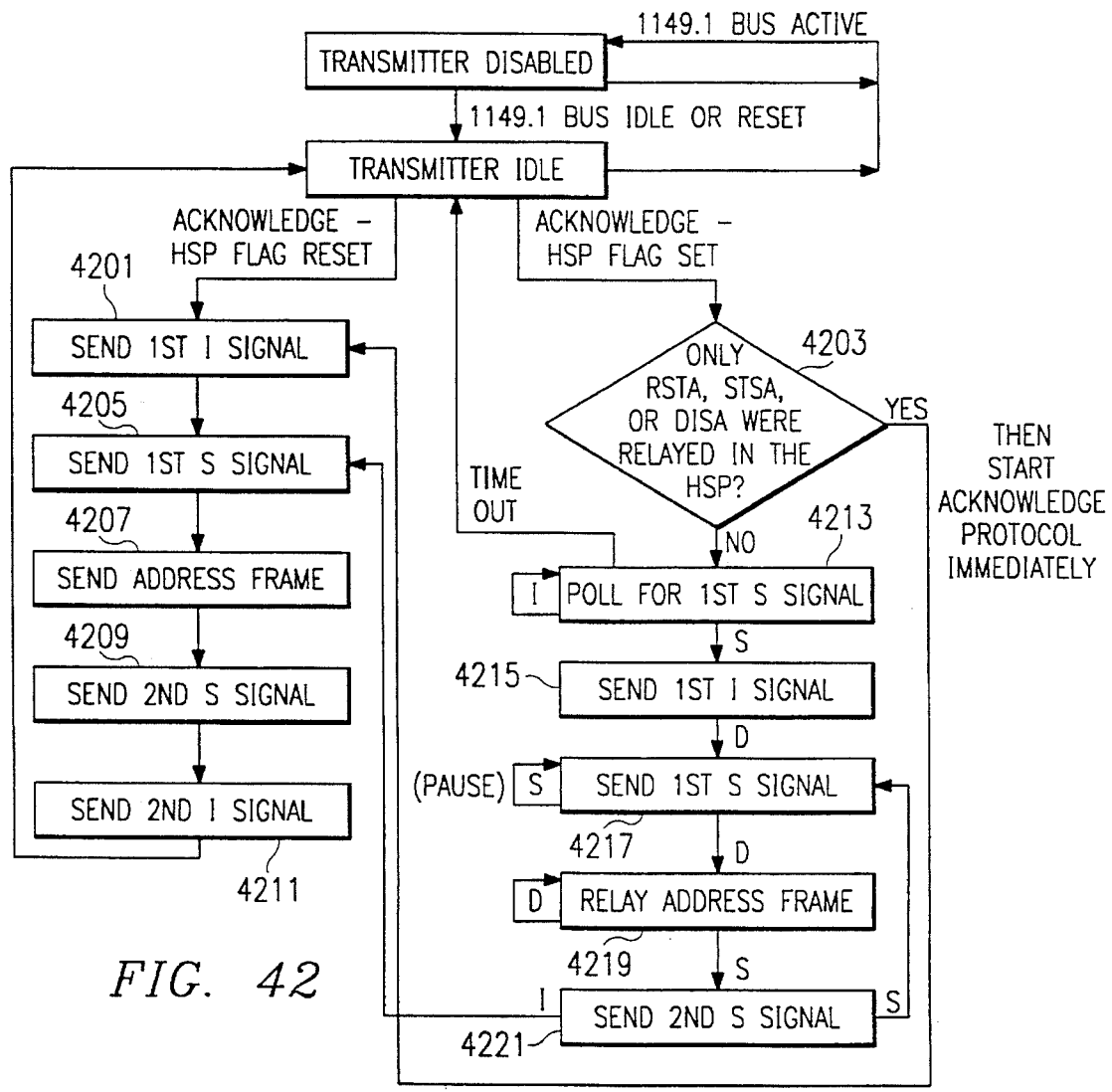
FIG. 42 is a state diagram of the transmitter circuit of the hierarchical addressable shadow port of FIG. 40.

A state diagram of the operation of the HASP's transmitter circuit is shown in FIG. 42. The HASP uses its transmitter circuit to transmit the hierarchical acknowledge protocol and to transfer serial data during 1149.1 serial bus operations. In the state diagram, the transmitter circuit is forced into the "Transmitter Disabled" state whenever the 1149.1 bus is active (scanning). This state insures that the transmitter cannot be inadvertently enabled, while the 1149.1 bus is in operation, to output the hierarchical select protocols. When the 1149.1 bus is idle (RT/IDLE, PAUSE-IR, or PAUSE-DR) or reset (TLRST), the transmitter circuit enters into the "Transmitter Idle state". In the "Transmitter Idle state" three scenarios can occur.

(1) If it is not necessary to output an acknowledge protocol, the transmitter circuit remains in the "Transmitter Idle" state until the 1149.1 bus becomes active again, in which case the transmitter circuit returns to the "Transmitter Disabled" state.

(2) If the previous select protocol was not hierarchical (HSP Flag is reset), the transmitter circuit enters the "Send 1st I Signal" state at 4201 to start the acknowledge protocol. If the previous select protocol was hierarchical (HSP Flag set) but the only address frame(s) relayed from the HASP during the hierarchical select protocol (HSP) were RSTA, DISA, or STSA address frames, the transmitter circuit transfers from the "Transmitter Idle" state to the "Only RSTA, STSA, or DISA were relayed in the HSP" state at 4203 to enter the "Send 1st I Signal" state at 4201 to output the first I signal to start the acknowledge protocol, then enters the "Send 1st S Signal" state at 4205 to output the first S signal to start the address frame, then enters the "Send Address Frame" state at 4207 to output a series of D signals indicating the HASP address, then enters the "Send 2nd S Signal" state at 4209 to output the second S signal to stop the address frame. The transmitter circuit transitions from the "Send 2nd S Signal" state at 4209 to the "Send 2nd I Signal" state at 4211 to stop the acknowledge protocol. From the "Send 2nd I Signal" state, the transmitter circuit returns to the "Transmitter Idle" state. The transmitter returns to the "Transmitter Disabled" state whenever the 1149.1 bus becomes active again.

(3) If the previous select protocol was hierarchical (HSP Flag is set) and at least one address frame other than RSTA, STSA, or DISA was relayed, the transmitter circuit transfers from the "Transmitter Idle" state to the "Only RSTA, STSA, or DISA were relayed in the HSP" state at 4203 to enter the "Poll For 1st S Signal" state at 4213 to monitor the STDI input for the start of an acknowledge protocol. The transmitter circuit remains in the "Poll For 1st S Signal" state while I signals are input on the STDI input. If a time out occurs, the transmitter will transition into the "Transmitter Idle state". If an S Signal is received on the STDI input, the transmitter circuit enters the "Send 1st I Signal" state at 4215 to output the first I signal on PTDO to start the acknowledge protocol, then enters the "Send 1st S Signal" state at 4217 to output the first S signal to start relaying the received address frame, then enters the "Relay Address Frame" state at 4219 to relay a series of D signals received on the STDI input to the PTDO output. When a 2nd S signal is received on the STDI input, the transmitter circuit enters the "Send 2nd S Signal" state at 4221 to output the second S signal on the PTDO output to stop relaying the address or message frame. One of the following scenarios occurs after the 2nd S signal has been received. (1) If the next signal received on the STDI input is an S signal, the first address frame has been relayed and another address frame is being received. To relay the next address frame, the transmitter re-enters the "Send 1st S Signal" state at 4217 to start relaying the next address frame. (2) If the next signal received on the STDI input is a 2nd I signal, the transmitter enters the "Send 1st S Signal" state at 4205 to output a 1st S Signal to start its own address frame, then enters the "Send Address Frame" state at 4207 to output its address frame, then enters the "Send 2nd S Signal" state at 4209 to output the second S signal to stop its address frame output. The transmitter transitions from the "Send 2nd S Signal" state at 4209 to the "Send 2nd I Signal" state at 4211 to stop the hierarchical acknowledge protocol. From the "Send 2nd I Signal" state at 4211, the transmitter circuit returns to the "Transmitter Idle" state. The transmitter returns to the "Transmitter Disabled" state whenever the 1149.1 bus becomes active again.

Figure 43:
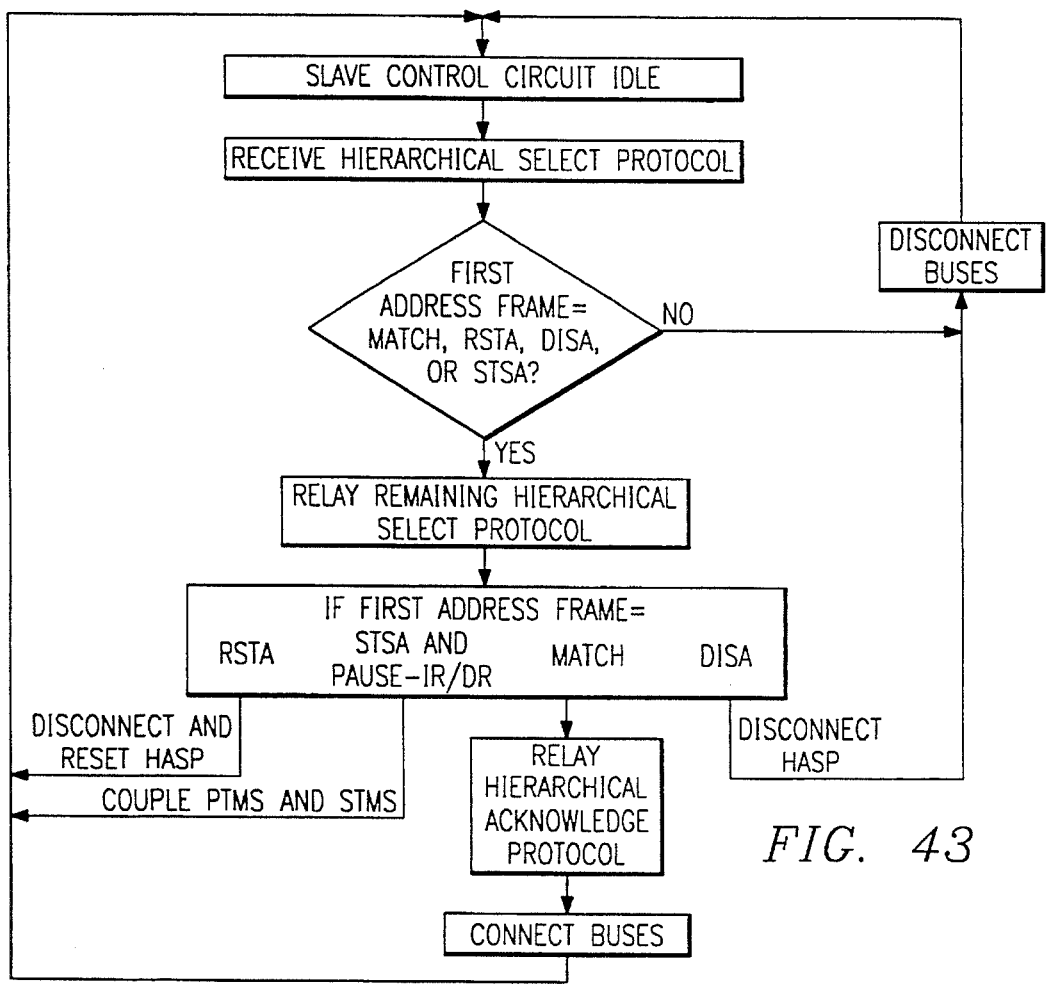
FIG. 43 is a state diagram of the slave control circuit of the hierarchical addressable shadow port of FIG. 40.

A state diagram of the operation of the HASP's slave control circuit is shown in FIG. 43. The slave control circuit regulates the operation of the HASP's transmitter and receiver circuits. The slave control circuit enables the HASP's transmitter and receiver circuits to communicate to the TBC using the hierarchical select and acknowledge protocols. After the HASP has been selected by the TBC, the slave control circuit enables the transmitter and receiver circuits to pass the serial data input and output through the HASP during 1149.1 scan operations.

In the state diagram, when no hierarchical select protocols are being sent from the TBC to the HASP, the slave control circuit is in the "Slave Control Circuit Idle" state. When the start of a hierarchical select protocol is received by the HASPs receiver circuit the slave control circuit transitions from the "Slave Control Circuit Idle" state into the "Receive Hierarchical Select Protocol" state. After the first address frame of the hierarchical select protocol has been received, the slave control circuit transitions from the "Receive Hierarchical Select Protocol" state into the "First Address Frame=Match, RSTA, DISA, or STSA ?" state. In this state the slave control circuit reads the first address frame from the receiver circuit and compares it against the HASP's address (match), the RSTA, the DISA, and the STSA. If a match is not found, the slave control circuit transitions from the "First Address Frame=Match, RSTA, DISA, or STSA ?" state into the "Disconnect Buses" state to disconnect the primary and secondary port signals. From the "Disconnect Buses" state the slave control circuit transitions into the "Slave Control Circuit Idle" state and waits for the start of another select protocol sequence.

If the received address matches the HASP address, the RSTA, the DISA, or the STSA, the slave control circuit transitions from the "First Address Frame=Match, RSTA, DISA, or STSA ?" state into the "Relay Remaining Hierarchical Select Protocol" state. In the "Relay Remaining Hierarchical Select Protocol" state, the slave control circuit enables the receiver circuit's STDO output to relay any additional address frames on up to higher level environments. When the hierarchical select protocol is completed, the slave control circuit transitions into the "If First Address=" state. In this state the slave control circuit looks at what the first address frame matched against.

If the RSTA matched, the slave control circuit disconnects the port signals, sets STMS to a logic one to force the connected HASPs/ASPs/applications in higher level environments into the 1149.1 TLRST state, resets the transmitter and receiver, then goes to the "Slave Control Circuit Idle" state. If the DISA matched, the slave control circuit disconnects the port signals, maintains state retention on the STMS signal, then goes to the "Slave Control Circuit Idle" state. If the STSA matched and the HASP is in the PAUSE-IR/DR state, the slave control circuit connects the PTMS and STMS signals, then goes to the "Slave Control Circuit Idle" state. If the HASP address matched, the slave control circuit transitions into the "Relay Hierarchical Acknowledge Protocol state". In the "Relay Hierarchical Acknowledge Protocol" state, the slave control circuit enables the transmitter circuit to transmit an acknowledge protocol to the TBC.

After the acknowledge protocol has been sent, the slave control circuit disables the HASP's transmitter and transitions from the "Relay Hierarchical Acknowledge Protocol" state to the Connect Buses state. In the "Connect Buses" state, the slave control circuit outputs control to connect the primary and secondary ports to allow the TBC to serially access the application using the 1149.1 serial bus protocol. After the buses have been connected, the slave control circuit transitions from the "Connect Buses" state into the "Slave Control Circuit" Idle state to wait for the start of another hierarchical select protocol input from the TBC.

Figure 44:
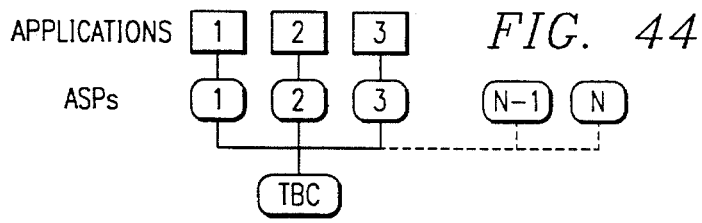
FIG. 44 illustrates a test configuration according to the invention.

FIG. 44 illustrates an arrangement of ASPs forming a connection from a TBC to applications 1–3. The following example describes the steps involved with setting up and executing a parallel test of the applications. In this example it is assumed that all ASPs in FIG. 44 are initially reset and disconnected, and that all applications and the TBC are in the TLRST state.

In FIG. 44, three real addresses exist (1,2,3), and two imaginary address exist (N-1, and N). In the steps, the shadow protocol's select and acknowledge sections are illustrated as Select/Acknowledge=ISXSI/ISXSI, where X=application/ASP address. Note that imaginary addresses will not respond with an acknowledge protocol since they are not real. In the steps, a connection, formed in response to a shadow protocol, will be abbreviated as C=X, where C=connection, X=application/ASP address. In the steps, state retention of a disconnected connection is abbreviated as CS=state, where CS=connection state, and state=either TLRST, RT/IDLE, PAUSE-IR, or PAUSE-DR.

Step 1—TBC transmits shadow protocol to connect Application 1.

IS1SI/IS1SI

C=1

CS=TLRST

Step 2—TBC scans application 1 to load self test instructions and terminates scan operation in PAUSE-IR state.

Step 3—TBC transmits shadow protocol to disconnect application 1 and connect imaginary application N-1.

ISN-1SI/(Only real addresses acknowledge)

C=N-1

CS=PAUSE-IR

Step 4—TBC and C=N-1 transition from PAUSE-IR to TLRST to synchronize states with application 2.

Step 5—TBC transmits shadow protocol to connect Application 2.

IS2SI/IS2SI

C=2

CS=TLRST

Step 6—TBC scans application 2 to load self test instructions and terminates scan operation in PAUSE-IR state.

Step 7—TBC transmits shadow protocol to disconnect application 2 and connect imaginary application N-1.

ISN-1SI/(Only real addresses acknowledge)

C=N-1

CS=PAUSE-IR

Step 8—TBC and C=N-1 transition from PAUSE-IR to TLRST to synchronize states with application 3.

Step 9—TBC transmits shadow protocol to connect Application 3.

IS3SI/IS3SI

C=3

CS=TLRST

Step 10—TBC scans application 3 to load self test instructions and terminates scan operation in PAUSE-IR state.

Step 11—TBC transmits shadow protocol to disconnect application 3 and connect imaginary application N.

ISNSI/(Only real addresses acknowledge)

C=N

CS=PAUSE-IR

Step 12—TBC and C=N transition from PAUSE-IR to RT/IDLE state to start parallel test of applications 1,2, and 3.

Note: If the TBC is responsible for stopping the parallel test operation, Go to step 20, otherwise Go to step 13.

Step 13—After a predetermined number of TCKs have occurred while in the RT/IDLE state, the parallel test completes and the TBC transmits a shadow protocol to connect to a first one of the three applications, application 1 in this case.

IS1SI/IS1SI

C=1

CS=RT/IDLE

Step 14—TBC scans application 1 to unload self test results for evaluation and terminates scan operation in RT/IDLE state.

Step 15—TBC transmits a shadow protocol to connect to a second one of the three applications, application 2 in this case.

IS2SI/IS2SI

C=2

CS=RT/IDLE

Step 16—TBC scans application 2 to unload self test results for evaluation and terminates scan operation in RT/IDLE state.

Step 17—TBC transmits a shadow protocol to connect to a third one of the three applications, application 3 in this case.

IS3SI/IS3SI

C=3

CS=RT/IDLE

Step 18—TBC scans application 3 to unload self test results for evaluation and terminates scan operation in RT/IDLE state.

Step 19—End of Test. TBC can issue a global reset to reset and disconnect all HASPs and ASPs if desired.

Step 20—After a predetermined number of TCK cycles have occurred in the RT/IDLE state, TBC and C=N transition from the RT/IDLE state to either the PAUSE-IR or PAUSE-DR state to halt the parallel test operation. Note: In this example the transition will be to the PAUSE-DR state.

Step 21—TBC transmits shadow protocol to connect to a first one of the three applications, application 1 in this case.

IS1SI/IS1SI

C=1

CS=PAUSE-DR

Step 22—TBC scans application 1 to unload self test results for evaluation and terminates scan operation in RT/IDLE state.

Step 23—TBC transmits shadow protocol to disconnect application 1 and connect imaginary application N-1.

ISN-1SI/(Only real addresses acknowledge)

C=N-1

CS=RT/IDLE

Step 24—TBC and C=N-1 transition from RT/IDLE to the PAUSE-DR state to synchronize states with the next application to be accessed.

Step 25—TBC transmits shadow protocol to connect to a second one of the three applications, application 2 in this case.

IS2SI/IS2SI

C=2

CS=PAUSE-DR

Step 26—TBC scans application 2 to unload self test results for evaluation and terminates scan operation in RT/IDLE state.

Step 27—TBC transmits shadow protocol to disconnect application 2 and connect imaginary application N-1.

ISN-1SI/(Only real addresses acknowledge)

C=N-1

CS=RT/IDLE

Step 28—TBC and C=N-1 transition from RT/IDLE to the PAUSE-DR state to synchronize states with the next application to be accessed.

Step 29—TBC transmits shadow protocol to connect to a third one of the three applications, application 3 in this case.

IS3SI/IS3SI

C=3

CS=PAUSE-DR

Step 30—TBC scans application 3 to unload self test results for evaluation and terminates scan operation in RT/IDLE state.

Test Complete, Go to Step 19

Figure 45:
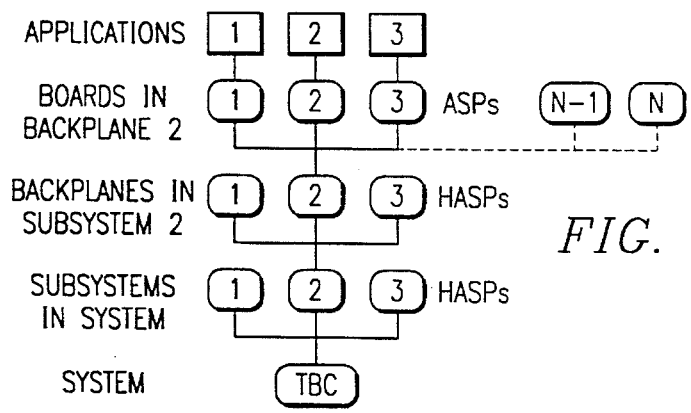
FIG. 45 illustrates a hierarchical test configuration according to the invention.

FIG. 45 illustrates a hierarchical arrangement of HASFs forming a connection from a system TBC to subsystems 1–3, and from each subsystem to backplanes 1–3. ASPs form a connection from each backplane to boards 1–3. The following example describes the steps involved with setting up and executing a parallel test of the boards residing in backplane 2 of subsystem 2. In this example it is assumed that all HASPs and ASPs in FIG. 45 are initially reset and disconnected, and that all board applications and the TBC are in the TLRST state.

At each hierarchical level, i.e. subsystem, backplane, and board, three real addresses exist (1,2,3), and two imaginary address exist (N-1, and N). In the steps, the shadow protocol's select and acknowledge sections are illustrated as Select/Acknowledge=ISXSSYSSZSI/ISZSSYSSXSI, where X=subsystem address, Y=backplane address, and Z=board address. Note that imaginary portions of the acknowledge protocol will not be included in the acknowledge protocol since they are net real. The HASP expecting an acknowledge protocol input from an imaginary ASP will not wait for the acknowledge protocol and will transmit its acknowledge protocol on to a lower level HASP or TBC following a hierarchical select protocol (see FIG. 42 above). In the steps, a hierarchical connection, formed in response to a shadow protocol, will be abbreviated as HC=X,Y,Z, where HC=hierarchical connection, X=subsystem address, Y= backplane address, and Z=board address. In the steps, state retention of a disconnected hierarchical connection is abbreviated as HCS=state, where HCS=hierarchical connection state, and state =either TLRST, RT/IDLE, PAUSE-IR, or PAUSE-DR.

Step 1—TBC transmits shadow protocol to connect Board 1.

IS2SS2SS1SI/IS1SS2SS2S

HC=2,2,1

HCS=TLRST

Step 2—TBC scans board 1 to load self test instructions and terminates scan operation in PAUSE-IR state.

Step 3—TBC transmits shadow protocol to disconnect board 1 and connect imaginary board N-1.

IS2SS2SSN-1SI/IS2SS2SI (Only real addresses acknowledge)

HC=2,2,N-1

HCS=PAUSE-IR

Step 4—TBC and HC=2,2,N-1 transition from PAUSE-IR to TLRST to synchronize states with board 2.

Step 5—TBC transmits shadow protocol to connect Board 2.

IS2SS2SS2SI/IS2SS2SS2SI

HC=2,2,2

HCS=TLRST

Step 6—TBC scans board 2 to load self test instructions and terminates scan operation in PAUSE-IR state.

Step 7—TBC transmits shadow protocol to disconnect board 2 and connect imaginary board N-1.

IS2SS2SSN-1SI/IS2SS2SI (Only real addresses acknowledge)

HC=2,2, N-1

HCS=PAUSE-IR

Step 8—TBC and HC=2,2,N-1 transition from PAUSE-IR to TLRST to synchronize states with board 3.

Step 9—TBC transmits shadow protocol to connect Board 3.

IS2SS2SS3SI/IS3SS2SS2SI

HC=2,2,3

HCS=TLRST

Step 10—TBC scans board 3 to load self test instructions and terminates scan operation in PAUSE-IR state.

Step 11—TBC transmits shadow protocol to disconnect board and connect imaginary board N.

IS2SS2SSNSI/IS2SS2SI (Only real addresses acknowledge)

HC=2,2,N

HCS=PAUSE-IR

Step 12—TBC and HC=2,2,N transition from PAUSE-IR to RT/IDLE state to start parallel test of boards 1,2, and 3.

Note: If the TBC is responsible for stopping the parallel test operation, Go to step 20, otherwise Go to step 13.

Step 13—After a predetermined number of TCKs have occurred while in the RT/IDLE state, the parallel test completes and the TBC transmits a shadow protocol to connect to a first one of the three boards, board 1 in this case.

IS2SS2SS1SI/IS1SS2SS2SI

HC=2,2,1

HCS=RT/IDLE

Step 14—TBC scans board 1 to unload self test results for evaluation and terminates scan operation in RT/IDLE state.

Step 15—TBC transmits a shadow protocol to connect to a second one of the three boards, board 2 in this case.

IS2SS2SS2SI/IS2SS2SS2SI

HC=2,2,2

HCS=RT/IDLE

Step 16—TBC scans board 2 to unload self test results for evaluation and terminates scan operation in RT/IDLE state.

Step 17—TBC transmits a shadow protocol to connect to a third one of the three boards, board 3 in this case.

IS2SS2SS3SI/IS3SS2SS2SI

HC=2,2,3

HCS=RT/IDLE

Step 18—TBC scans board 3 to unload self test results for evaluation and terminates scan operation in RT/IDLE state.

Step 19—End of Test. TBC can issue a global reset to reset and disconnect all HASPs and ASPs if desired.

Step 20—After a predetermined number of TCK cycles have occurred in the RT/IDLE state, TBC and HC=2,2,N transition from the RT/IDLE state to either the PAUSE-IR or PAUSE-DR state to halt the parallel test operation. Note: In this example the transition will be to the PAUSE-DR state.

Step 21—TBC transmits shadow protocol to connect to a first one of the three boards, board 1 in this case.

IS2SS2SS1SI/IS1SS2SS2SI

HC=2,2,1

HCS=PAUSE-DR

Step 22—TBC scans board 1 to unload self test results for evaluation and terminates scan operation in RT/IDLE state.

Step 23—TBC transmits shadow protocol to disconnect board and connect imaginary board N-1.

IS2SS2SSN-1SI/IS2SS2SI (Only real addresses acknowledge)

HC=2,2,N-1

HCS=RT/IDLE

Step 24—TBC and HC=2,2,N-1 transition from RT/IDLE to the PAUSE-DR state to synchronize states with the next board to be accessed.

Step 25—TBC transmits shadow protocol to connect to a second one of the three boards, board 2 in this case.

IS2SS2SS2SI/IS2SS2SS2SI

HC=2,2,2

HCS=PAUSE-DR

Step 26—TBC scans board 2 to unload self test results for evaluation and terminates scan operation in RT/IDLE state.

Step 27—TBC transmits shadow protocol to disconnect board and connect imaginary board N-1.

IS2SS2SSN-1SI/IS2SS2SI (Only real addresses acknowledge)

HC=2,2,N-1

Step 28—TBC and HC=2,2,N-1 transition from RT/IDLE to the PAUSE-DR state to synchronize states with the next board to be accessed.

Step 29—TBC transmits shadow protocol to connect to a third one of the three boards, board 3 in this case.

IS2SS2SS3SI/IS3SS2SS2SI

HC=2,2,3

HCS=PAUSE-DR

Step 30—TBC scans board 3 to unload self test results for evaluation and terminates scan operation in RT/IDLE state.

Test Complete, Go to Step 19

Although exemplary embodiments of the present invention are described above, this description does not limit the scope of the invention, which can be practiced in a variety of embodiments.

What is claimed is:

1. A method of synchronizing operations of a plurality of logic circuits, comprising the steps of:

providing a plurality of connection ports connected to a control bus for connecting logic circuits to the control bus in response to addresses presented to the connection ports via the control bus;

presenting to the connection ports a first address associated with a first said connection port so that a first logic circuit associated with the first connection port is connected to the control bus while the remaining logic circuits, whose associated connection ports are not currently addressed, remain disconnected from the control bus, and thereafter withdrawing the first address from the connection ports without addressing any of the connection ports so that the first logic circuit is disconnected from the control bus without connecting any of the remaining logic circuits to the control bus; and changing a control state of the control bus after said step of withdrawing the first address, so that the control state is changed while the logic circuits are all disconnected from the control bus.

2. The method of claim 1, wherein said withdrawing step includes presenting to the connection ports a predetermined address which is associated with none of the connection ports.

3. The method of claim 1, including, while the first logic circuit is connected to the control bus, transitioning the control bus and a first bus of the first logic circuit from a first control state into a second control state.

4. The method of claim 3, wherein said second control state is an information transfer state.

5. The method of claim 4, including transferring information between the control bus and the first logic circuit via the first bus while the control bus and the first bus are in said information transfer state.

6. The method of claim 5, wherein said information transferring step includes transferring information into the first logic circuit.

7. The method of claim 6, wherein said step of transferring information into the first logic circuit includes transferring, from the control bus into the first logic circuit via the first test bus, an instruction to be executed by the first logic circuit.

8. The method of claim 7, including, after said transferring step but while the first logic circuit is still connected to the control bus, transitioning the control bus and the first bus from said information transfer state into a pause state.

9. The method of claim 8, wherein said withdrawing step includes, while the control bus and the first bus are in said pause state and while the first logic circuit is connected to the control bus, presenting to the connection ports a predetermined address which is associated with none of the connection ports.

10. The method of claim 9, wherein said control state changing step includes transitioning the control bus, while said predetermined address is presented, from said pause state into said first control state.

11. The method of claim 10, including, after transitioning the control bus from said pause state into said first control state, presenting to the connection ports a second address associated with a second said connection port so that a second logic circuit associated with the second connection port is connected to the control bus while the remaining logic circuits remain disconnected from the control bus.

12. The method of claim 11, including, while the second logic circuit is connected to the control bus, transitioning the control bus and a second bus of the second logic circuit from said first control state into said information transfer state.

13. The method of claim 12, including transferring information between the control bus and the second logic circuit via the second bus while the control bus and the second bus are in said information transfer state.

14. The method of claim 13, wherein said last-mentioned information transfer step includes transferring, from the control bus into the second logic circuit via the second bus, an instruction to be executed by the second logic circuit.

15. The method of claim 14, including, after said last-mentioned information transfer step but while the second logic circuit is connected to the control bus, transitioning the control bus and the second bus from said information transfer state into said pause state.

16. The method of claim 15, including connecting both the first and second logic circuits to the control bus, said connecting step including, while the first, second and control buses are in said pause state, presenting to the connection ports a further predetermined address which is associated with none of the connection ports.

17. The method of claim 16, including directing the first and second logic circuits to execute their respective instructions concurrently, said directing step including, while said further predetermined address is presented, transitioning the control bus and said first and second buses from said pause state into an instruction execute state.

18. The method of claim 3, wherein said withdrawing step includes, while the control bus and the first logic circuit are connected and while the control bus and the first bus are in said second control state, presenting to the connection ports a predetermined address which is associated with none of the connection ports.

19. The method of claim 18, including, while said predetermined address is presented, transitioning the control bus from said second control state into said first control state.

20. The method of claim 19, including, after transitioning the control bus from said second control state into said first control state, presenting to the connection ports a second address associated with a second said connection port so that a second:logic circuit associated with the second connection port is connected to the control bus while the remaining logic circuits remain disconnected from the control bus.

21. The method of claim 20, including, while the second logic circuit is connected to the control bus, transitioning the control bus and a second bus of the second logic circuit from said first control state into said second control state.

22. The method of claim 21, including connecting both the first and second logic circuits to the control bus, said connecting step including, while the first, second and control buses are in said second control state, presenting to the connection ports a further predetermined address which is associated with none of the connection ports.

23. The method of claim 22, including, while said further predetermined add address is presented, transitioning the control bus and said first and second buses out of said second control state.

* * * * *